(12) United States Patent
Ohta et al.

(10) Patent No.: US 7,906,798 B2
(45) Date of Patent: Mar. 15, 2011

(54) SEMICONDUCTOR DEVICE HAVING BUFFER LAYER BETWEEN SIDEWALL INSULATING FILM AND SEMICONDUCTOR SUBSTRATE

(75) Inventors: Hiroyuki Ohta, Kawasaki (JP);
Katsuaki Ookoshi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 482 days.

(21) Appl. No.: 11/950,102

(22) Filed: Dec. 4, 2007

(65) Prior Publication Data
US 2008/0142838 A1    Jun. 19, 2008

(30) Foreign Application Priority Data
Dec. 13, 2006   (JP) ................................. 2006-336269

(51) Int. Cl.
*H01L 27/092*    (2006.01)
(52) U.S. Cl. .......... 257/190; 257/E21.632; 257/E27.062
(58) Field of Classification Search .................. 257/190, 257/E21.632, E27.062
See application file for complete search history.

(56) References Cited

U.S. PATENT DOCUMENTS

| | | | |
|---|---|---|---|
| 5,696,012 A | * | 12/1997 | Son ................................. 438/231 |
| 6,727,136 B1 | * | 4/2004 | Buller et al. .................. 438/231 |
| 7,271,414 B2 | | 9/2007 | Tamura et al. |
| 7,429,775 B1 | * | 9/2008 | Nayak et al. .................. 257/369 |
| 2005/0093078 A1 | * | 5/2005 | Chan et al. .................... 257/374 |
| 2006/0281285 A1 | * | 12/2006 | Kimoto .......................... 438/570 |

FOREIGN PATENT DOCUMENTS

| | | |
|---|---|---|
| JP | 2005175378 A | 6/2005 |
| JP | 2006-216604 A | 8/2006 |
| KR | 0214468 B1 | 8/1999 |

OTHER PUBLICATIONS

Korean Office Action mailed date Aug. 12, 2009, issued in corresponding Korean Patent Application No. 10-2007-0128783.
G.H. Buh et al; "Interface States as an Activate Component for 20 nm Gate-Length Planar MOSFET with ElectroStatic Channel Extension (ESCE)"; IEEE IEDM 2005.

* cited by examiner

*Primary Examiner* — Hung Vu
*Assistant Examiner* — Vernon P Webb
(74) *Attorney, Agent, or Firm* — Fujitsu Patent Center

(57) ABSTRACT

A semiconductor device includes an NMOS transistor and a PMOS transistor. The NMOS transistor includes a channel area formed in a silicon substrate, a gate electrode formed on a gate insulating film in correspondence with the channel area, and a source area and a drain area formed in the silicon substrate having the channel area situated therebetween. The PMOS transistor includes another channel area formed in the silicon substrate, another gate electrode formed on another gate insulating film in correspondence with the other channel area, and another source area and another drain area formed in the silicon substrate having the other channel area situated therebetween. The gate electrode has first sidewall insulating films. The other gate electrode has second sidewall insulating films. The distance between the second sidewall insulating films and the silicon substrate is greater than the distance between the first sidewall insulating films and the silicon substrate.

16 Claims, 53 Drawing Sheets

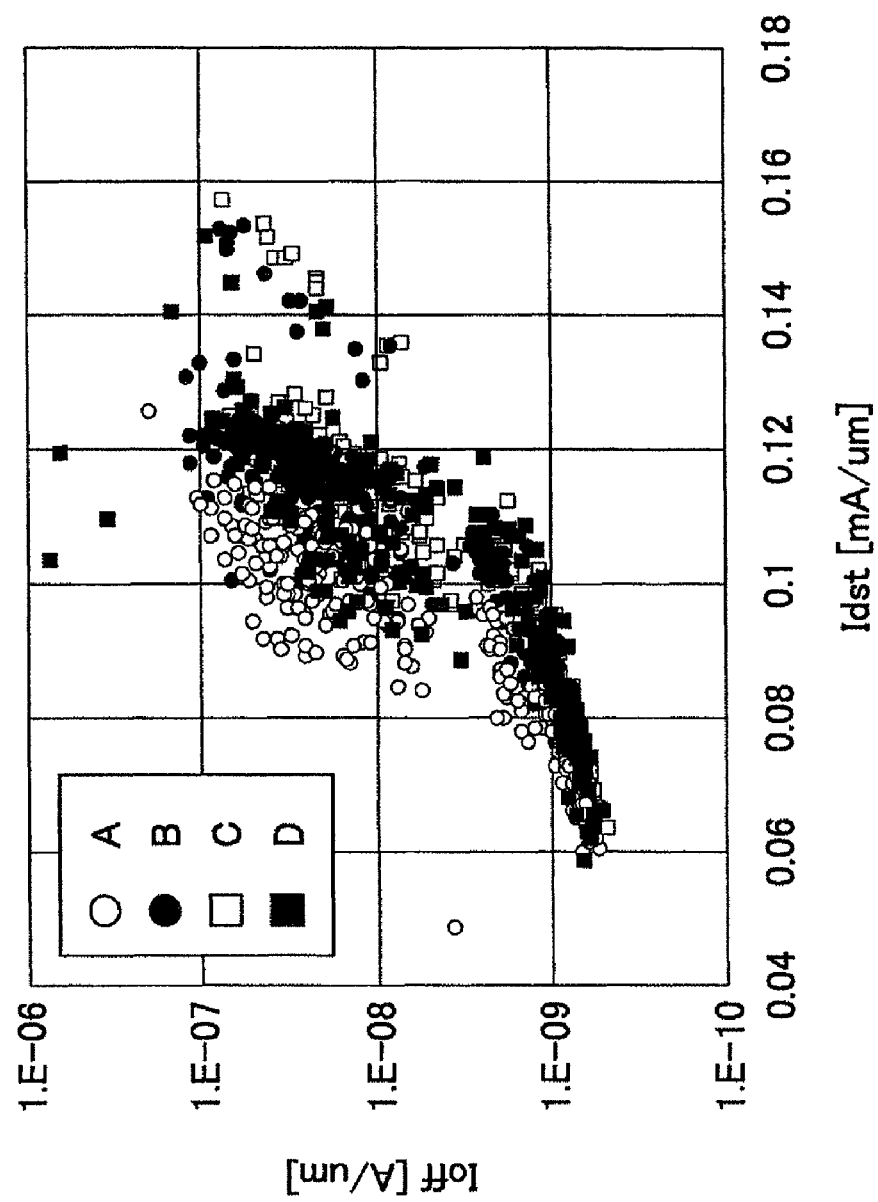

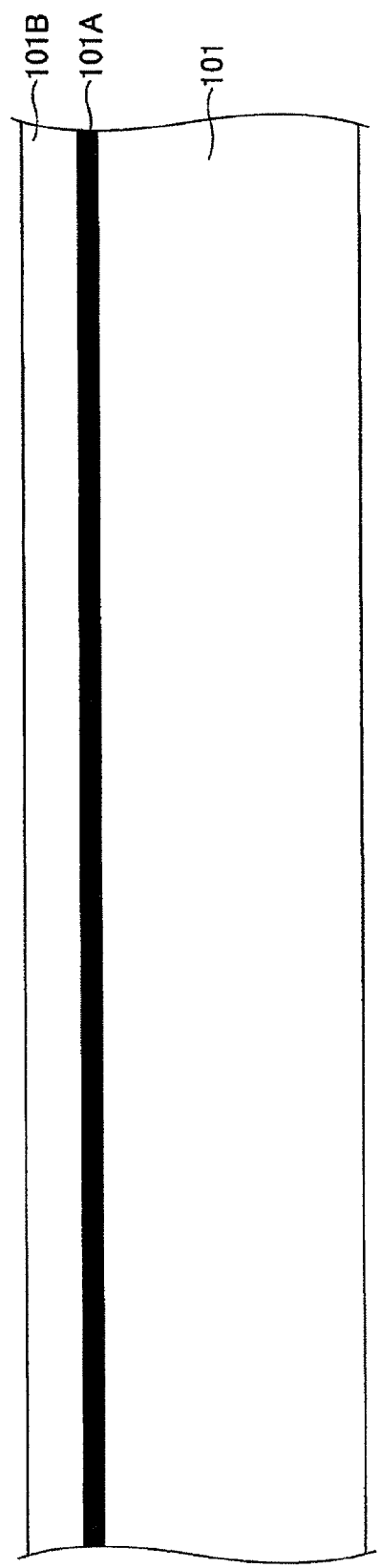

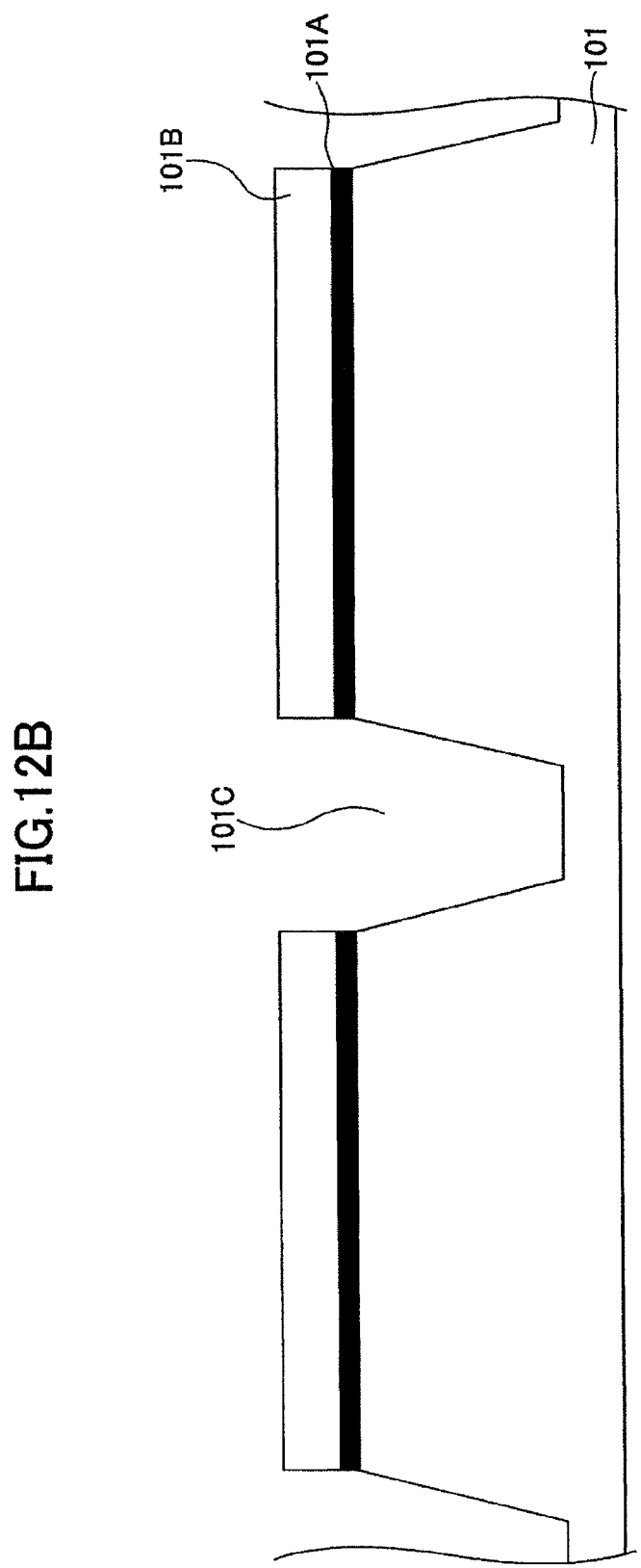

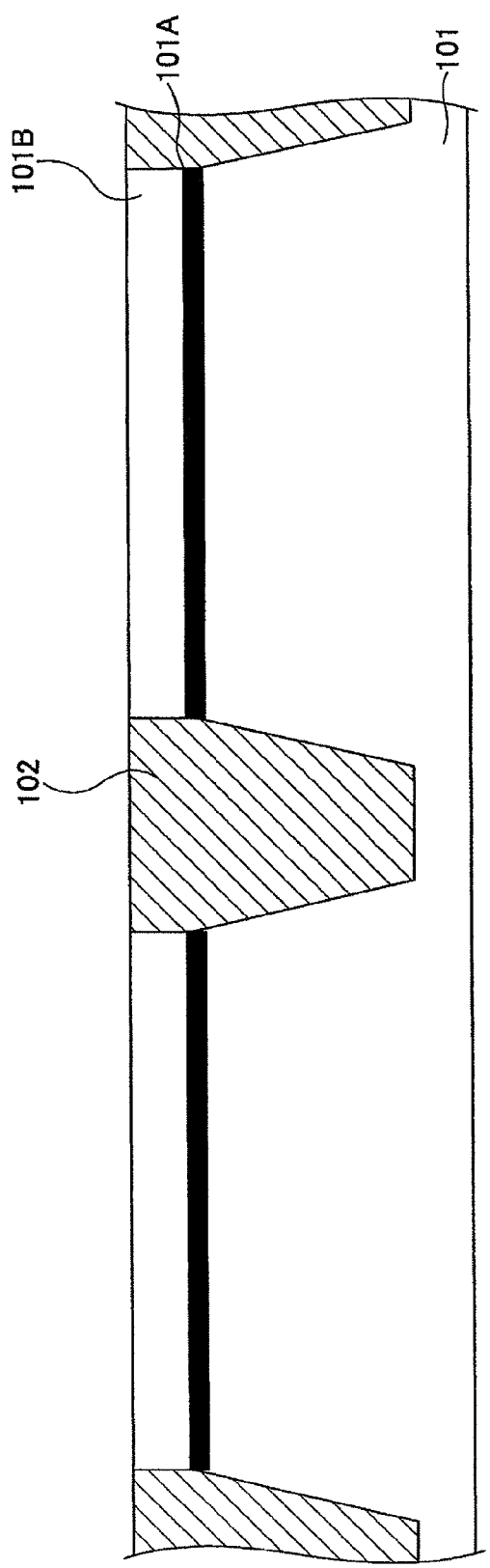

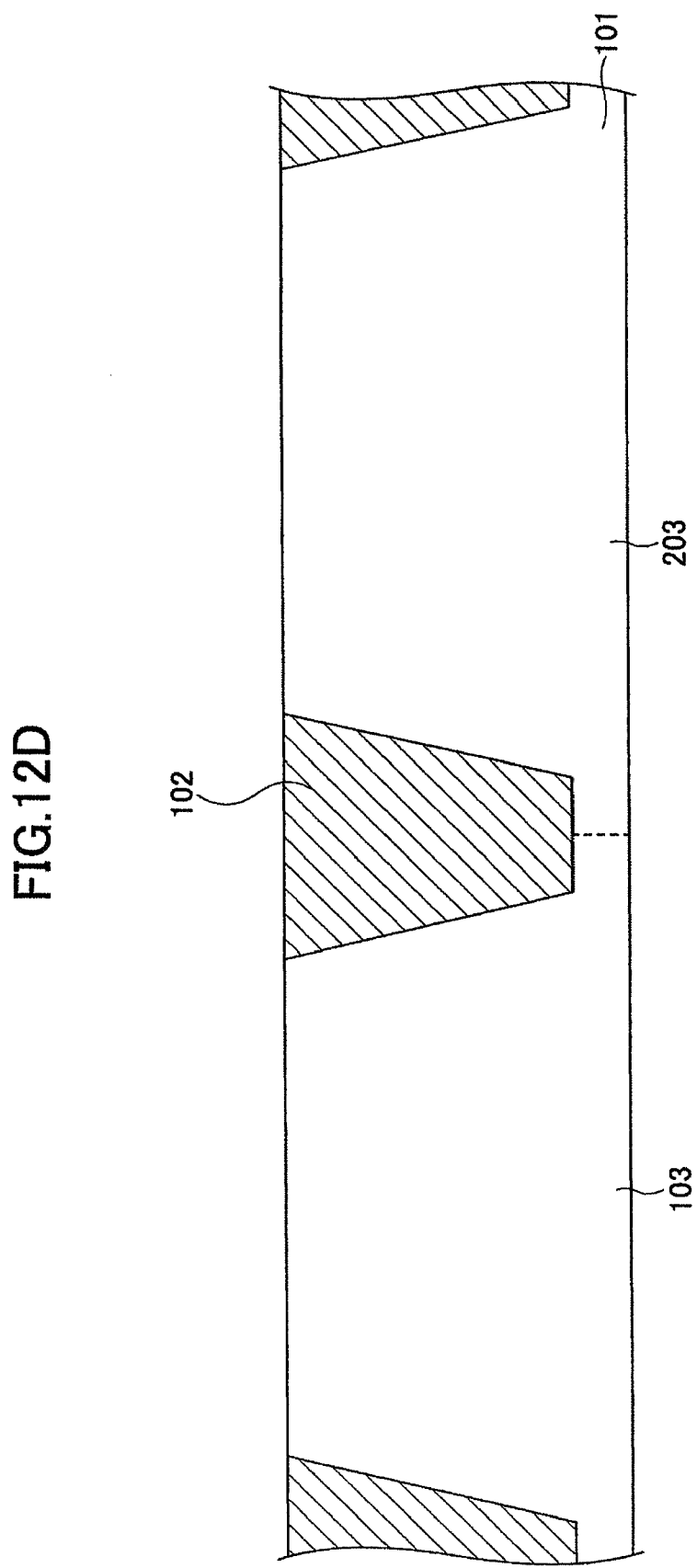

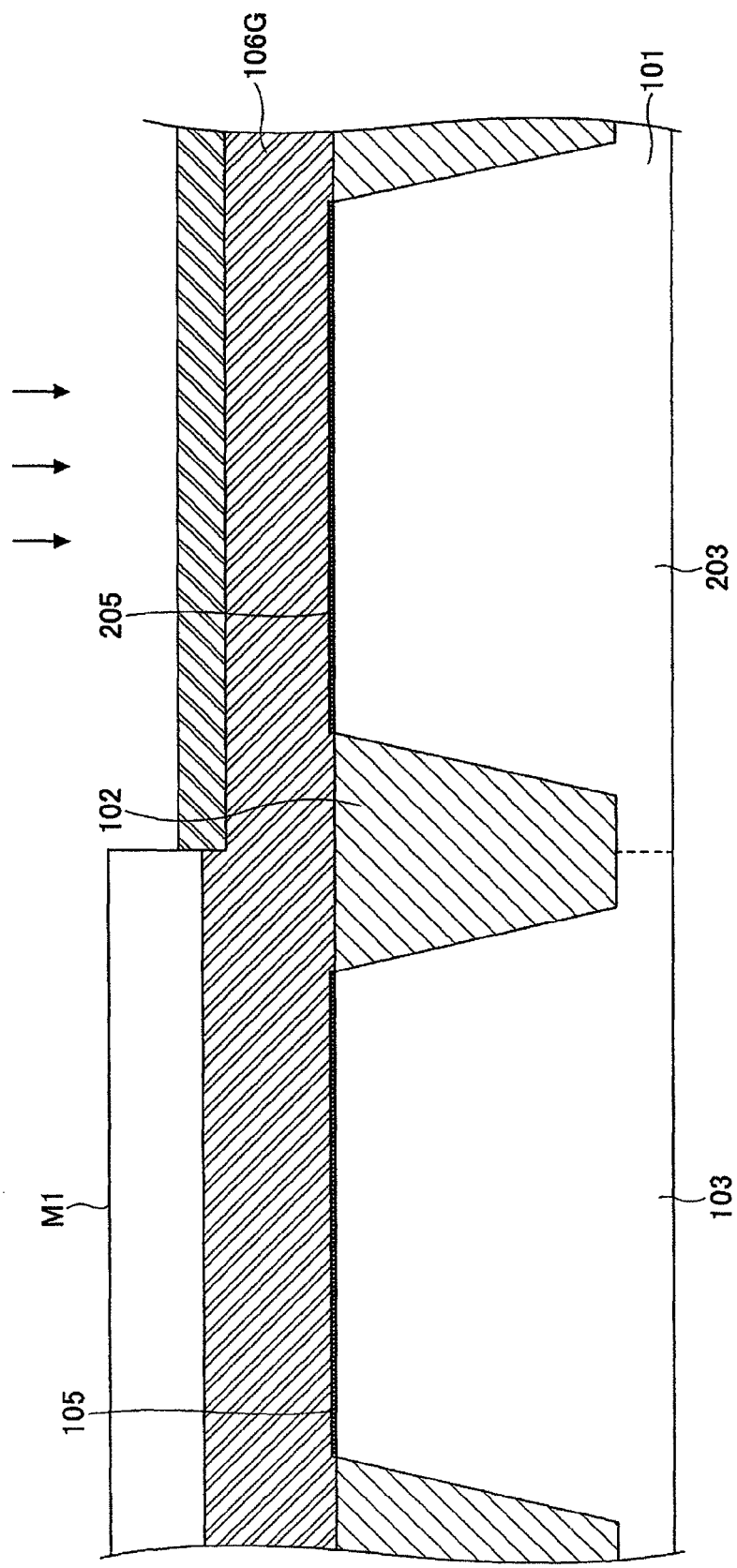

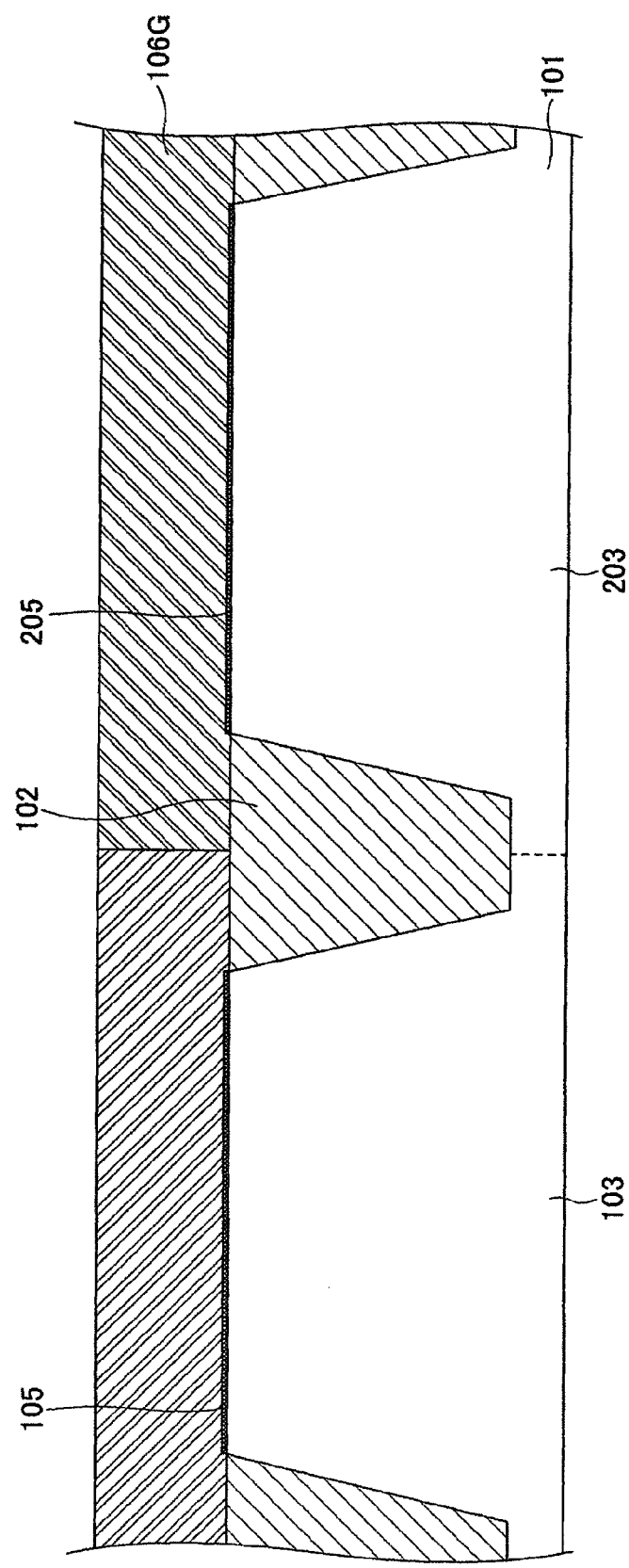

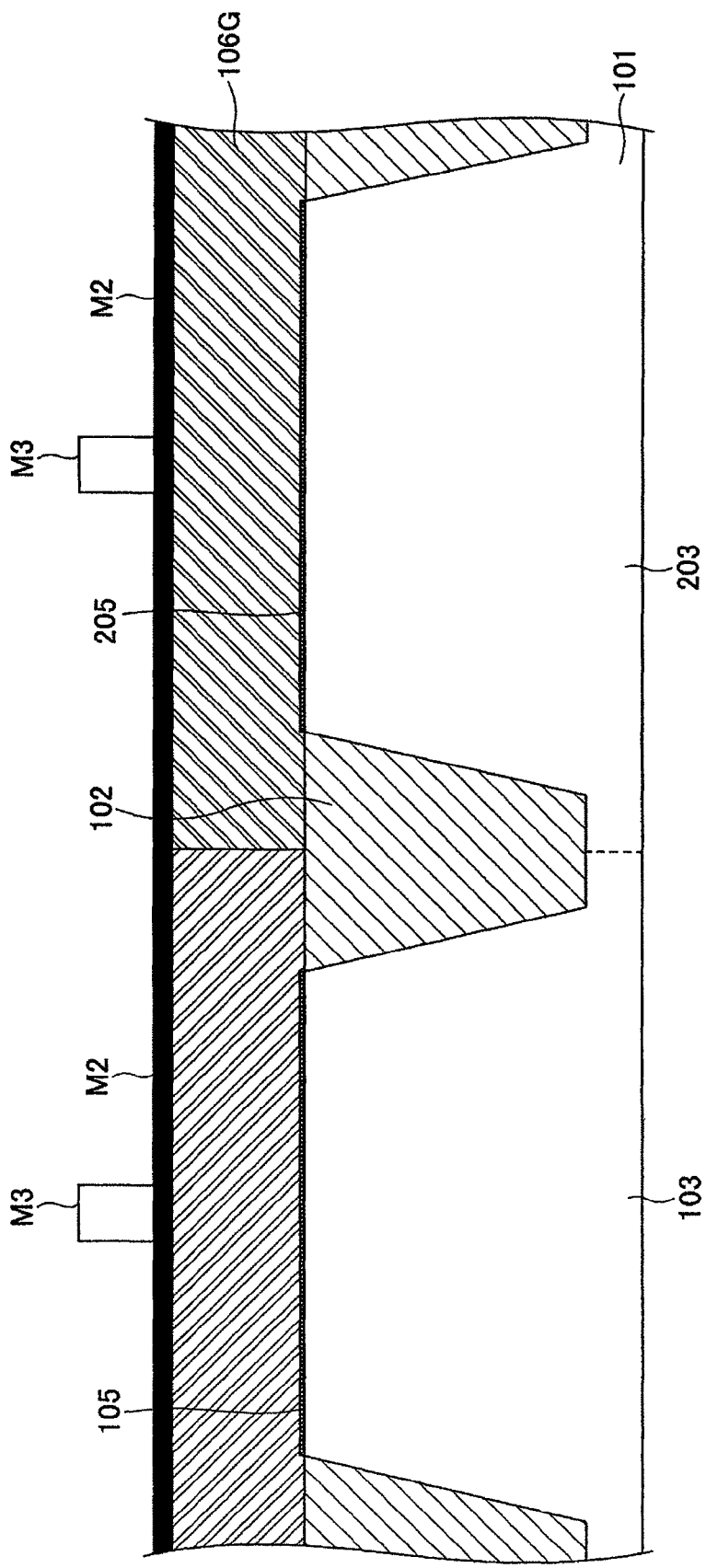

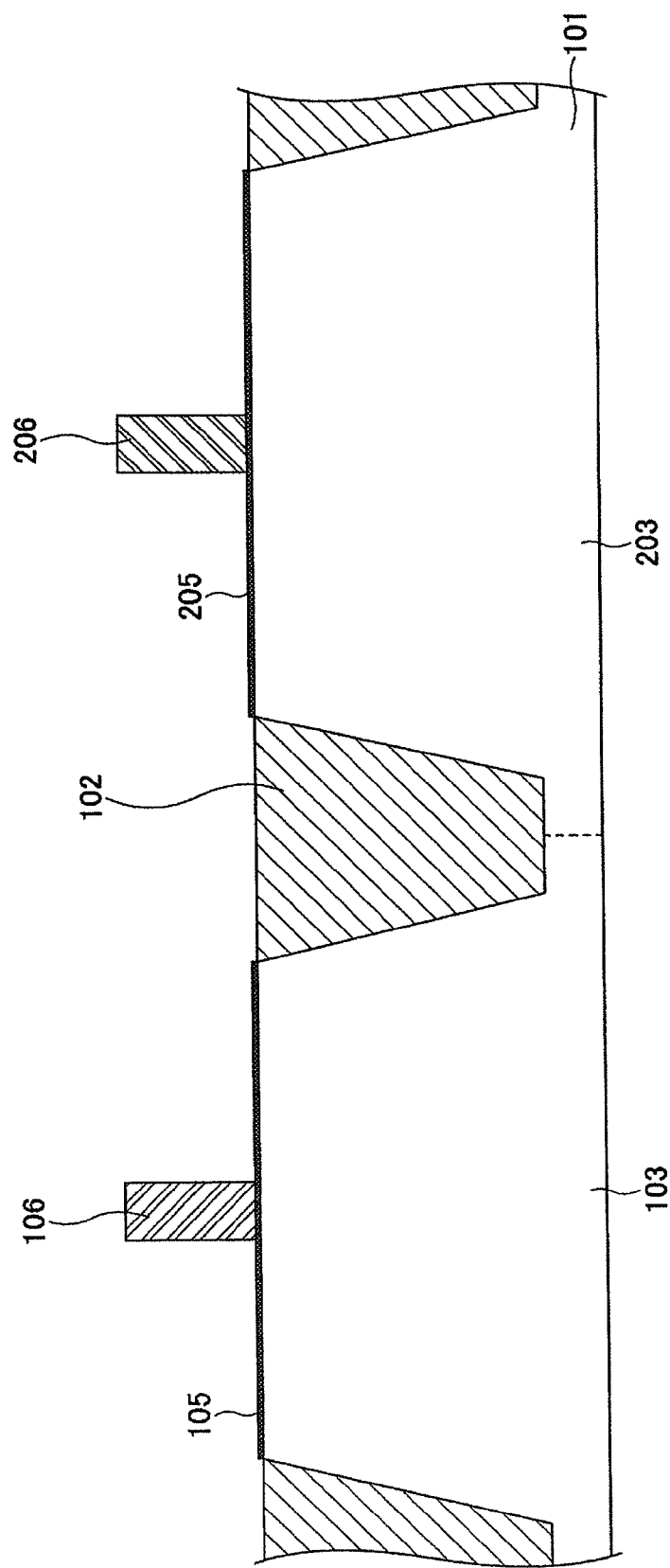

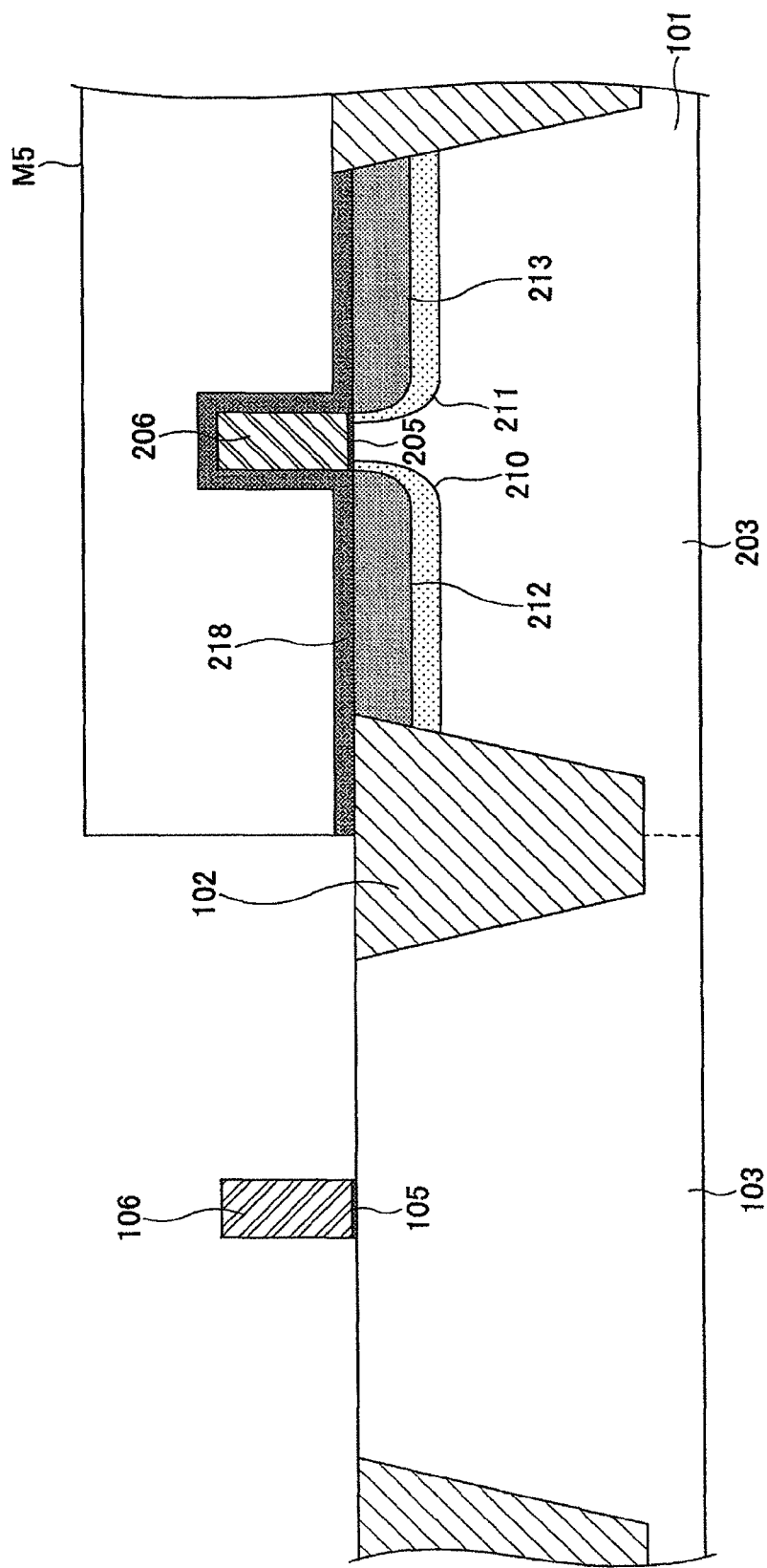

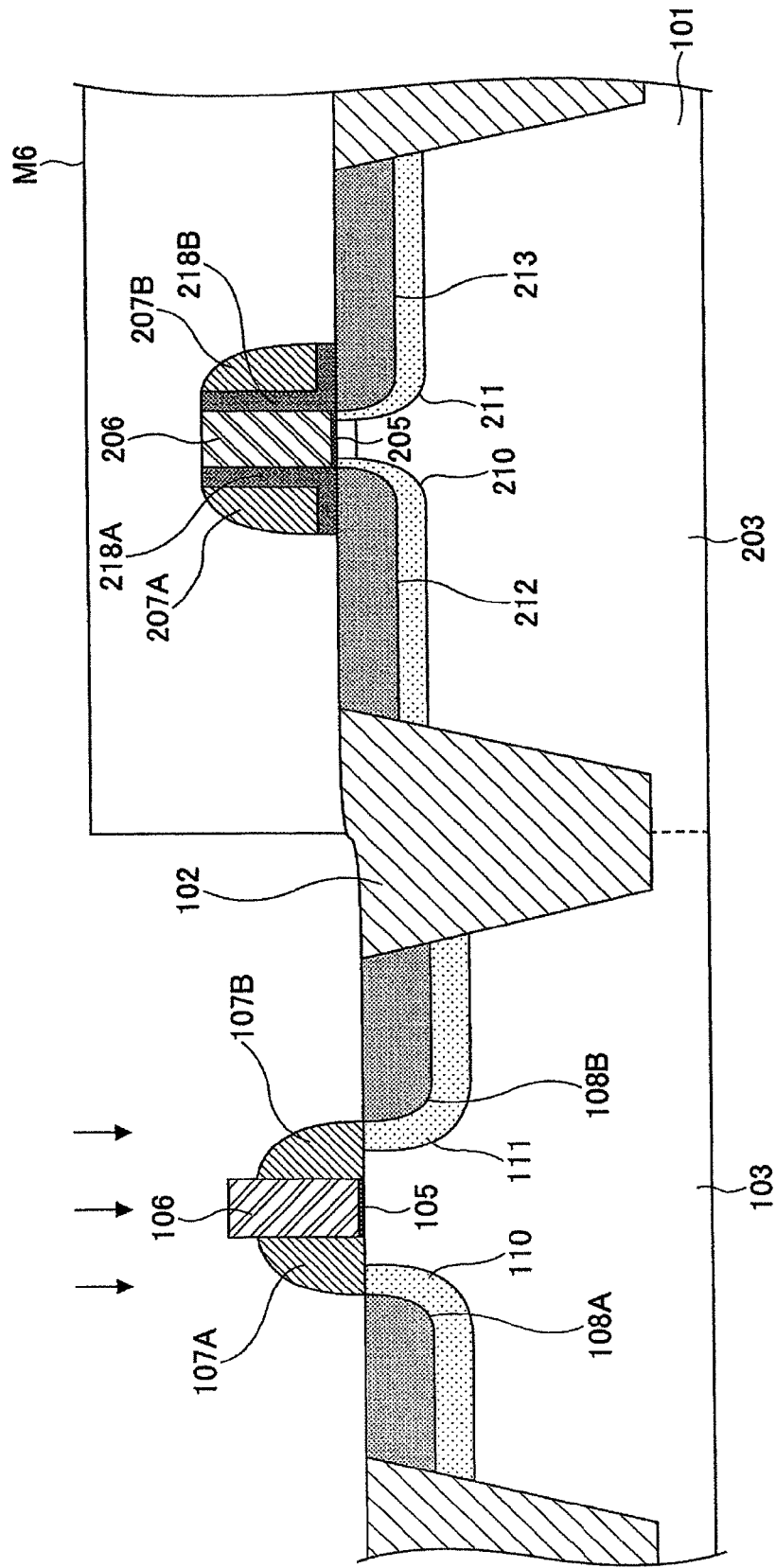

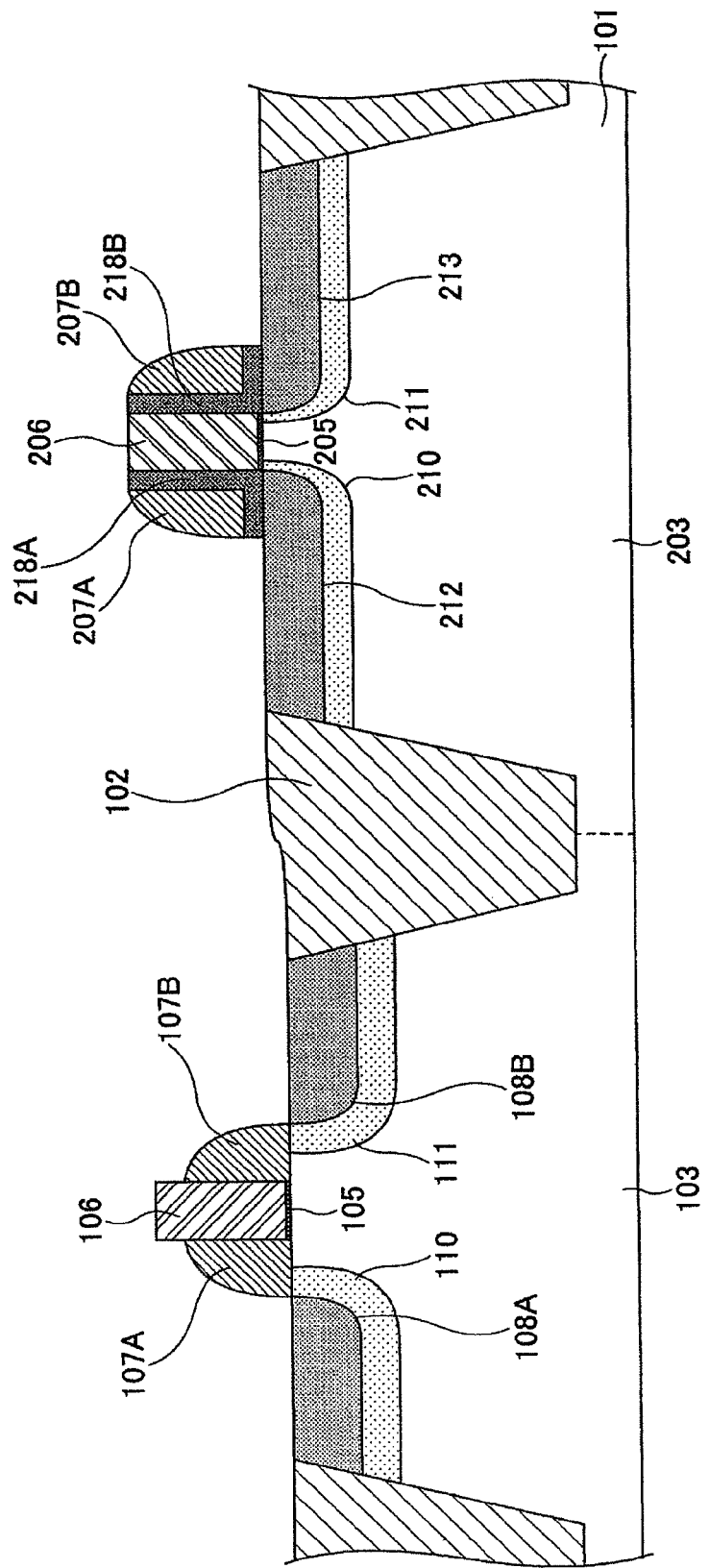

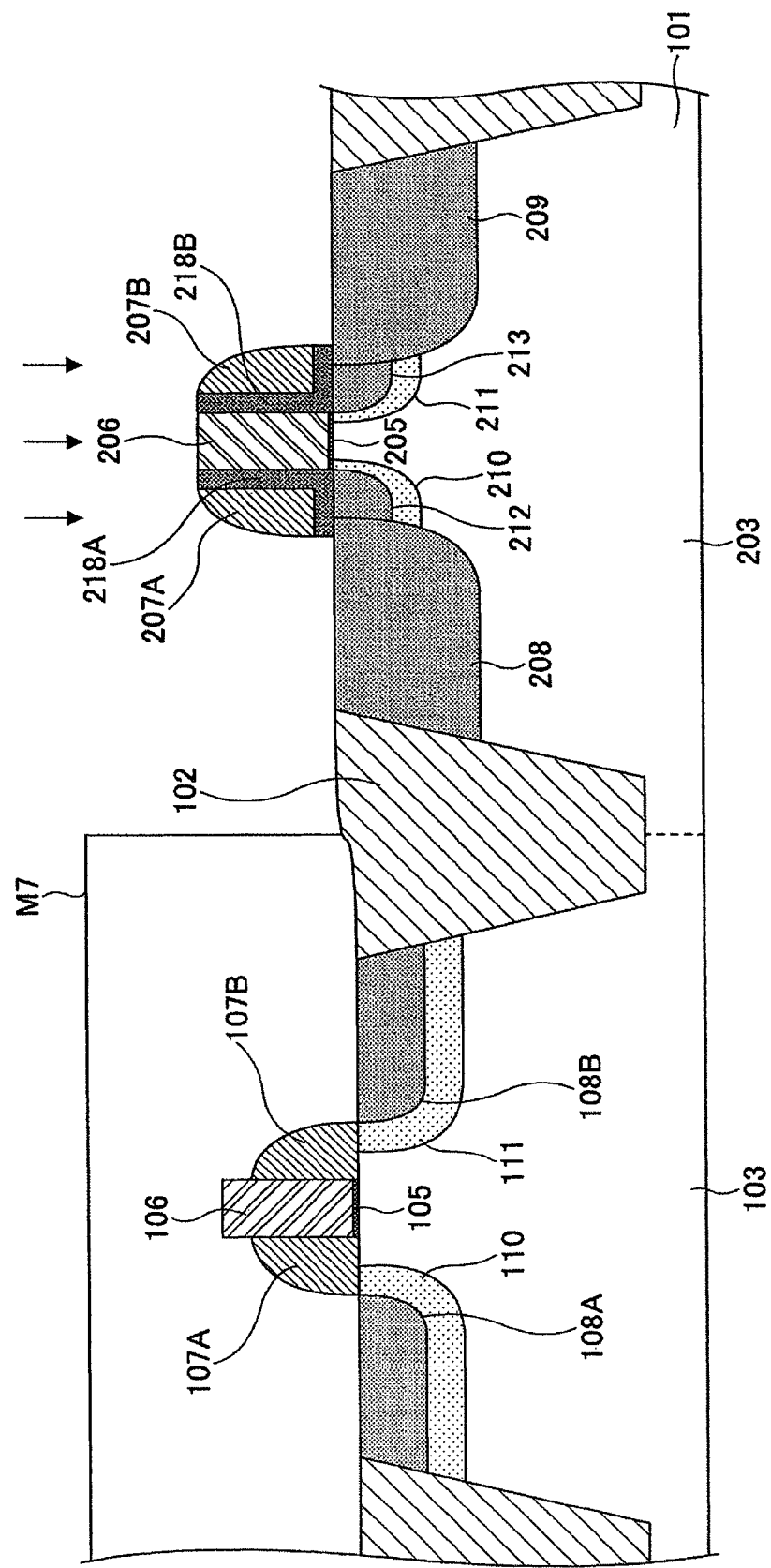

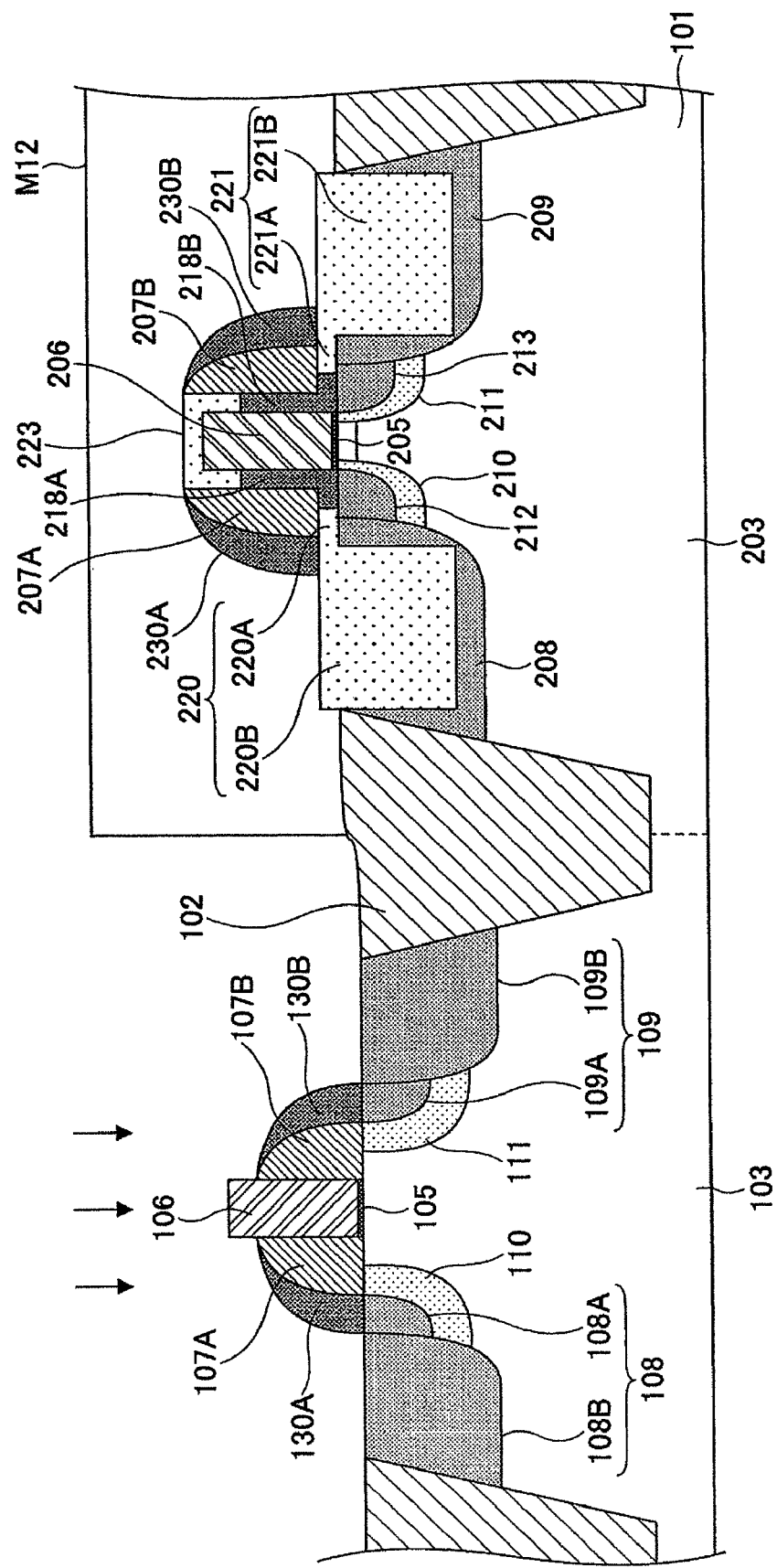

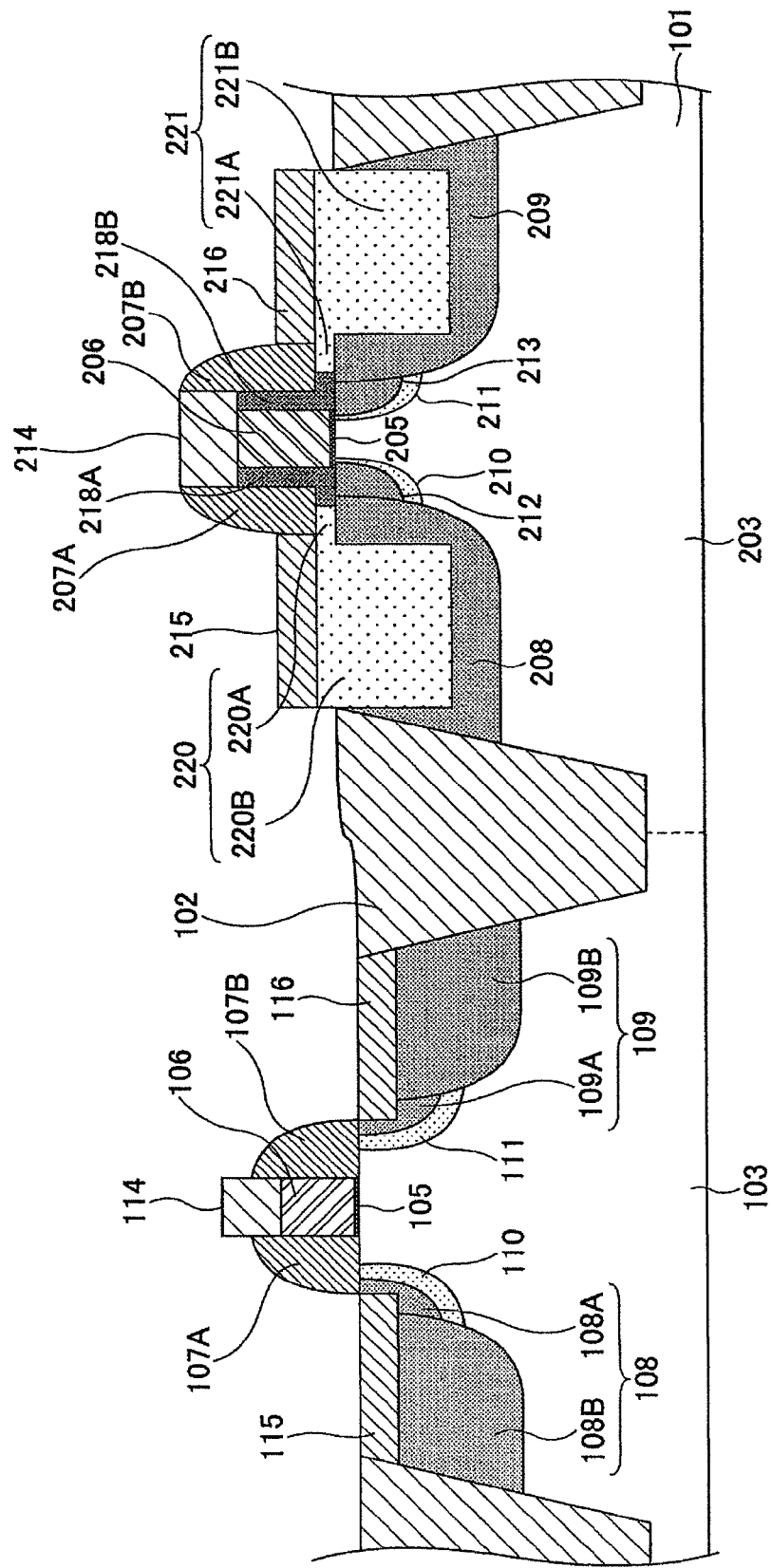

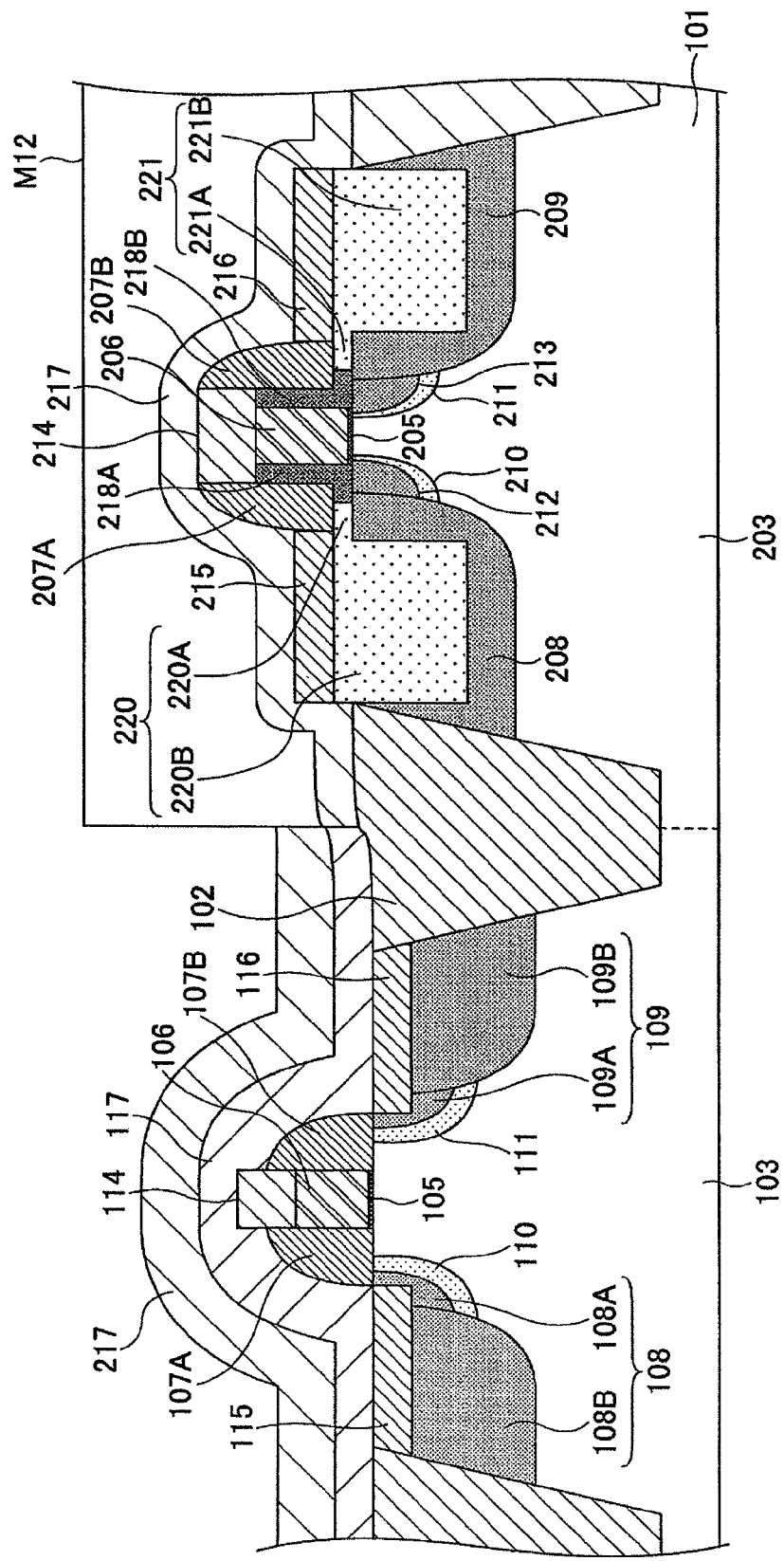

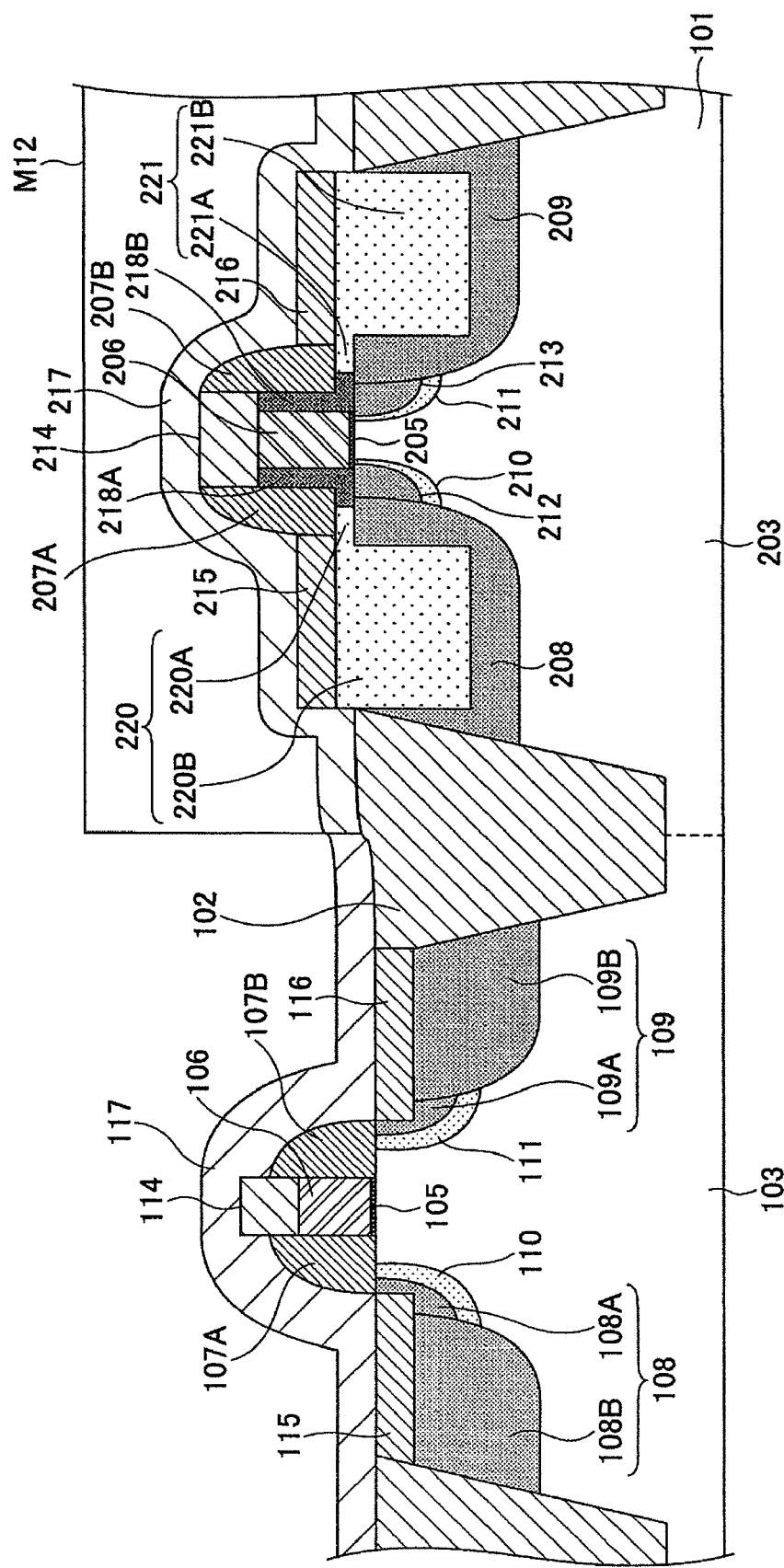

SEMICONDUCTOR DEVICE HAVING BUFFER LAYER BETWEEN SIDEWALL INSULATING FILM AND SEMICONDUCTOR SUBSTRATE

TECHNICAL FIELD

The present invention generally relates to a semiconductor device and a method of manufacturing a semiconductor device, and more particularly to a semiconductor device having a MOS type field effect transistor and a method of manufacturing a semiconductor device having a MOS type field effect transistor.

BACKGROUND

As semiconductor integrated circuits become more highly integrated, finer MOS type field effect transistors are manufactured by, for example, shortening the gate length. As gate electrodes become finer, the cut off between the source and the drain becomes difficult for field type transistors, such that short channel effects such as punch-through occur.

As one measure for reducing the short channel effect, there is a technique of forming an impurity (referred to as pocket area) at an outer side of a source area or a drain area (pocket injection technique). However, in a case where the gate is fabricated into a fine size with length no more than 30 nm, a pocket area at the outer side of the source area may overlap with a pocket area at the outer side of the drain area. This leads to a problem of increasing the impurity concentration at the channel part. Therefore, in a MOS transistor having a fine gate, it is desired to improve mobility while maintaining a low channel impurity concentration and also to reduce the short channel effect.

Accordingly, there is proposed a method of not forming a source extension area and a drain extension area (impurity area) but instead forming an inversion layer corresponding to these areas by using a fixed charge (see, for example, Japanese Laid-Open Patent Application No. 2005-175378). The source extension area is an impurity area extending toward a channel area formed in continuation with the source area. The drain extension area is an impurity area extending toward a channel area formed in continuation with the channel area.

The method shown in Japanese Laid-Open Patent Application No. 2005-175378 discloses a method of forming an inversion layer corresponding to these areas by using a silicon oxide film containing an impurity (e.g., cesium) as the fixed charge.

Furthermore, it is disclosed that the fixed charge used for forming the inversion layer may be fabricated by performing plasma nitradation on silicon (see, for example, G. H. Buh et. al, IEEE IEDM 2005). Accordingly, by using such a method of using the nitradated film, an inversion layer can be formed directly below the nitradated film (positive fixed charge). Thus, such an inversion layer can be used substantially as the source/drain extension area.

However, the method disclosed in Japanese Laid-Open Patent Application No. 2005-175378 is difficult to be applied to an actual process of manufacturing a semiconductor device for the reasons such as 1) it is difficult to perform ion injection while having the impurity contained only inside the silicon oxide film, 2) manufacturing cost becomes high due to separate ion injection for the NMOS and the PMOS in a photomasking process, and 3) injection of special types of ions (e.g., cesium/barium) is required.

Meanwhile, the method disclosed in G. H. Buh et. al, IEEE IEDM 2005 has a problem of forming positive fixed charges also in the PMOS side in the same manner as the NMOS side by the plasma nitradation in a case of a CMOS configuration. In the PMOS side, since the conductivity type becomes opposite to the NMOS side, the inversion layer formed in the source/drain extension area may adversely affect the behavior of the transistor. In a case of a combination (CMOS) having NMOS and PMOS, this method using fixed charges may not be effective from the aspect of the behavior of the transistor.

In performing plasma nitradation on a substrate, it may be possible to mask the PMOS side with resist and form a nitride film containing fixed charges. However, considering the facts that 1) a plasma is used and 2) the temperature in performing plasma nitradation is high, it is difficult to actually perform such masking by using resist having an organic substance as its main component.

SUMMARY

A semiconductor apparatus and a method of manufacturing a semiconductor device according to various embodiments of the present invention include a PMOS in which sidewall insulating films having fixed charges formed therein are configured to contact a semiconductor substrate or a gate electrode via a buffer layer.

BRIEF DESCRIPTION OF THE DRAWINGS

FIG. 8A is a graph for showing electric characteristics of the semiconductor device shown in FIG. 7 (Part 1);

DETAILED DESCRIPTION OF THE EMBODIMENTS

In the following, embodiments of the present invention will be described with reference to the accompanying drawings.

Figure 1:
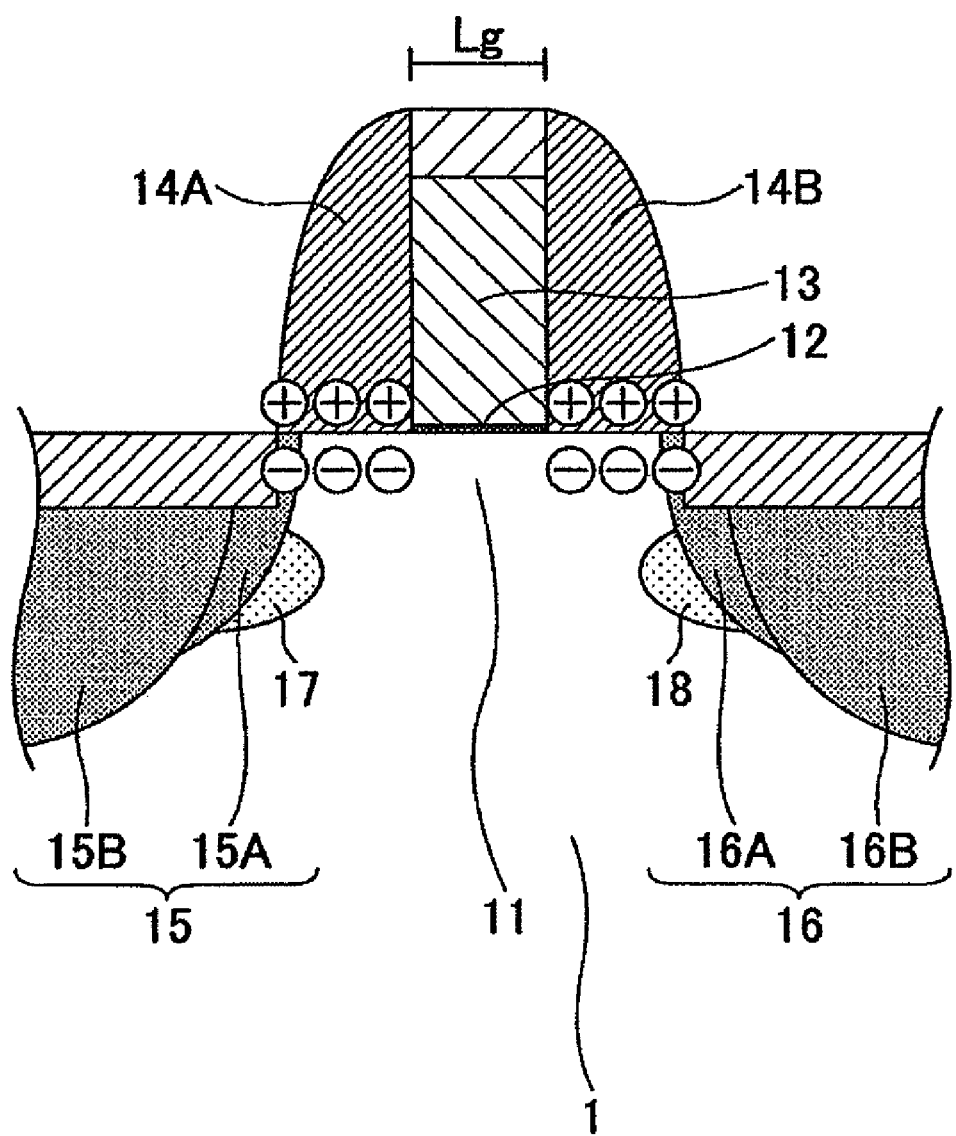
FIG. 1 is a schematic diagram for describing a basic principle of the present invention (Part 1)
Figure 2:
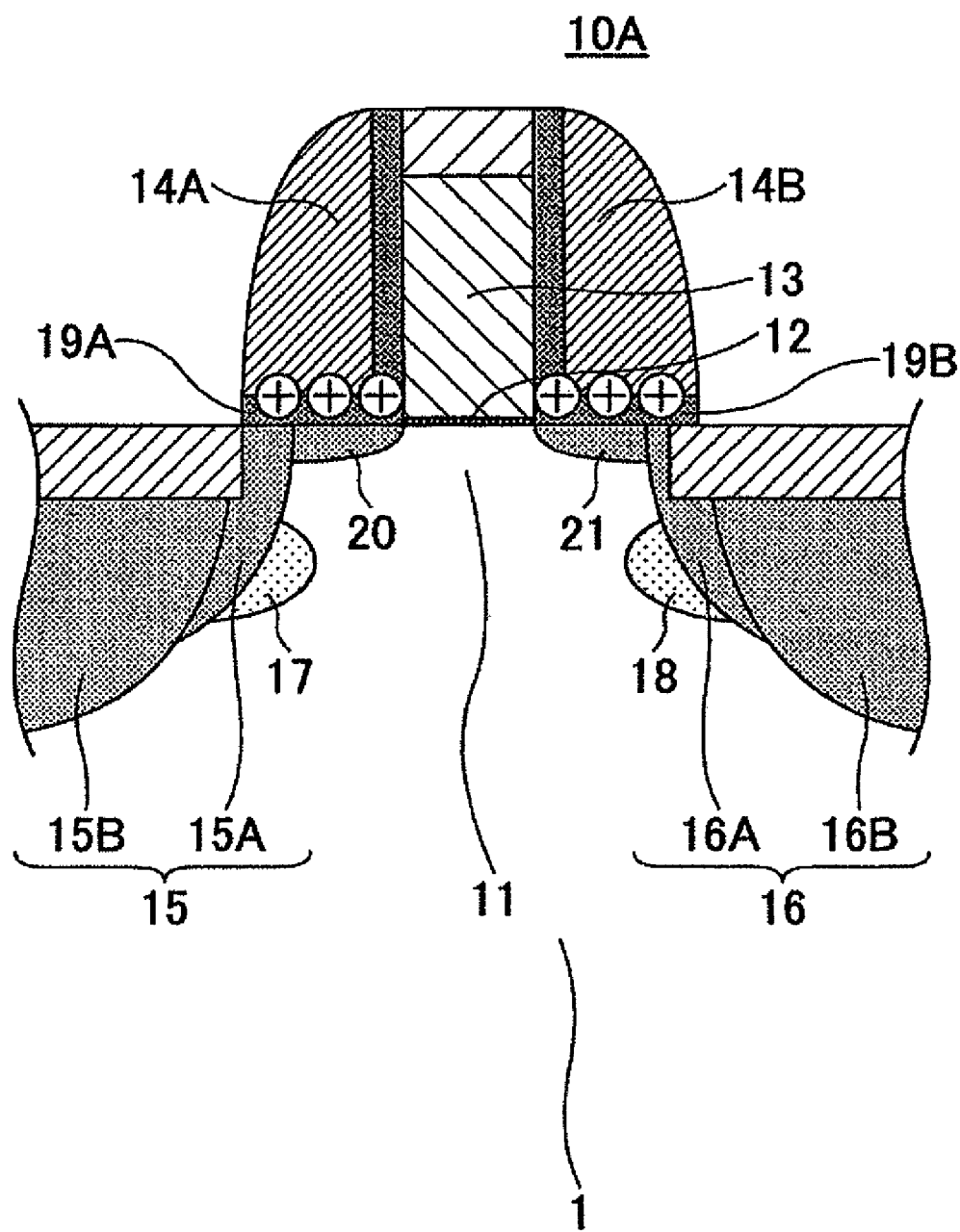
FIG. 2 is a schematic diagram for describing a basic principle of the present invention (Part 2)

FIGS. 1 and 2 are schematic diagrams showing a MOS transistor in which fixed electrodes are formed. FIGS. 1 and 2 are for describing a basic principle of the present invention.

In FIG. 1, a MOS transistor 10 includes a gate insulation film 12 formed in correspondence with a channel area 11 formed in a semiconductor substrate 1 and a gate electrode 13 formed on the gate insulating film 12.

In this example, the gate electrode 13 has two pairs of sidewalls that face each other, in which a pair of sidewall insulating films 14A and 14B are formed one on each side of one of the pairs in the gate electrode 13. The sidewall insulating films 14A and 14B may be formed of, for example, a silicon nitride film (a film having silicon and nitrogen as its main components, also hereinafter referred to as SiN film or $Si_xN_y$ film). The silicon nitride film is formed to include a positive fixed charge(s).

In the semiconductor substrate 1, a source area 15 and a drain area 16 are formed on corresponding sides of the gate electrode 13 in a manner having a channel area 11 interposed therebetween. The source area 15 includes source area parts 15A and 15B having different depths. Furthermore, the drain area 16 also includes drain area parts 16A and 16B having different depths. The drain area 16 may however include a single impurity area.

A pocket area 17 is formed at an outer side of the source area 15 (side toward the channel area 11). A pocket area 18 is formed at an outer side of the drain area 16 (side toward the channel area 11). Each of the pocket areas 17, 18 has a polarity (same polarity as the channel area 11) different from the source area 15 and the drain area 16, respectively. In addition, the pocket areas 17, 18 have high impurity areas having an impurity concentration higher than that of the channel area 11.

Since the pocket areas 17, 18 are provided at the above-described positions, punch through can be prevented from occurring. Thus, a short channel effect can be prevented in a case where the gate length Lg of gate 13 is shortened. However, at the same time, since the pocket areas 17, 18 are provided at the above-described positions, the pocket areas 17, 18 may overlap and increase the impurity concentration in the channel area 11 particularly in a case where the gate length Lg is shortened. As the impurity concentration of the channel area 11 is increased by the overlapping pocket areas 17, 18, mobility of carriers in the MOS transistor 10 deteriorates. This results in a problem of deterioration of the characteristics of the MOS transistor 10.

Therefore, substantially no source extension area and drain extension area (which are formed in a typical MOS transistor) are formed in the MOS transistor 10 according to an embodiment of the present invention. Thereby, the impurity concentration of the channel area 11 can be maintained at a low level.

In a typical MOS transistor, a source extension area continuing from a source area 15 and extending toward the channel area 11 is formed directly below the sidewall insulating film 14A. Furthermore, a drain extension area continuing from a source area 16 and extending toward the channel area 11 is formed vertically below the sidewall insulating film 14B.

However, in the MOS transistor 10 shown in FIG. 1, substantially no impurity area continuing from a source/drain area and positioned below the sidewall insulating films 14A, 14B are formed. Therefore, the impurity concentration of the channel area 11 can be maintained at a low level. Furthermore, an inversion layer (negative) is formed vertically below the sidewall insulating films 14A, 14B by the positive fixed electrodes of the sidewall insulating films 14A, 14B. This inversion layer functions as a source extension area or a drain extension area of a typical MOS transistor.

Accordingly, with the above-described MOS transistor 10, the distance between the pocket areas 17 and 18 can be increased. As a result, the impurity concentration of the channel area 11 can be maintained at a low level. That is, even in a case where the gate electrode 13 is formed in a fine size (shortened gate length Lg), the MOS transistor 10 can prevent the short channel effect from occurring while maintaining the impurity concentration of the channel area 11 at a low level, to thereby attain a satisfactory carrier mobility.

Although it is possible to configure an NMOS using the above-described structure of the MOS transistor 10, positive fixed charges in the PMOS side may adversely affect the performance of the transistor when a PMOS is formed in addition to the NMOS (e.g., CMOS configuration). For example, in a PMOS configuration, the transistor may not be able to switch on when fixed charges are included in the side wall insulating film due to an inversion layer formed by the fixed charges.

Accordingly, in a case of forming NMOS together with PMOS (e.g., a case of forming a CMOS), the PMOS side according to an embodiment of the present invention is configured in a manner described below.

The MOS transistor 10A shown in FIG. 2 is an exemplary configuration of a PMOS transistor that is formed together with the MOS transistor (NMOS transistor) 10 shown in FIG. 1. In FIG. 2, it is to be noted that like parts are denoted by like reference numerals as of FIG. 1 and are not further explained.

The MOS transistor 10A shown in FIG. 2 includes a source extension area 20 continuing from a source area 15 and extending toward a channel area 11 and a drain extension area 21 continuing from a drain area 16 and extending toward the channel area 11.

The MOS transistor 10A has a characteristic in which the distance between the side wall insulating films 14A, 14B and the semiconductor substrate 1 is greater compared to that of the MOS transistor 10 of FIG. 1. Therefore, the fixed charges included in the side wall insulating films 14A, 14B have less effect on the source extension area 20 and the drain extension area 21. That is, the amount of charges induced toward the vicinity of the surface of the silicon substrate become fewer due to the fixed charges included in the side wall insulating films 14A, 14B.

Since the distance between the side wall insulating films 14A, 14B and the semiconductor substrate 1 is increased (MOS transistor 10 of FIG. 1), the MOS transistor 10A according to an embodiment of the present invention has buffer layers 19A and 19B provided between the side wall insulating film 14A and the semiconductor substrate 1 and between the side wall insulating film 14B and the semiconductor substrate 1, respectively. In other words, the MOS transistor 10A has a laminated structure having insulating layers (side wall insulation films) of different compositions.

That is, the side wall insulating films 14A, 14B having fixed charges formed therein are configured to contact the semiconductor substrate 1 or the gate electrode 13 via the buffer layers 19A, 19B wherein the buffer layers 19A, 19B are layers having a composition different from that of the side wall insulating films 14A, 14B and having substantially no fixed charges formed therein (e.g., silicon oxide film).

Although buffer layers may also be formed between the side wall insulating films 14A, 14B and the semiconductor substrate 1 in the NMOS side, it is preferable that the buffer layer be formed with an extremely small thickness or a thickness such that substantially no buffer layer is formed. This allows the charges induced towards the surface of the silicon substrate by the fixed charges of the side wall insulating films 14A, 14B to be utilized in the NMOS side for carrier migration.

With the above-described configuration shown in FIG. 2, a low channel impurity concentration can be maintained while attaining satisfactory mobility. In addition, such MOS transistor having a controlled (restrained) short channel effect can be used to fabricate a CMOS transistor.

Next, there is described the results of measuring the C-V (Capacitance-Voltage) characteristics of a structure having layers including fixed charges laminated on a silicon substrate.

Figure 3A:
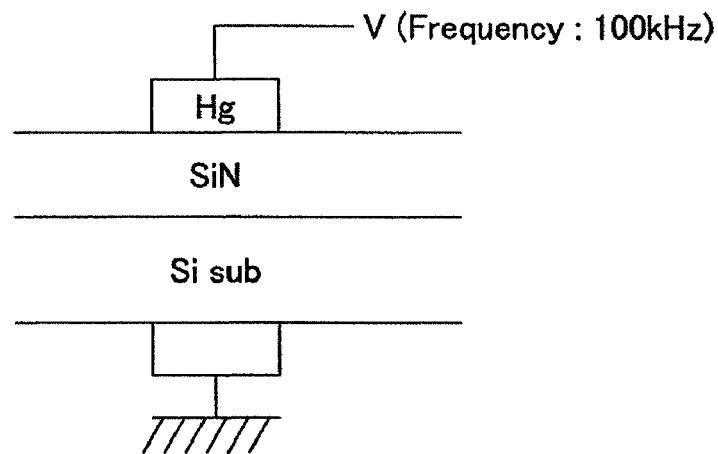
FIG. 3A is a schematic diagram for describing a method of measuring electric characteristics (Part 1)
Figure 3B:
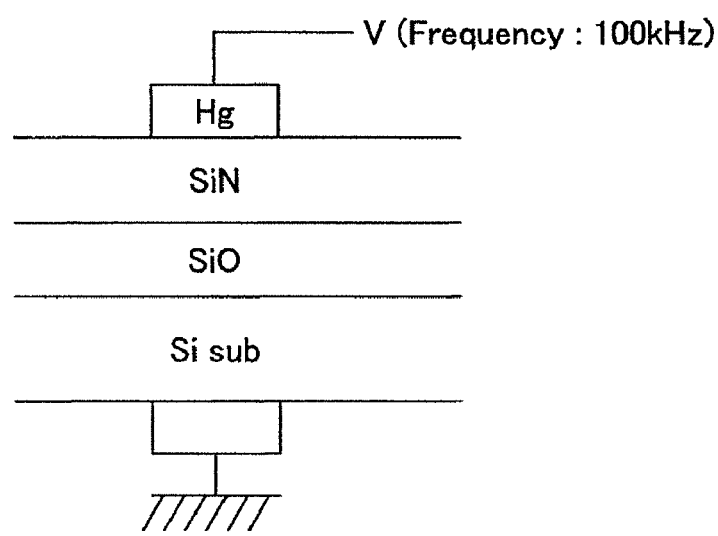
FIG. 3B is a schematic diagram for describing a method of measuring electric characteristics (Part 2)

FIGS. 3A and 3B are schematic diagrams showing exemplary configurations used for measuring the above-described C-V characteristics. First, in examining the C-V characteristics for the example shown in FIG. 3A, a fixed charge layer having a thickness of 30 nm is laminated on a silicon substrate and a high frequency voltage of 100 kHz is applied to the laminated configuration by using an Hg probe. In this example, the fixed charge layer (silicon nitride film) is formed by using a thermal CVD method with a substrate temperature of 775° C.

In the example shown in FIG. 3B, a buffer layer composed of, for example, a silicon nitride film is formed with a thickness ranging from 3 nm to 30 nm between a silicon substrate and a fixed charge layer so as to examine the C-V characteristics with buffer layers of different thicknesses.

Figure 4:
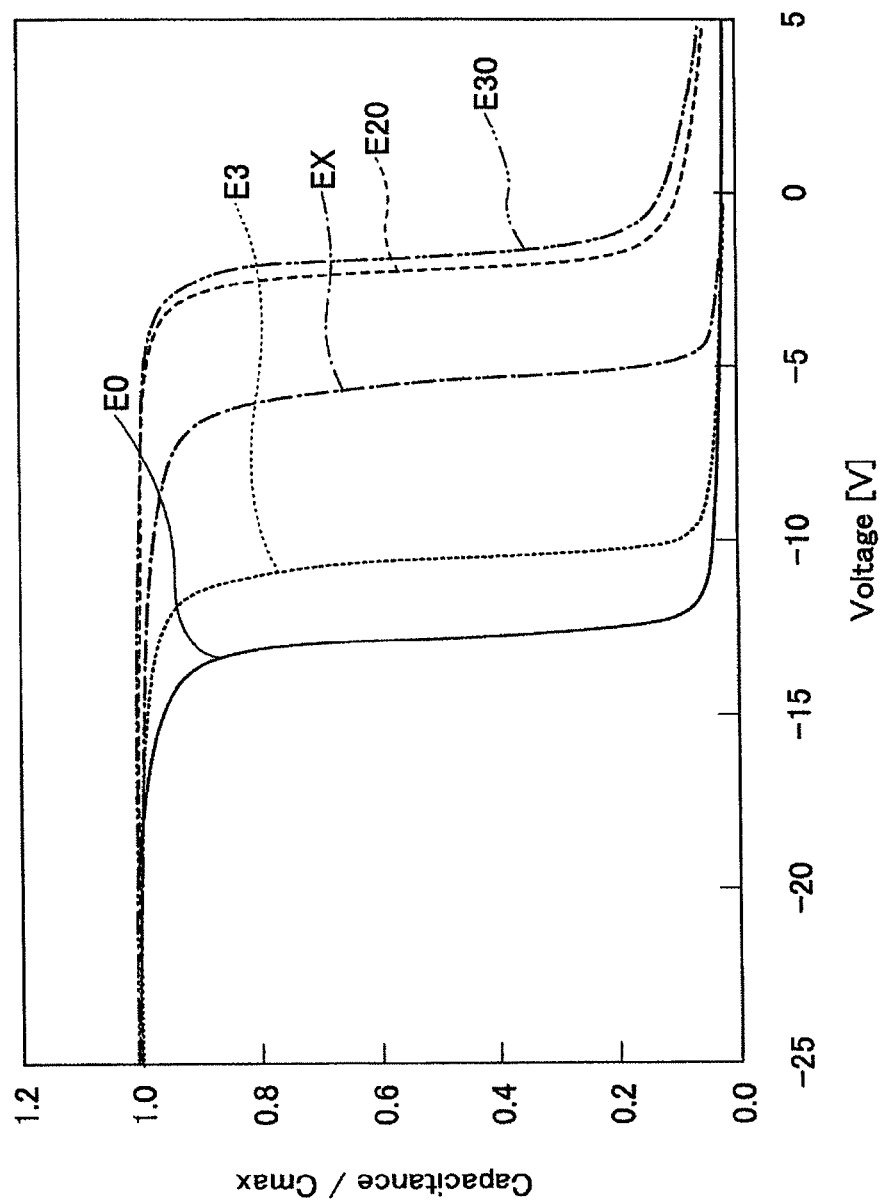
FIG. 4 is a schematic diagram for showing C-V characteristics of the configuration shown in FIGS. 3A and 3B.

FIG. 4 is a graph showing results of measuring the C-V characteristics for the configurations shown in FIGS. 3A and 3B. In FIG. 4, the experiments indicated as E0, E3, E20, and E30 correspond to cases where the thickness of the buffer layer is 0 nm (no buffer layer formed), 3 nm, 20 nm, and 30 nm, respectively.

With reference to FIG. 4, it can be understood that the flat band voltage Vfb shifts towards the right of the graph as the distance between the fixed charge layer and the silicon substrate becomes greater (i.e. as the thickness of the buffer layer increases).

Figure 5:
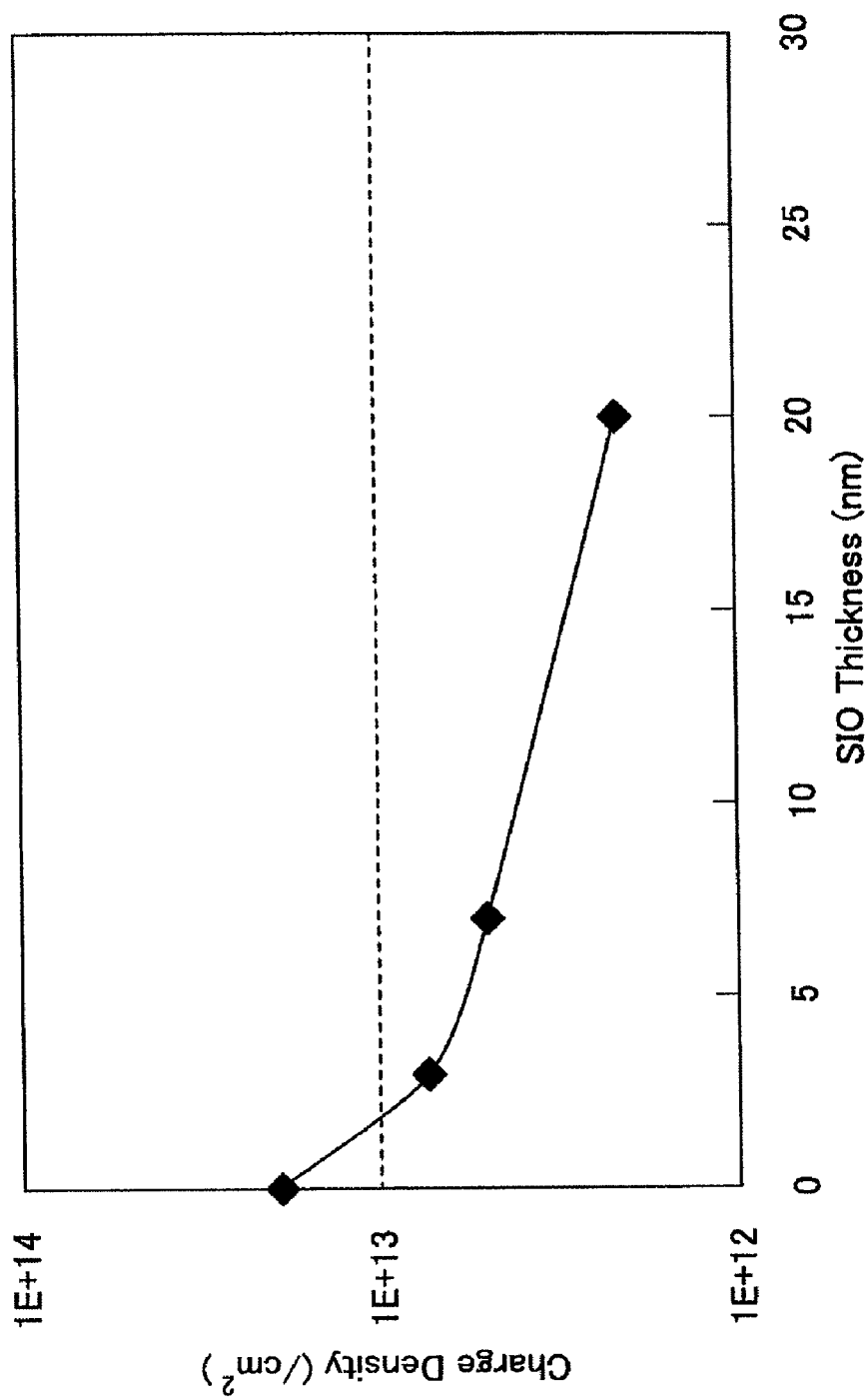
FIG. 5 is a graph showing amount of charge according to the characteristics shown in FIG. 4.

FIG. 5 shows the results of calculating the dependency of the density of charges formed in the silicon substrate (corresponding to the inversion layer) with respect to the film thickness of the buffer layer (SiO) according to the C-V characteristics shown in FIG. 4. With reference to FIG. 5, it can be understood that the density of charges formed in the silicon substrate becomes smaller as the film thickness of the buffer layer becomes greater (along with the shifting of the flat band voltage shown in FIG. 4).

Accordingly, the inventors of the present invention found that formation of the inversion layer in the silicon substrate can be controlled by forming a buffer layer between the fixed charge layer and the silicon substrate and changing the thickness of the buffer layer.

Furthermore, the inventors of the present invention have also found that the amount of charges induced toward the vicinity of the silicon substrate can be increased by annealing the silicon substrate (or buffer layer) in a predetermined gas atmosphere. In the above-described experiments E0, E3, E20, and E30, the fixed charge layer is formed after annealing the silicon substrate formed with the buffer layer in an ammonia ($NH_3$) containing atmosphere at a temperature (substrate temperature) of 850° C. for a period of 60 minutes. Accordingly, it has been found that the density of the charges induced toward the silicon substrate increases by annealing a silicon substrate (or buffer layer) in a gas atmosphere containing an N element (e.g., ammonia) prior to forming a fixed charge layer formed of a silicon nitride film.

The experiment indicated as EX of FIG. 4 shows the results of measuring the C-V characteristics in a case where a fixed charge layer having a thickness of 30 nm is formed after forming a buffer layer having a thickness of 3 nm without annealing the silicon substrate (buffer layer).

In this case, the effect of the annealing process can be recognized by comparing the experiment EX and the experiment E3. In comparing the experiments EX and E3 in FIG. 4, it can be understood that the amount of induced charges becomes greater for the experiment E3 (a case of performing an annealing process).

Next, a more detail configuration of a semiconductor device according to an embodiment of the present invention is described with reference to FIGS. 6 and 7.

First Embodiment

Figure 6:
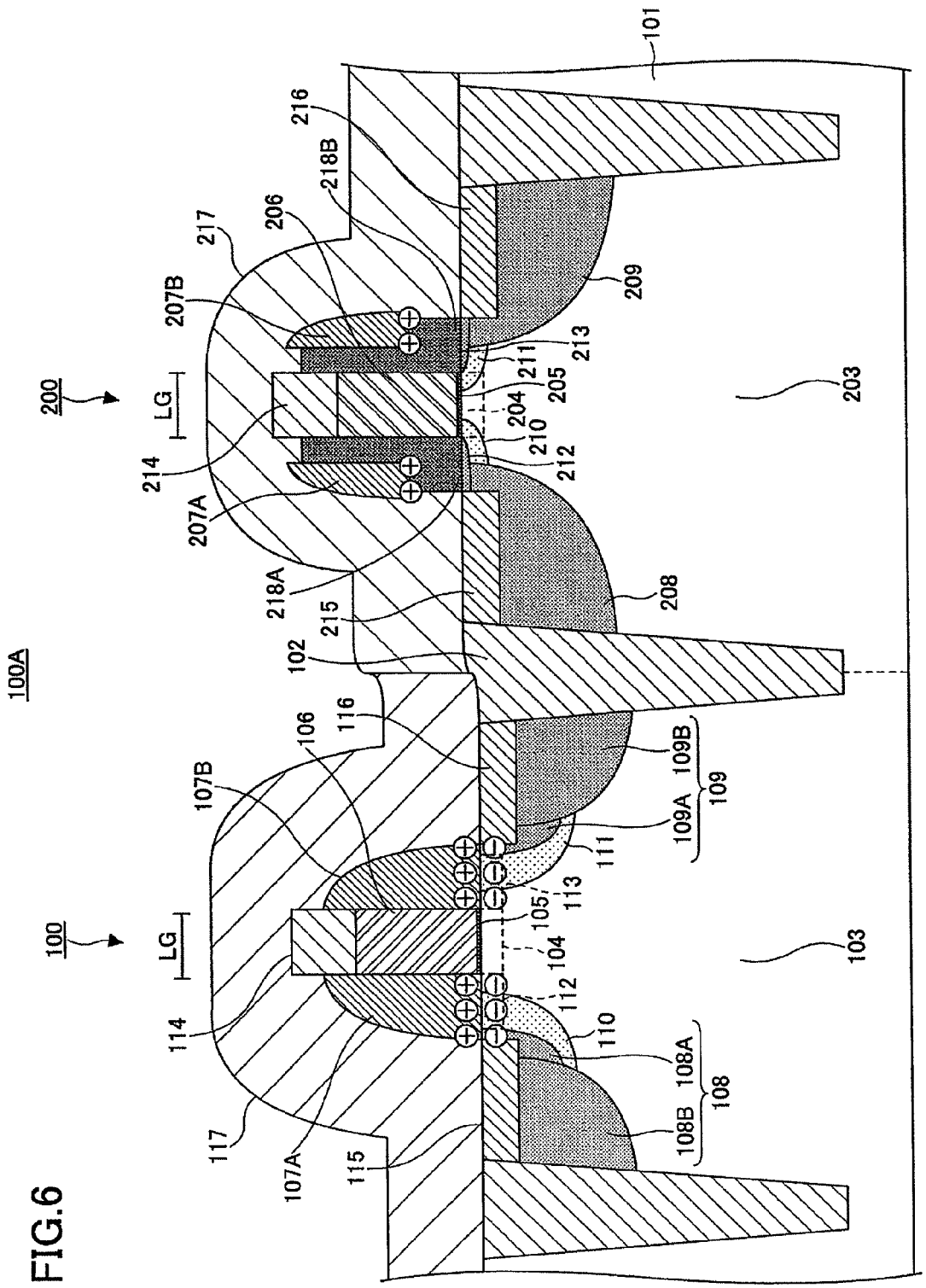
FIG. 6 is a schematic diagram showing a configuration of a semiconductor device according to a first embodiment of the present invention.

FIG. 6 is a schematic diagram showing a semiconductor device 100A according to a first embodiment of the present invention. The semiconductor device 100A is formed by using two MOS transistors of different conductivity types (CMOS).

With reference to FIG. 6, the illustrated semiconductor device 100A includes an NMOS transistor (hereinafter also referred to as "NMOS") 100 and a PMOS transistor (hereinafter also referred to as "PMOS") 200.

The NMOS transistor 100 and PMOS transistor 200 are separated by a device separation insulating film and formed in a device forming area (well) of a semiconductor substrate (e.g., silicon substrate) 101.

The NMOS transistor 100 is formed in a P well 103 formed in the semiconductor substrate 101. Furthermore, a channel area 104 is formed in the P well 103. Furthermore, a gate insulating film 105 is formed on the channel area 104, and a gate electrode 106 is formed on the gate insulating film 105. Furthermore, a silicide layer 114 (e.g., NiSi) is formed on the gate electrode 106. The silicide layer 114 may alternatively formed of CoSi.

In this example the gate electrode 106 has two pairs of sidewalls that face each other, in which a pair of sidewall insulating films 107A and 107B are formed one on each side of one of the pairs in the gate electrode 106. The sidewall insulating films 107A and 107B may be formed of, for example, a silicon nitride film. The silicon nitride film is formed to include a positive fixed charge(s).

In the P well 103 (semiconductor substrate 101), a source area 108 and a drain area 109 including N type impurity areas are formed one on each side of the gate electrode 106 in a manner having the channel area 104 interposed therebetween. The source area 108 includes source area parts 108A and 108B having different depths. The source area 108 may however include a single impurity area. Furthermore, the drain area 109 also includes drain area parts 109A and 109B having different depths. The drain area 109 may however include a single impurity area. Furthermore, silicide layers 115 and 116 (e.g., NiSi) are formed on the source area 108 and the drain area 109, respectively.

A pocket area 110 is formed at an outer side of the source area 108 (side toward the channel area 104). A pocket area 111 is formed at an outer side of the drain area 109 (side towards the channel area 104). Each of the pocket areas 110, 111 has a polarity (same polarity as the channel area 104) different from the source area 108 and the drain area 109, respectively. In addition, the pocket areas 110, 111 have a high impurity area having an impurity concentration higher than that of the channel area 104.

Since the pocket areas 110, 111 are provided at the above-described positions, punch through can be prevented from occurring. Thus, a short channel effect can be prevented in a case where the gate length LG of gate 106 is shortened.

In the NMOS transistor 100, substantially no N type impurity areas (extension areas) are formed continuing from the source area 108 and the drain area 109 at areas vertically below the sidewall insulating films 107A, 107B. Technically, there may be a source area or a drain area slightly extending at areas vertically below the sidewall insulating films 107A, 107B. However, no extension area is affirmatively formed in the NMOS transistor 100 according to an embodiment of the present invention. Furthermore, in the NMOS transistor 100 according to an embodiment of the present invention, the pocket areas 110, 111 are formed in a manner separated a greater distance from each other compared to a configuration of a related art case. Therefore, adverse effects due to overlapping pocket areas 110 and 111 can be prevented. Thus, low impurity concentration of the channel area 104 can be maintained. Furthermore, the NMOS transistor 100 according to an embodiment of the present invention includes channel vicinity areas 112 and 113 (described below) which correspond to source/drain extension areas of a regular MOS transistor.

The channel vicinity areas 112 and 113 are formed in areas of the P well 103 located adjacent to the channel area 104 and vertically below the sidewall insulating films 107A and 107B, respectively. No N type impurity areas are formed at least in the channel vicinity areas 112, 113. The channel vicinity area 112 is formed between the source area 108 and the channel area 104 in the P well 103 vertically below the sidewall insulating film 107A. Likewise, the channel vicinity area 113 is formed between the drain area 109 and the channel area 104 in the P well 103 vertically below the sidewall insulating film 107B.

The channel vicinity areas 112, 113 continuing from the channel area 104 have an impurity area having the same conductivity type as the channel area 104. An inversion layer (negative) is formed in each of the channel vicinity areas 112, 113 by the positive fixed charges of the sidewall insulating films 107A, 107B. Therefore, the inversion layers formed in the channel vicinity areas 112, 113 respectively function as a source extension area and a drain extension of a regular NMOS transistor.

Accordingly, in the NMOS transistor 100 according to an embodiment of the present invention, the distance between the pocket areas 110 and 111 can be increased, to thereby maintain a low impurity concentration in the channel area 104. That is, with the above-described configuration of the NMOS transistor 100, a short channel effect can be prevented by the pocket areas 110 and 111 while also maintaining a low impurity concentration of the channel area 104 and attaining a satisfactory mobility of carriers (electrons) even in a case where the gate electrode 106 is fabricated into a fine size (shortening of gate length LG).

Furthermore, it is also preferable to form an insulating layer (e.g., silicon nitride film) 117 having tensile stress in a manner covering, for example, the source area 108, the drain 109, and the sidewall insulating films 107A, 107B, so that distortion can be provided to the channel area 104 and further improve the mobility of the carriers. That is, in this case, a tensile stress is applied to the channel area 104, to thereby improve mobility of carriers (electrons).

Meanwhile, the PMOS transistor 200 is formed in an N well 203 formed in the semiconductor substrate 101. Furthermore, a channel area 204 is formed in the N well 203. Furthermore, a gate insulating film 205 is formed on the channel area 204, and a gate electrode 206 is formed on the gate insulating film 205. Furthermore, a silicide layer 214 (e.g., NiSi) is formed on the gate electrode 206.

In this example, the gate electrode 206 has two pairs of sidewalls that face each other, in which a pair of sidewall insulating films 207A and 207B are formed one on each side of one of the pairs in the gate electrode 206. The sidewall insulating films 207A and 207B may be formed of, for example, a silicon nitride film. The silicon nitride film is formed to include a positive fixed charge(s).

In the N well 203 (semiconductor substrate 101), a drain area 208 and a source area 209 including P type impurity areas are formed on each side of the gate electrode 206 in a manner having the channel area 204 interposed therebetween. Furthermore, silicide layers 215 and 216 (e.g., NiSi) are formed on the drain area 208 and the source area 209, respectively.

A drain extension area 212 continuing from the drain area 208 and extending toward the channel area 204 is formed in an area in the N well 203 located vertically below the sidewall insulating film 207A. Likewise, a source extension area 213 continuing from the source area 209 and extending toward the channel 204 is formed in an area in the N well 203 located vertically below the sidewall insulating film 207B.

Furthermore, a pocket area 210 is formed at an outer side (side toward the channel area 204) of the drain extension area 212, and a pocket area 211 is formed at an outer side (side towards the channel area 204) of the source extension area 213. The pocket areas 210, 211 have a polarity (same polarity as the channel area 204) different from that of the drain extension area 212 and the source extension area 213 and have an impurity area having an impurity concentration higher than the channel area 204.

The PMOS transistor 200 according to an embodiment of the present invention has a characteristic of being fabricated so that the distance between the sidewall insulating films 207A, 207B and the semiconductor substrate 1 is greater than that of the NMOS transistor 100. More specifically, in the PMOS transistor 200, the distance between the sidewall insulating films 207A, 207B and the semiconductor substrate 101 (N well 203) is greater than the distance between the sidewall insulating films 107A, 107B and the semiconductor substrate 101 (P well 103). Accordingly, the fixed charges included in the sidewall insulating films 207A, 207B have less affect on the drain extension area 212 and the source extension area 213.

In order to increase the distance between the sidewall insulating films 207A, 207B and the semiconductor substrate 101, buffer layers 218A and 218B are formed between the sidewall insulating film 207A and the semiconductor substrate 101 and between the sidewall insulating film 207B and the semiconductor substrate 101.

This configuration including the buffer layers 218A and 218B is formed in a manner described below. First, the buffer layers 218A, 218B are formed one on each sidewall of a pair of sidewalls facing each other. The buffer layers 218A and 218B are films that allow substantially no fixed charges to be formed therein (e.g., silicon oxide film). Then, the sidewall insulating films 207A, 207B are laminated on the buffer layers 218A, 218B. The sidewall insulating films 207A, 207B are films that allow fixed charges to be formed therein (e.g., silicon nitride film).

Furthermore, it is also preferable to form an insulating layer (e.g., silicon nitride film) 117 having a compression stress in a manner covering, for example, the drain area 208, the source area 209, and the sidewall insulating films 207A, 207B, so that distortion can be provided to the channel area 204 and further improve the mobility of the carriers. That is, in this case, a compression stress is applied to the channel area 204, to thereby improve mobility of carriers (electron holes).

By using the above-described configurations, a semiconductor device (in this example, a CMOS transistor) can be fabricated having its MOS transistor(s) maintaining a low channel impurity concentration and attaining improved carrier mobility while being able to prevent a short channel effect.

Furthermore, in manufacturing the above-described semiconductor device 100A according to an embodiment of the present invention, a structure capable of controlling the influence of fixed charges in the PMOS side and the NMOS side can be easily realized.

That is, in a related art case of injecting different impurities into the NMOS side and the PMOS side, a special type of element such as cesium or iodine is required (see Japanese Laid-Open Patent Application No. 2005-175378). This method is difficult to apply in an actual semiconductor manufacturing process.

Furthermore, in a process of forming a silicon nitride film including fixed charges according to a related art case, it is difficult to form a mask of an organic material (e.g., resist) since the substrate is heated to a high temperature. That is, in a CMOS transistor composed of an NMOS transistor and a PMOS transistor, it is difficult to fabricate provide a film formed with fixed charges only in the NMOS transistor.

Meanwhile, with the above-described semiconductor device 100A according to an embodiment of the present invention, fixed charges in the NMOS side and the PMOS side can be controlled by using buffer layers (e.g., silicon oxide film) of different thicknesses for the PMOS side and the NMOS side. The buffer layers (silicon oxide film) can not only be easily fabricated with various methods, but also can be easily removed by wet-etching.

Furthermore, the influence of the inversion layer formed by fixed charges becomes large if the buffer layers 218A, 218B are too thin, and the difference between the characteristics of the PMOS transistor 200 and the NMOS transistor 100 becomes large if the buffer layers 218A, 218B are too thick. Therefore, in a case where the buffer layers 218A, 218B are formed of a silicon oxide film, it is preferable for the thickness of the buffer layers 218A, 218B to range from 5 to 20 nm.

A buffer layer formed of, for example, a silicon oxide film may also be formed between the sidewall insulating films 107A, 107B and the silicon substrate 101. In this case, the buffer layer is preferred to be thinner than at least the buffer layer on the PMOS side. Furthermore, in a case of using a silicon substrate, an unexpected silicon oxide film may be formed on the silicon substrate by natural oxidation or a wet-etching process. Therefore, also taking such an unexpected case into consideration, the silicon oxide film (buffer layer) between the sidewall insulating films 107A, 107B and the silicon substrate 101 is preferred to have a thickness no greater than 3 nm.

Furthermore, in the above-described NMOS transistor 100, the source area (source electrode) and the drain area (drain electrode) are formed with surfaces lower than those of the PMOS transistor 200. For example, the surface (upper surface) of the source area 108 and the surface (upper surface) of the drain area 109 are formed (concaved) 7 to 20 nm below the interface between the gate insulating film 105 and the silicon substrate 101.

Accordingly, the stress applied to the channel area 104 becomes greater and the amount of distortion of silicon increases, to thereby increase the carrier mobility.

The above-described buffer layers are not limited to a silicon oxide film. Various materials (described below) may also be used for the buffer layers.

Second Embodiment

Figure 7:
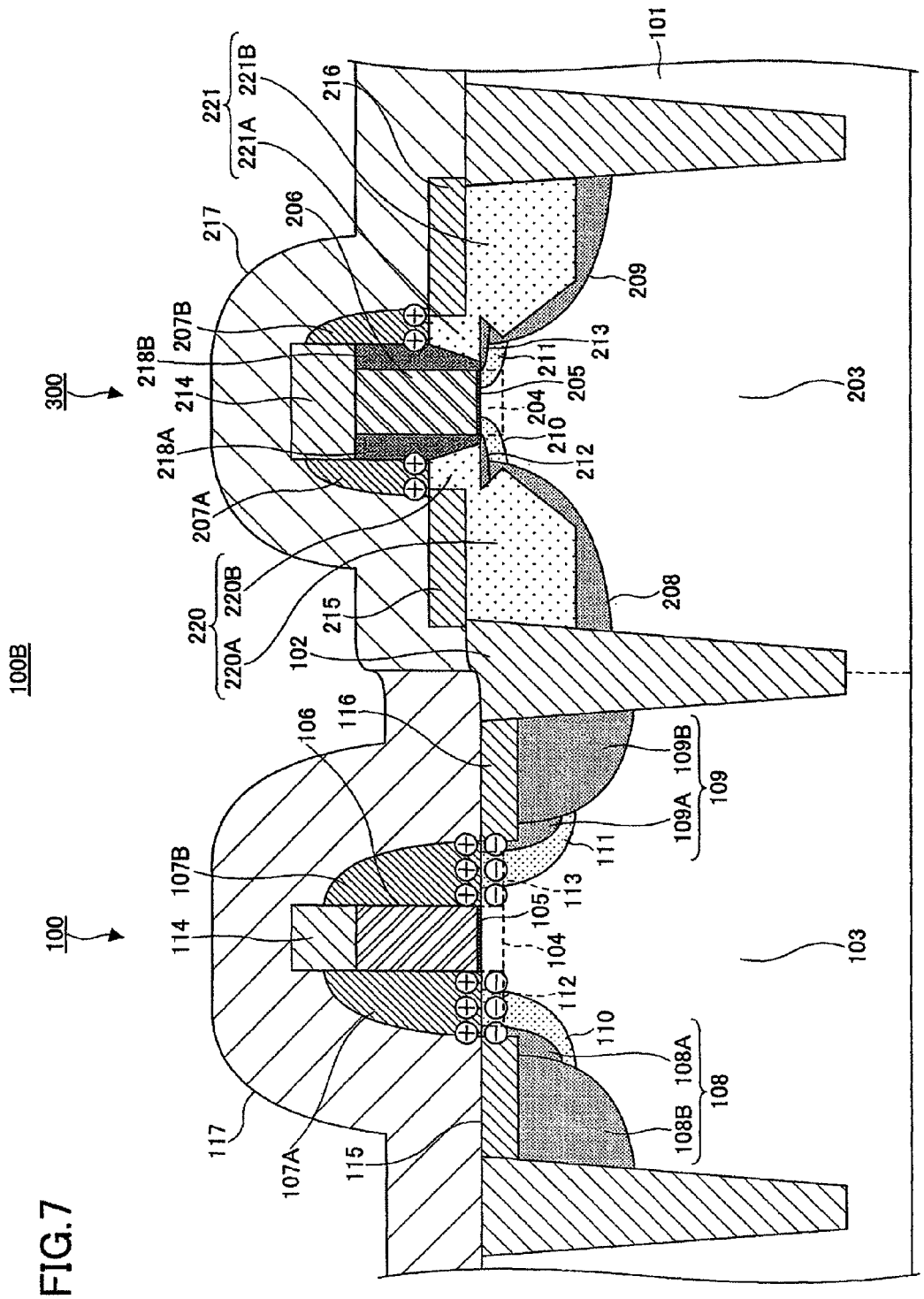
FIG. 7 is a schematic diagram showing a configuration of a semiconductor device according to a second embodiment of the present invention.

FIG. 7 is a schematic diagram showing a semiconductor device 100B according to a second embodiment of the present invention. In FIG. 7 (also in the following embodiments), like parts are denoted by like reference numerals as of the first embodiment and are not further explained.

In FIG. 7, the NMOS transistor 100 according to the second embodiment of the present invention has substantially the same configuration as that of the first embodiment of the present invention. The differences between a PMOS transistor 300 of the second embodiment of the present invention and the PMOS transistor 200 of the first embodiment of the present invention are described below.

In the PMOS transistor 300 according to the second embodiment of the present invention, SiGe layers 220, 221 are formed between the sidewall insulating films 207A, 207B and the silicon substrate 101 instead of the above-described buffer layers 218, 219 formed of silicon oxide film. More specifically, the SiGe layer 220 includes an SiGe layer 220B extending from an SiGe layer 220A in the drain area 208, and the SiGe layer 221 includes an SiGe layer 221B extending from an SiGe layer 221A in the source area 209.

That is, the PMOS transistor 300 is provided with the SiGe layer 220 extending from an area vertically below the sidewall insulating film 207A (SiGe layer 220A) to the inside of the drain area 208 (SiGe layer 220B). Likewise, the PMOS transistor 300 is provided with the SiGe layer 221 extending from an area vertically below the sidewall insulating film 207B (SiGe layer 221A) to the inside of the source area 209 (SiGe layer 221B).

An impurity (P type impurity) having the same conductivity type as the drain area 208 and the source area 209 is doped to the SiGe layers 220, 221. In this case, the impurity is preferred to have a concentration that does not allow an inversion layer to be formed in the SiGe layer by the fixed charges in the sidewall insulating films 207A, 207B.

By forming the SiGe layers 220, 221, the PMOS transistor 300 can attain satisfactory carrier (electron hole) mobility in the channel area 204.

For example, since the SiGe layer has a lattice constant larger than that of the silicon substrate, a distortion corresponding to this difference of lattice constant is created in channel area 204. In this case, a uniaxial compression stress is induced in the channel area 204. Thereby, satisfactory mobility of electron holes can be attained in the channel area 204.

In other words, in the semiconductor device 100B according to the second embodiment of the present invention, the NMOS transistor 100 uses the inversion layer of the fixed charges instead of the source/drain extensions, so that satisfactory carrier (electron) mobility can be attained in the channel area by preventing the impurity concentration from increasing in the channel area; the PMOS transistor 300, on the other hand, uses the SiGe layer doped with a P type impurity at high concentration, so that influence of the fixed charges can be prevented and satisfactory carrier (electron hole) mobility can be attained by inducing distortion in the channel area.

Next, the results of evaluating the electric characteristics of the above-described semiconductor device 100B (CMOS transistor) is described.

Figure 8B:
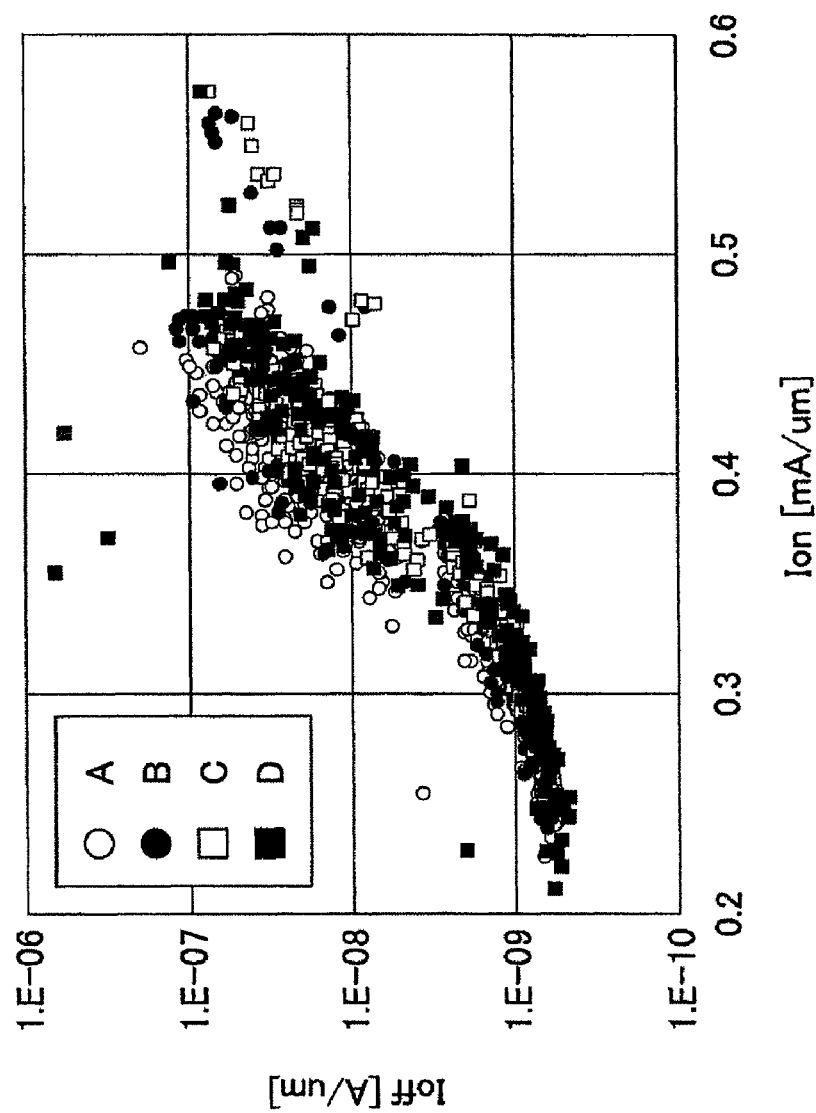
FIG. 8B is a graph for showing electric characteristics of the semiconductor device shown in FIG. 7 (Part 2)

FIGS. 8A and 8B are graphs showing the results of evaluating the electric characteristics of the PMOS transistor 300 shown in FIG. 7. More specifically, FIG. 8A shows values of an OFF state current ($I_{OFF}$) of the PMOS transistor 300 with respect to an intermediate current, and FIG. 8B shows the values of an ON state current ($I_{ON}$) of the PMOS transistor 300 with respect to an intermediate current. The reference numerals "A", "B", "C", and "D" in FIGS. 8A and 8B indicate experiments conducted by changing the length of the SiGe layers 220A, 221B formed vertically below the sidewall insulating films 207A, 207B.

The SiGe layers 220A, 221A are formed by epitaxial growth. In performing the epitaxial growth, first, the buffer layers 218A, 218B are removed by wet etching (e.g., HF). The experiments A-D are conducted by changing the length of time for performing the wet etching process. Therefore, the experiments A-D substantially indicate the length (size) of the SiGe layers 220A, 221A. Experiment A corresponds to the standard etching time. Experiment B is 1.5 times, experiment C is 2 times, and experiment D is 3 times with respect to the etching time of experiment A.

In FIGS. 8A and 8B, the longer the SiGe layers 220A, 221A (the more the buffer layers 218A, 218B are etched), the values of the ON state current and the intermediate current with respect to the OFF state current become greater. This shows that the carrier (electron hole) mobility in the PMOS transistor 300 improves and parasitic resistance decreases in correspondence with the formation (extension) of the SiGe layers 220A, 221A.

Figure 9:
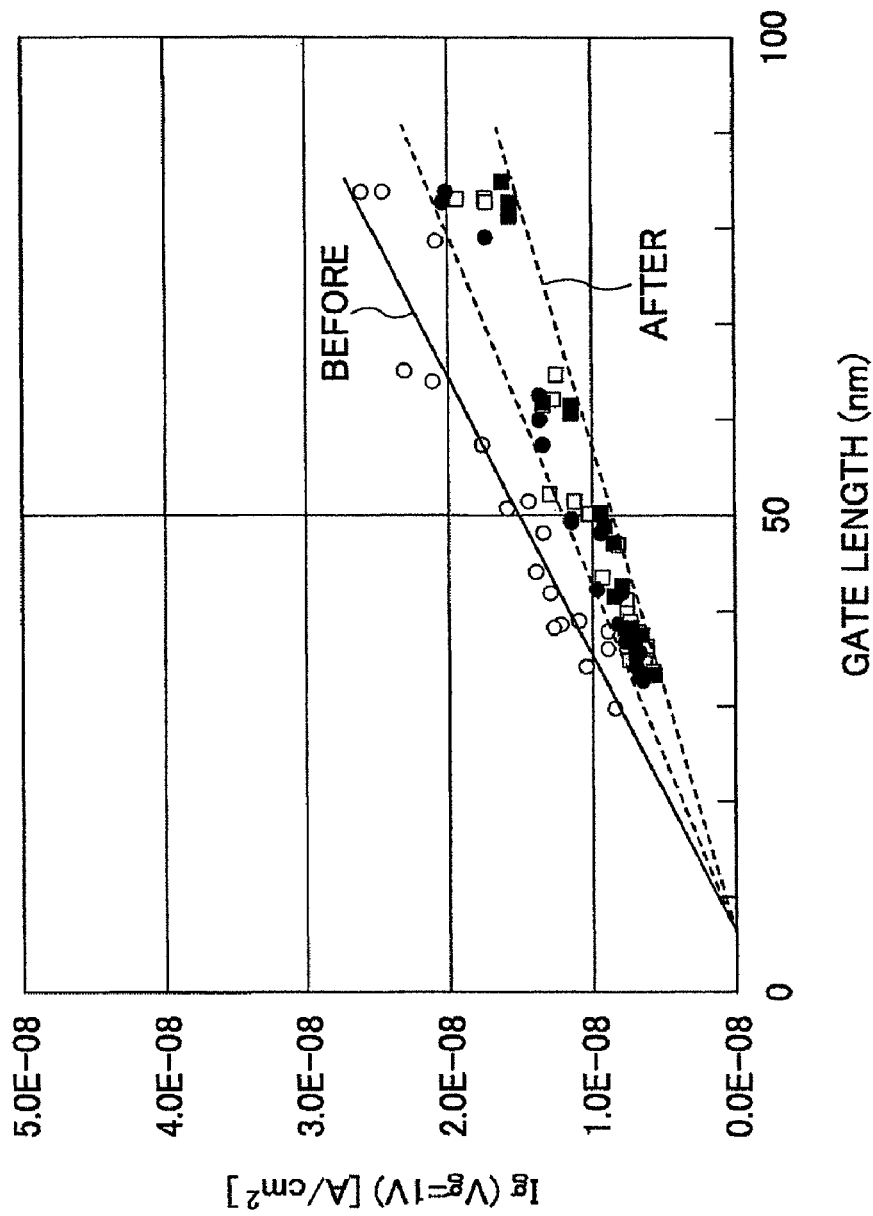
FIG. 9 is a graph for showing electric characteristics of the semiconductor device shown in FIG. 7 (Part 3)
Figure 10:
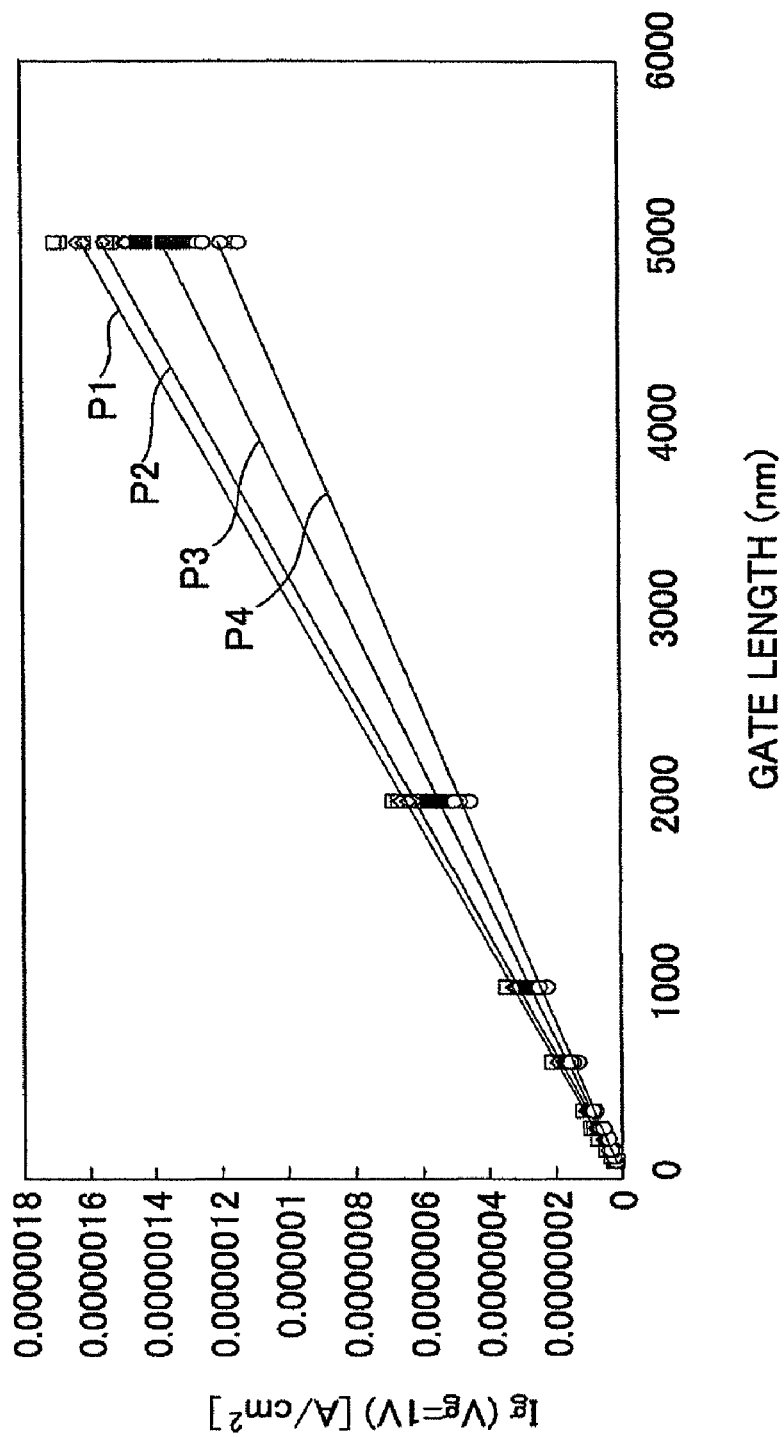
FIG. 10 is a graph for showing electric characteristics of the semiconductor device shown in FIG. 7 (Part 4)
Figure 11:
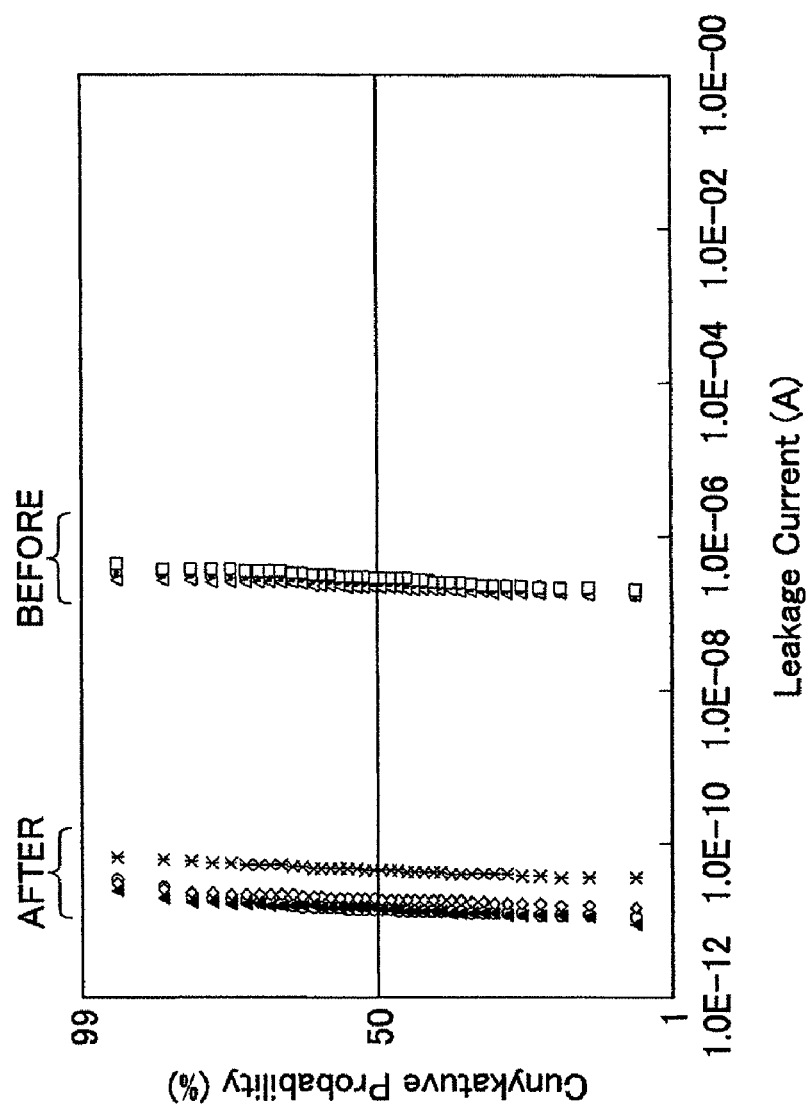
FIG. 11 is a graph for showing electric characteristics of the semiconductor device shown in FIG. 7 (Part 5)

FIGS. 9-11 are graphs showing the results of evaluating the electric characteristics of the NMOS transistor 100 shown in FIG. 7. More specifically, FIGS. 9 and 10 show the results of evaluating the gate leak current of the NMOS transistor 100 shown in FIG. 7, and FIG. 11 shows the results of evaluating the junction leak current of the NMOS transistor 100 shown in FIG. 7. It is to be noted that "BEFORE" indicates the evaluation results of an NMOS transistor having of source/drain extension areas according to a related art case, and "AFTER" indicates the evaluation results of the NMOS transistor 100 shown in FIG. 7.

FIG. 9 shows that the gate leak current of the NMOS transistor 100 is reduced significantly compared to the NMOS transistor of a related art case.

Furthermore, the evaluation results show that the configuration of the NMOS transistor 100 enables the leak current to be reduced in a case where a gate electrode having a gate length no greater than 50 nm (e.g., gate length of 30 nm) is formed into a fine size (shortened).

One reason the gate leak current is reduced is the fact the N type impurity areas (source area and drain area) are spaced apart from the gate electrode since no source/drain extension areas are formed in the NMOS transistor 100.

For example, in a relate art case having source/drain extension areas formed vertically below the sidewall insulating films, diffusion causes the N type impurity area to extend to an area vertically below the gate electrode (gate insulating film), thereby creating an overlapped structure This overlapped structure is a main cause for increasing gate leak current.

Meanwhile, with the NMOS transistor 100 according to this embodiment of the present invention, a non-overlapped structure can be obtained having no N type impurity area formed vertically below the gate electrode (gate insulating film) due to the fact that no source/drain extension areas are formed. Thereby, gate leak current can be reduced.

FIG. 10 shows the results of evaluating gate leak current in the NMOS transistor 100 in a case where the gate length is increased (to 6000 nm) The reference numerals "P1", "P2", "P3", and "P4" in FIG. 10 indicate experiments conducted by changing the impurity concentration of the pocket area of the NMOS transistor 100. The impurity concentration becomes higher in an order of experiment P4, P3, P2, and P1.

FIG. 10 shows that the gate leak current of the NMOS transistor 100 shown in FIG. 7 changes linearly in correspondence with the changes of gate length in a case where gate length is increased. Considering that a large transistor having a large gate length does not necessarily have to use the configuration of the NMOS transistor according to an embodiment of the present invention (as shown in FIGS. 6 and 7), it is preferable to use this configuration of the NMOS transistor for a fine size transistor having a gate length no greater than 50 nm.

FIG. 11 shows the results of evaluating the junction leak current of the NMOS transistor 100 shown in FIG. 7. FIG. 11 shows that the NMOS transistor 100 has a junction leak current which is no greater than 1/1000 compared to an NMOS transistor of a related art case. This is due to the configuration of the NMOS transistor 100 having a spaced apart N type impurity area (source area and drain area) and having no source/drain extension areas.

Third Embodiment

Next, an exemplary method of manufacturing the above-described semiconductor device (CMOS transistor) is described step by step with reference to FIGS. 12A-12Z and FIGS. 13A-13O.

First, in the step shown in FIG. 12A, a laminated structure of a silicon oxide film 101A and a silicon nitride film 101B is formed on, for example, a silicon substrate (semiconductor substrate) 101.

Then, in the step shown in FIG. 12B, a patterning process is performed on the silicon nitride film 101B and the silicon oxide film 101A in which the silicon nitride film 101B and the silicon oxide film 101A are etched by using a resist pattern as a mask. Then, the silicon substrate 101 is etched by using the patterned silicon nitride film 101B and the silicon oxide film 101A as a mask, to thereby form a hole 101C having a depth of, for example, 300 nm in the semiconductor substrate 101.

Then, in the step shown in Step 12C, a device separation insulating film 102 is buried in the hole 101C by forming a silicon oxide film by using a CVD method. Then, the silicon substrate 101 is flattened by removing the silicon oxide film on the silicon nitride film 10B by using a CMP (Chemical Mechanical Polishing) method.

Then, in the step shown in FIG. 12D, the silicon nitride film 101B and the silicon oxide film 101A on the silicon substrate 101 are removed by using a wet etching method using, for example, phosphoric acid or hydrofluoric acid. Then, a P well 103 is formed in a predetermined area of the silicon substrate 101 divided by the device separation insulating film 102 by injecting a P type impurity in the predetermined area. Likewise, an N well 203 is formed in another predetermined area of the silicon substrate 101 divided by the device separation insulating film 102 by injecting an N type impurity in the other predetermined area.

Figure 12E:
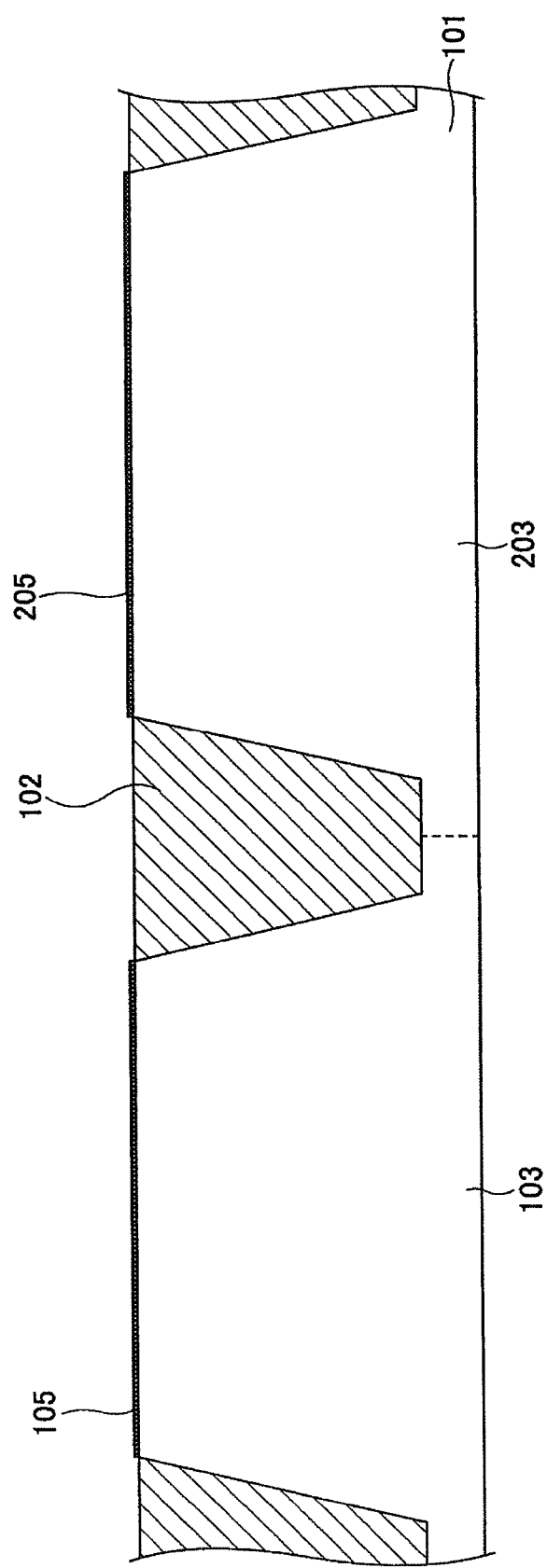
FIGS. 12A to 13O is a schematic diagram for describing a method of manufacturing the semiconductor device shown in FIG. 7.

Then, in the step shown in FIG. 12E, a gate insulating film 105 and a gate insulating film 205 are formed on the P well 103 and the N well 203, respectively, by using, for example, a thermal oxidation method. The gate insulating films 105, 205 are formed in a thickness of, for example, 1.2 nm. Other than a silicon oxide film, the gate insulating films 105, 205 may be, for example, a silicon oxynitride film (SiON), a hafnium oxide film (HfO), a hafnium silicate film (HfSiO), a hafnium aluminum oxide film (HfAlO), or an aluminum oxide film (AlO). The gate insulating films 105, 205 may also be, for example, a film having nitrogen added to the foregoing HfSiON film, HfON film, HfAlON film, or AlON film.

Figure 12F:
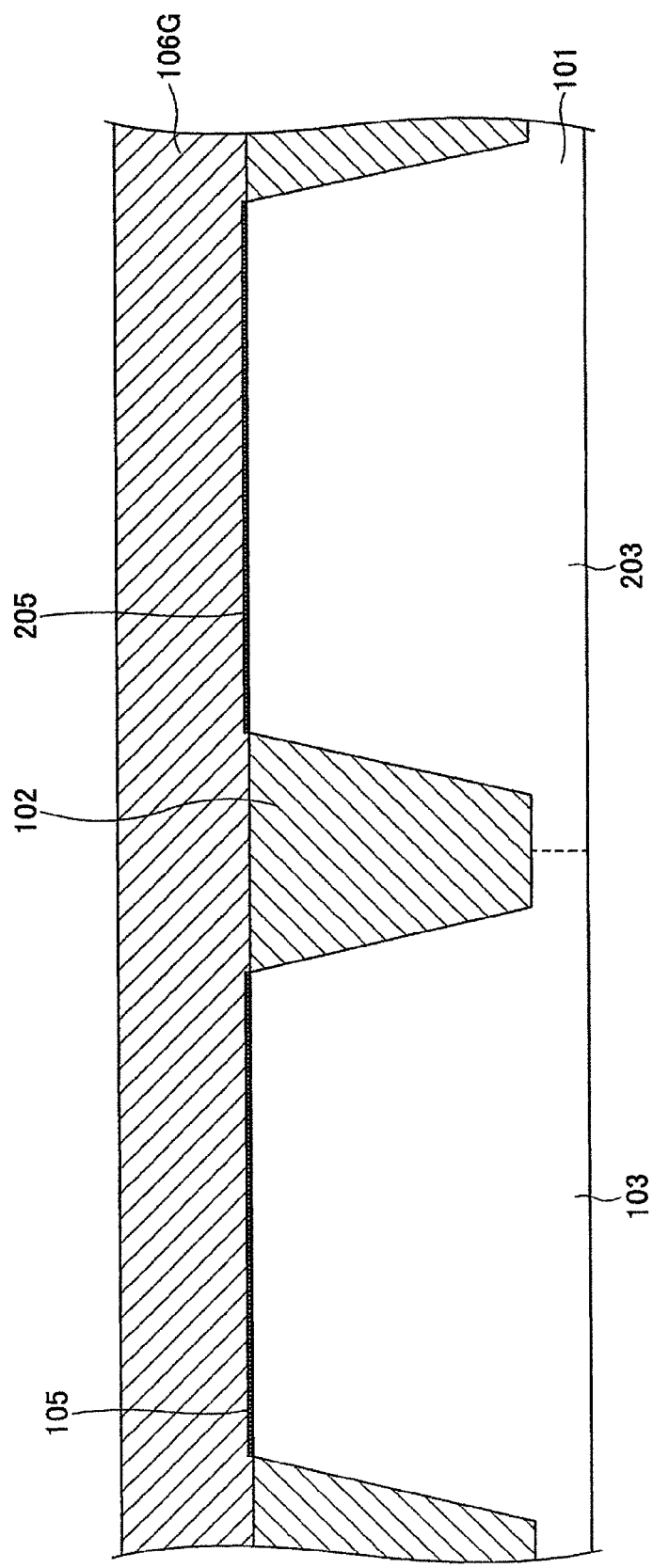

Then, in the step shown in FIG. 12F, a gate electrode layer 106G including polysilicon (Poly Si) is formed in a manner covering the gate insulating films 105 and 205 by using a thermal CVD method. The gate electrode layer 106G is formed in a thickness of, for example, 100 nm.

Then, in the step shown in FIG. 12G, a resist pattern M1 for covering the P well 103 and exposing the N well 203 is formed. Then, boron (B) ions are injected (acceleration energy: 2 keV, dosage: $4 \times 10^{15}$ cm$^{-2}$) into the gate electrode layer 106G on the N well 203 by using the resist pattern M1 as a mask (pre-dope).

Then, in the step shown in FIG. 12H, the resist pattern is peeled from the silicon substrate 101. Then, the silicon substrate 101 is annealed for 3 seconds at a temperature of 900° C., to thereby allow the pre-doped boron ion to diffuse in the gate electrode 106G on the N well 203.

Then, in the step shown in FIG. 12I, a silicon oxide film M2 is formed on the gate electrode layer 106G by using a CVD method. Then, a resist pattern M3, corresponding to a shape of a gate electrode, is formed on the N well 103 and the P well 203.

Figure 12J:
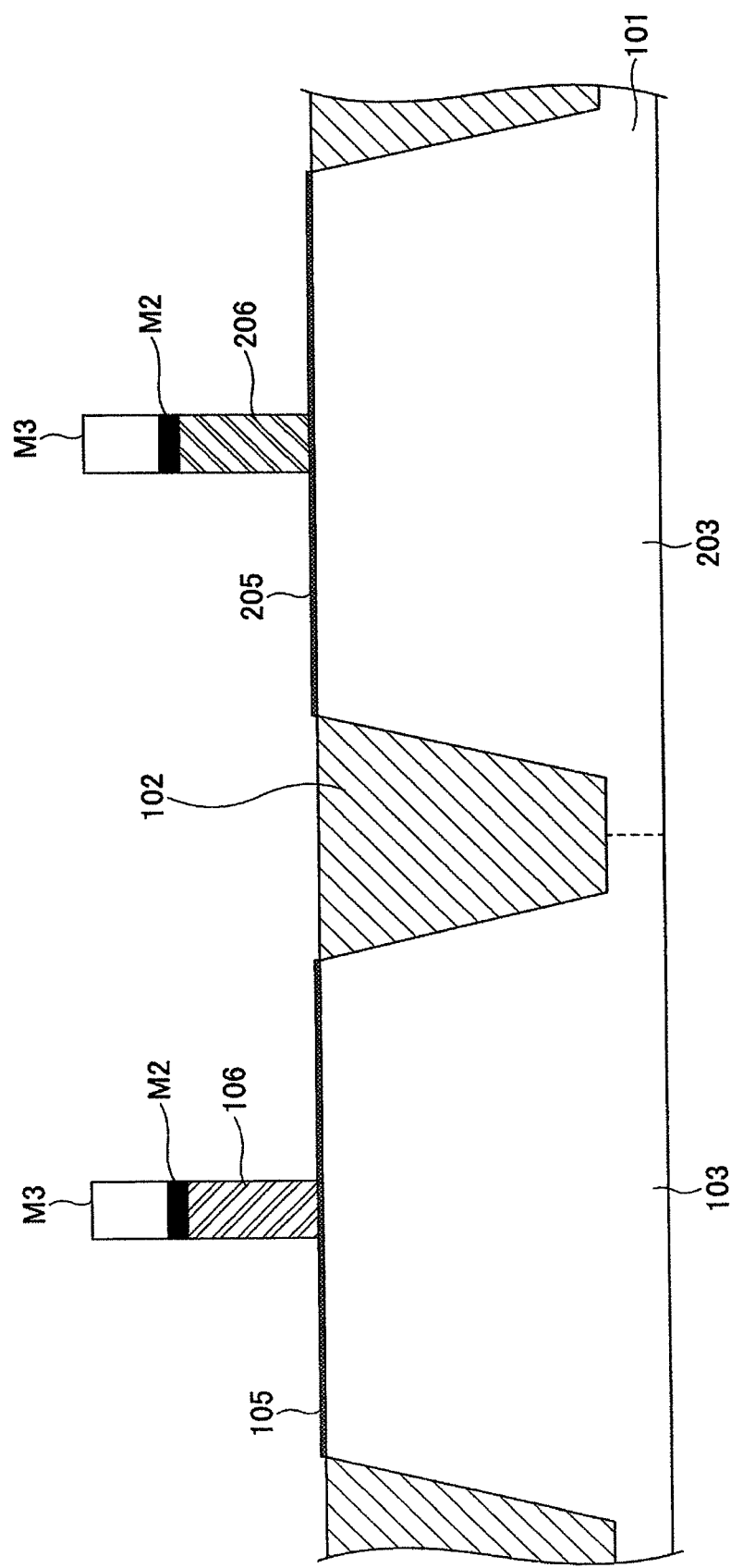

Then, in the step shown in FIG. 12J, the silicon oxide film M2 is etched by using the resist pattern M3 as a mask (pattern etching). Then, the gate electrode layer 106G is etched by using the patterned (etched) silicon oxide film M2 and the resist pattern M3 as a mask (pattern etching). Thereby, a gate electrode 106 is formed on the gate insulating film 105 and a gate electrode 206 is formed on the gate insulating film 205.

Then, in the step shown in FIG. 12K, the resist pattern M3 and the silicon oxide film M2 are removed.

Figure 12L:
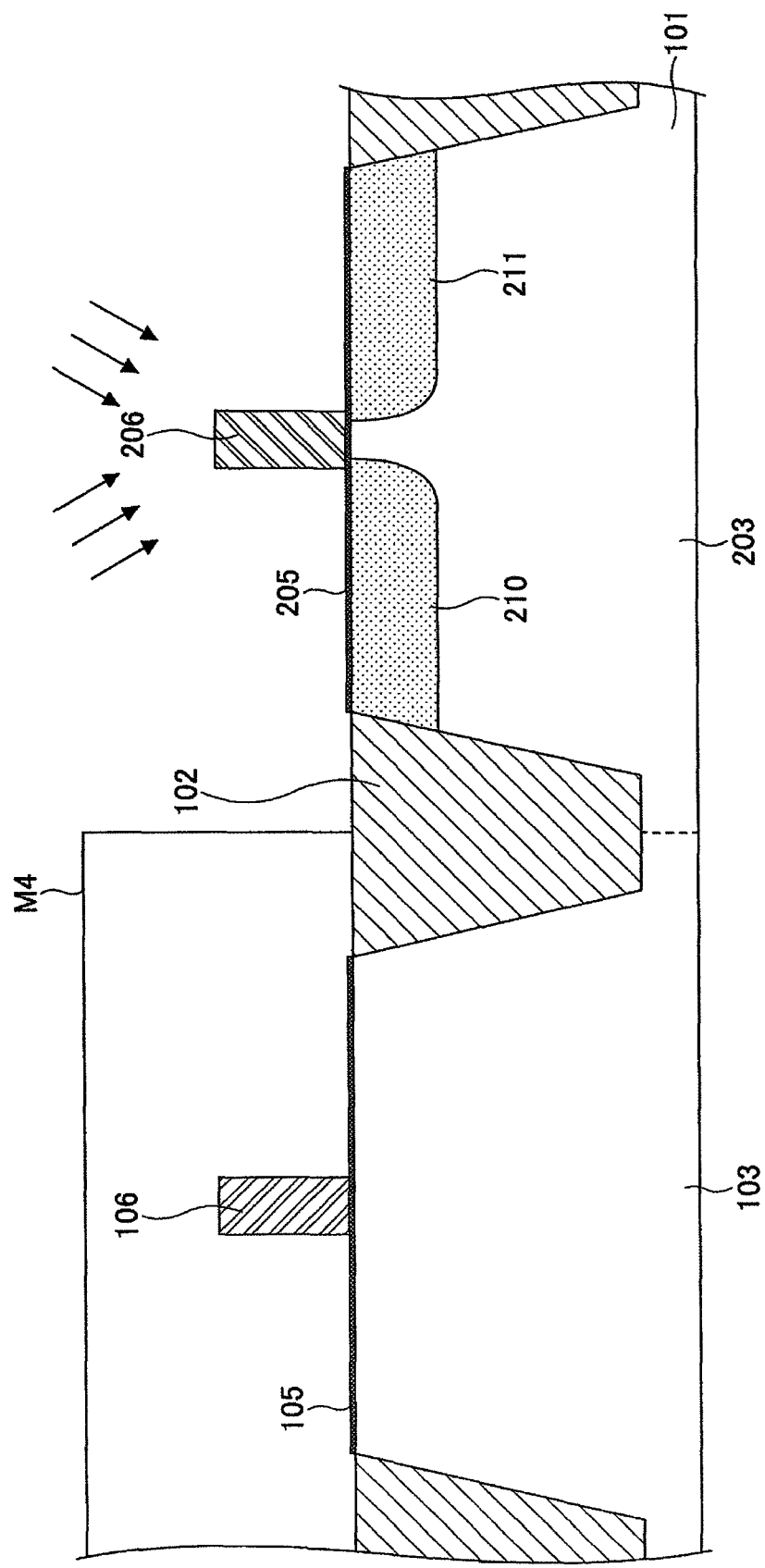

Then, in the step shown in FIG. 12L, a resist pattern M4 for covering the P well 103 and exposing the N well 203 is formed. Then, antimony ions are injected (acceleration energy: 60 keV, dosage $1 \times 10^{13}$ cm$^{-2}$) into the N well 203 by using the resist pattern M4 and the gate electrode 206 as a mask, to thereby form pocket areas 210 and 211.

It is to be noted that, in the ion injection process for forming the pocket areas 210, 211 in the N well 203, it is preferable to perform the ion injection in an inclined manner (e.g., inclined 30 degrees with respect to the normal line of the silicon substrate 101). It is also preferable to perform the ion injection from four directions with respect to the gate electrode 206.

Figure 12M:
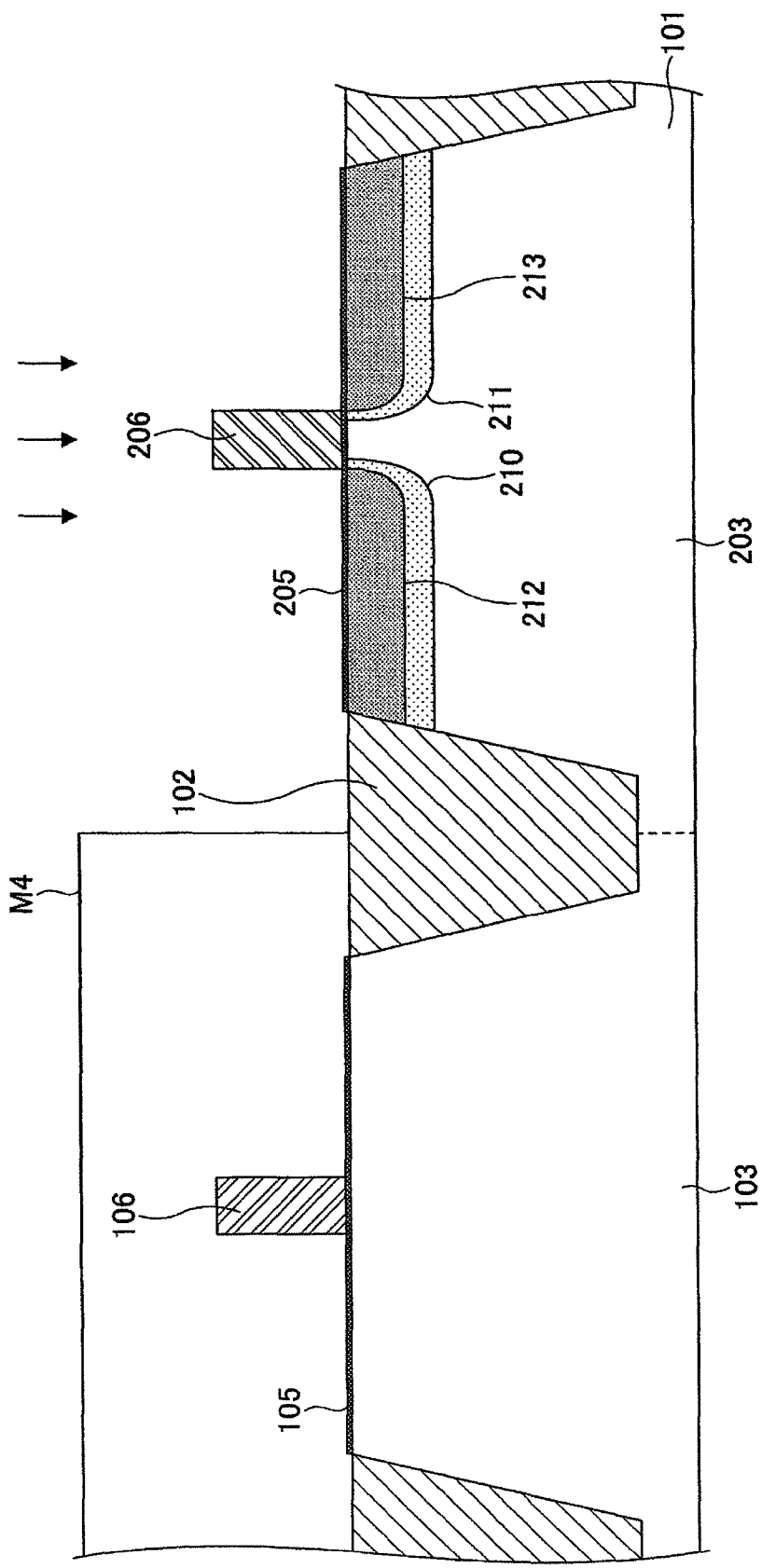

Then, in the step shown in FIG. 12M, boron ions are injected (acceleration energy: 0.5 keV, dosage $2 \times 10^{14}$ cm$^{-2}$) into the N well 203 by using the resist pattern M4 and the gate electrode 206 as a mask. Thereby, a drain extension area 212 and a source extension area 213 are formed on both sides of the gate electrode 206 of the N well 203.

Figure 12N:
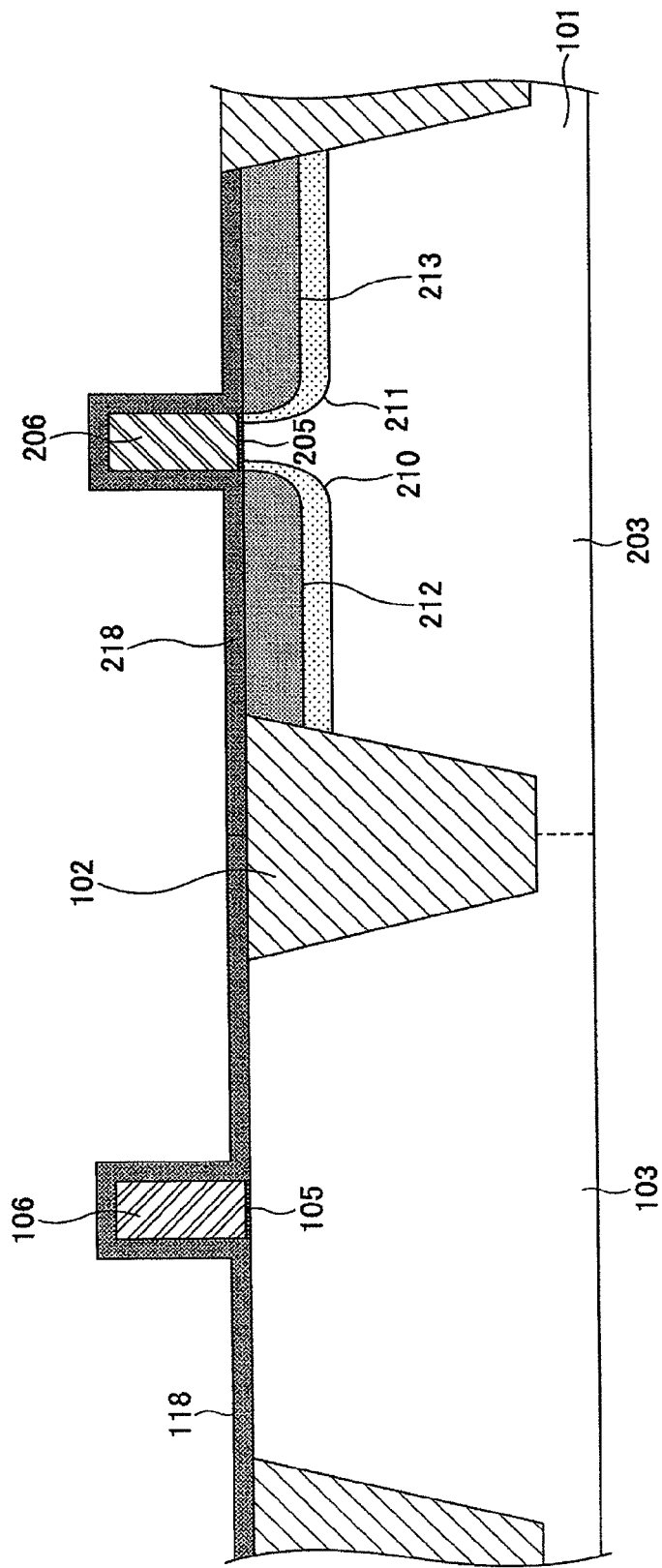

Then, in the step shown in FIG. 12N, the resist pattern M4 is peeled from the silicon substrate 101. Then, a buffer layer 118 and a buffer layer 218 are formed on the P well 103 and the N well 203 by using a CVD method. The buffer layers 118, 218, for example, include silicon oxide film and have a thickness of 15 nm. Since the buffer layer 118 and buffer layer 218 are formed at the same time, the buffer layer 118 and the buffer layer 218 form a continuous united body. Furthermore, the buffer layers 118, 218 including a silicon oxide film are preferred to have a thickness ranging, for example, from 5 nm to 20 nm. The buffer layer 118 is formed in a manner covering the surface of the P well 103 (silicon substrate 101), the sidewall surfaces of the gate electrode 106, and the top surface of the gate electrode 106. Likewise, the buffer layer 218 is formed in a manner covering the surface of the N well 203 (silicon substrate 101), the sidewall surfaces of the gate electrode 206, and the top surface of the gate electrode 206.

Figure 12O:
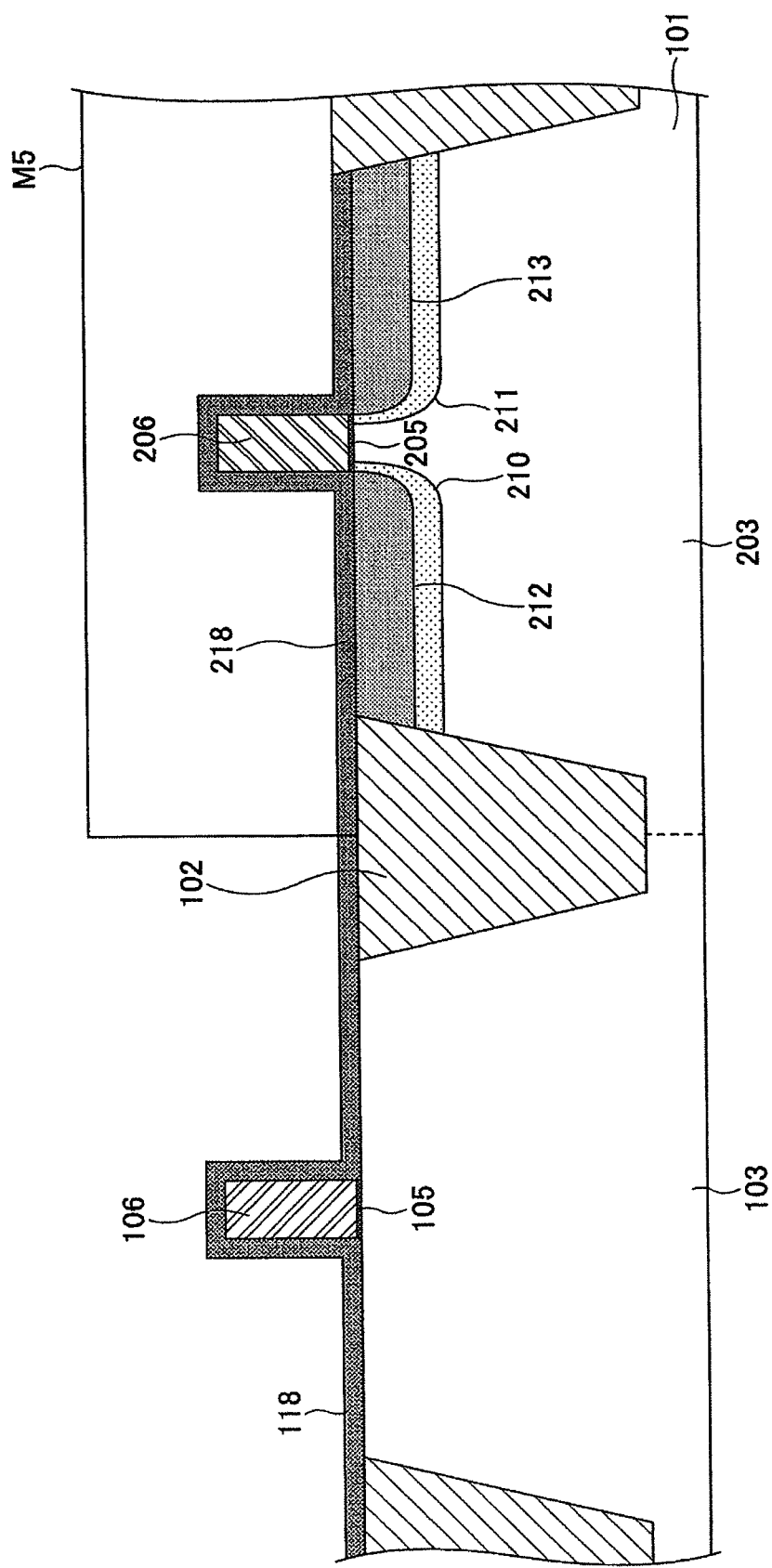

Then, in the step shown in FIG. 12O, a resist pattern M5 for covering the N well 203 and exposing the P well 103 is formed.

Then, in the step shown in FIG. 12P, the buffer layer 118 formed on the exposed P well 103 is removed by a wet etching method using an HF type solvent. In order to protect the buffer layer 218 from the etching solvent used in this wet etching process, a predetermined hard mask (e.g., silicon nitride film) may be provided between the buffer layer 218 and the resist pattern M5. It is to be noted that the buffer layer 118 may be wet-etched to a degree that the buffer layer 118 is substantially completely removed or to a degree that the thickness of the buffer layer 118 is reduced. In a case of substantially completely removing the buffer layer 118, there is a possibility that an extremely thin silicon oxide film will be formed on the surface of the P well 103 due to reaction of oxygen and silicon in the etching solvent or the reaction of oxygen and silicon in the atmosphere. In the step shown in FIG. 12P, the buffer layers 118, 218 are fabricated with different thicknesses in the NMOS side and the PMOS side so that the inversion layer formed by fixed charges can be controlled. Thus, in this example, only the buffer layer 118 of the NMOS side is subject to the etching process.

Figure 12Q:
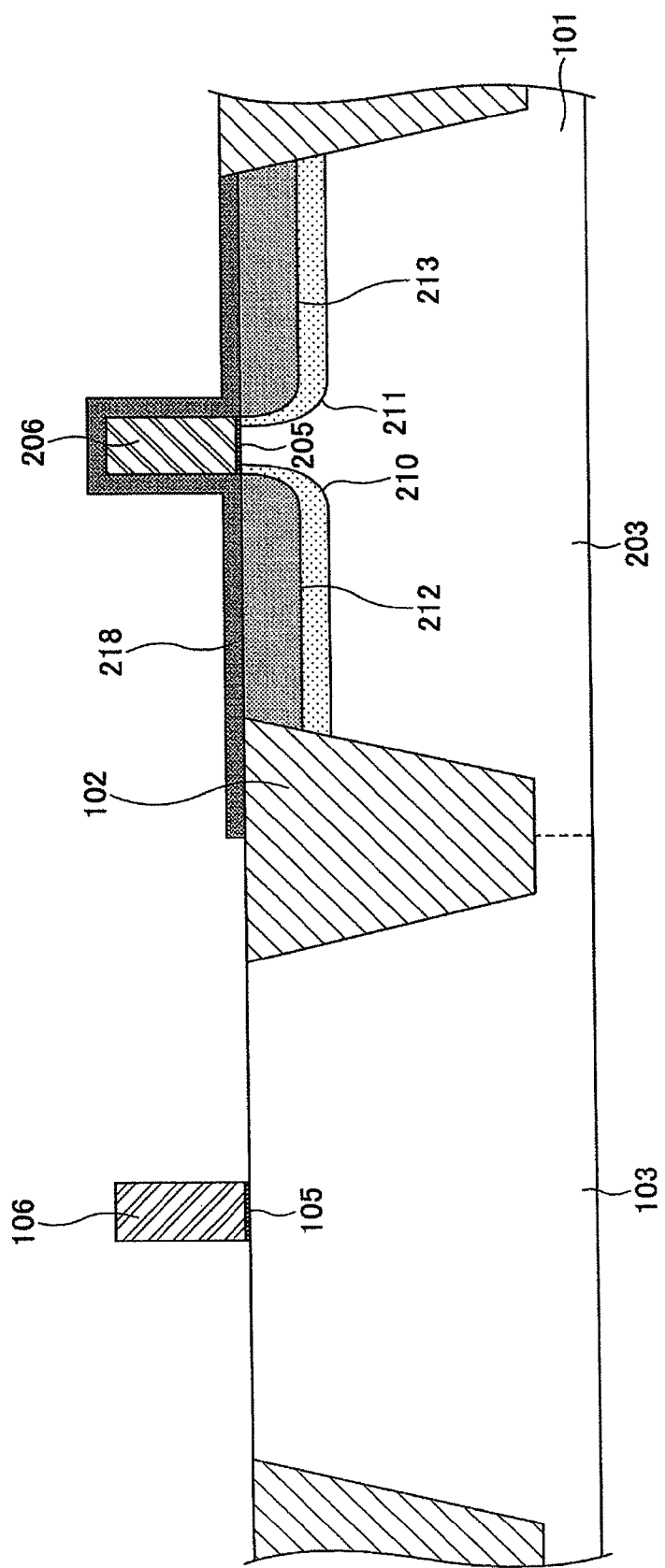

Then, in the step shown in FIG. 12Q, the resist pattern M5 is peeled from the silicon substrate 101 after the wet etching process. After the resist pattern M5 is peeled, the silicon substrate 101 (P well 203) may be annealed in a gas atmosphere containing a nitrogen (N) element. It is preferable to conduct this annealing process since the amount of charges induced in the silicon substrate can be increased. For example, the annealing process may be conducted in an ammonia atmosphere at an annealing temperature (substrate temperature) ranging from 650° C. to 1100° C. (e.g., 775° C.).

Figure 12R:
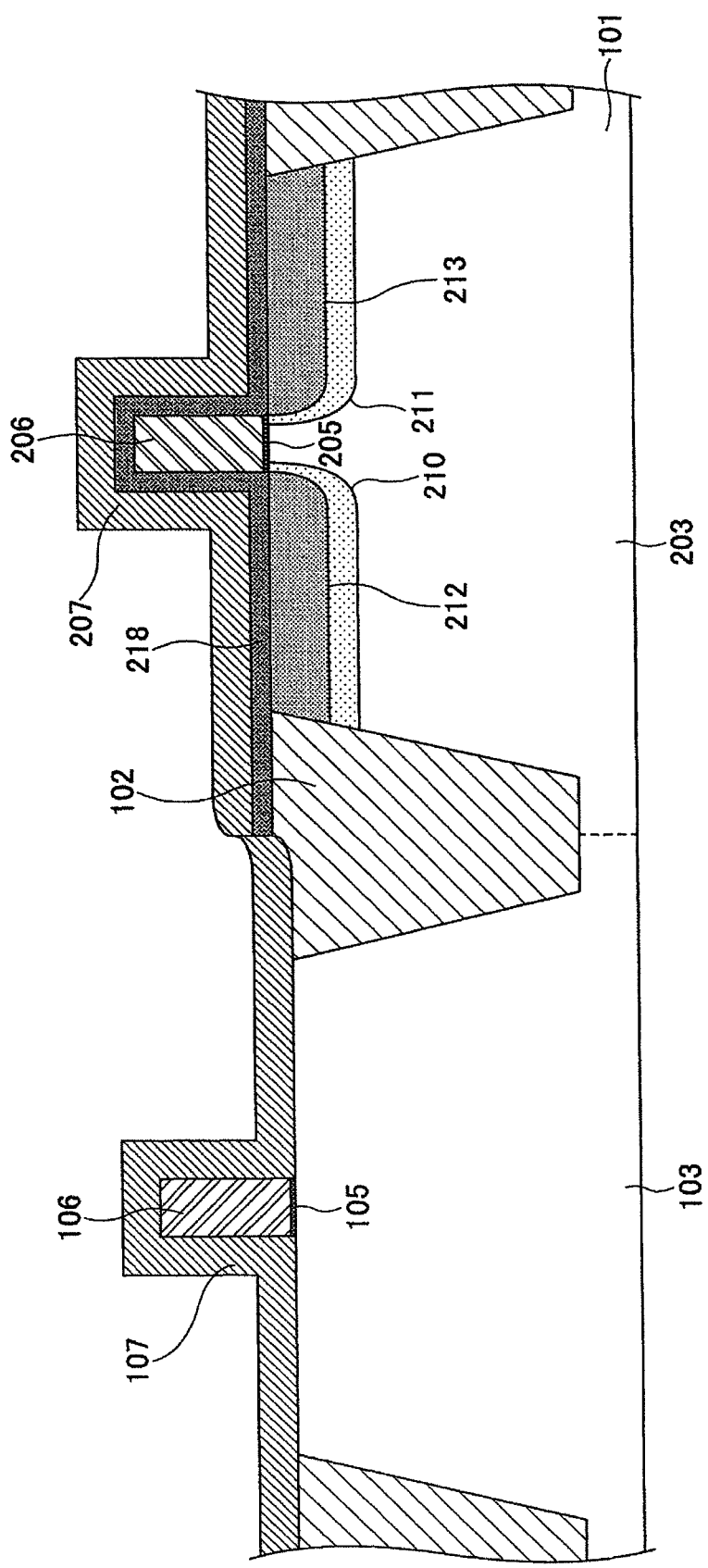

Then, in the step shown in FIG. 12R, insulating films 107, 207 including a silicon nitride film are formed on the P well 103 and the N well 203 by using, for example, a thermal CVD method. The thermal CVD method may be conducted by using a gas containing a silicon element and a gas containing a nitrogen element. The insulating films 107, 207 are formed with a thickness of 30 nm. Since the insulating layer 107 and the insulating layer 207 are formed at the same time, the insulating layer 107 and the insulating layer 207 form a continuous united body.

The insulating layer 107 is formed in a manner covering the surface of the P well 103 (silicon substrate 101), the sidewall surfaces of the gate electrode 106, and the top surface of the gate electrode 106. Furthermore, the insulating layer 207 is formed in a manner covering the buffer layer 218 formed on the surface of the N well 203 (silicon substrate 101), the buffer layer 218 formed on the sidewall surfaces of the gate electrode 206, and the buffer layer 218 formed on the top surface of the gate electrode 206.

That is, in the N well side 203 of the silicon substrate 101, a laminated structure of the buffer layer 218 and the insulating layer 207 is formed on the N well 203 and the gate electrode 206.

Figure 12S:
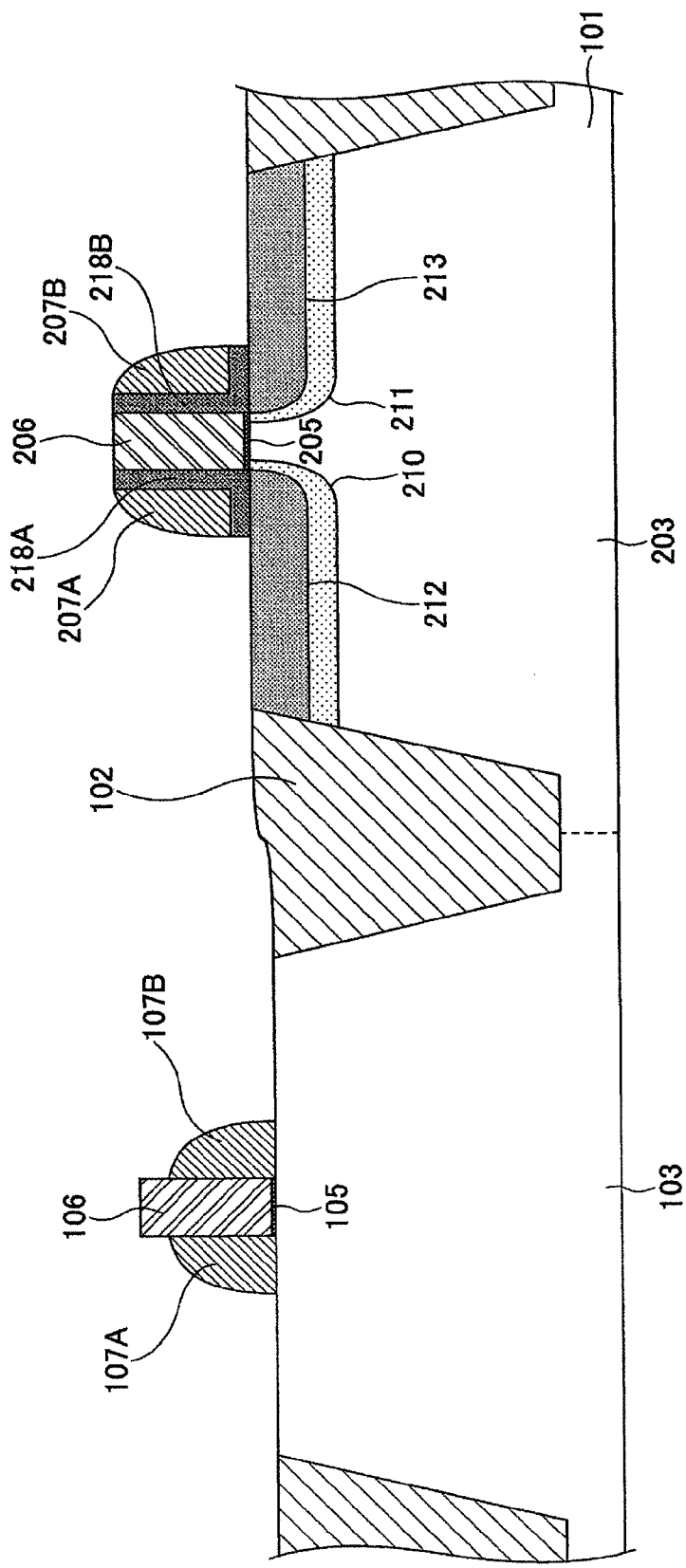

Next, in the step shown in FIG. 12S, a plasma (dry) etching process (e.g., RIE (Reactive Ion Etching) is performed on the insulating layers 107 and 207. Thereby, a pair of sidewall insulating films 107A, 107B is formed on a pair of opposite (facing) sidewalls of the gate electrode 106. Furthermore, a pair of sidewall insulating films 207A, 207B is formed on the N well 203 (silicon substrate 101) via a pair of buffer layers 218A, 218B. As described above, the buffer layers 218A, 218B are preferred to have a thickness ranging from 5 to 20 nm.

In comparing the surface of the P well 103 and the surface of the N well 203 after the plasma etching process, it can be seen that the surface of the P well 103 is formed (made concave) in a position lower than the surface of the N well 203. This concave configuration is obtained by removing the laminated structure of the buffer layer 218 and the insulating layer 207 on the N well 203 by conducting an etching process for a predetermined amount of time and by etching the silicon substrate 101 on the P well 103. Accordingly, the surface of the silicon substrate 101 on both sides of the gate insulating film 105 is in a concave state with respect to the interface between the gate insulating film 105 and the silicon substrate 101.

Figure 12T:
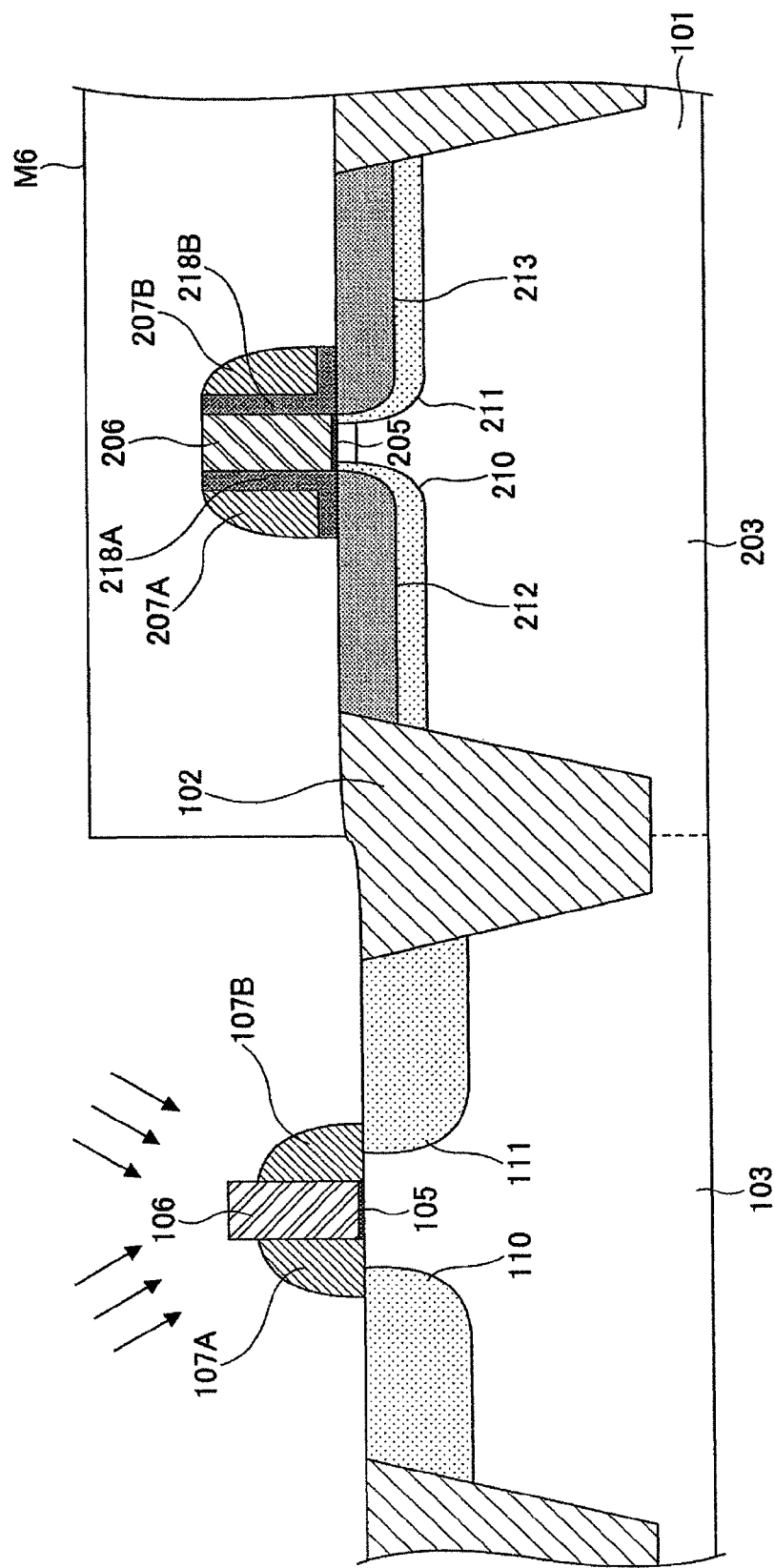

Then, in the step shown in FIG. 12T, a resist pattern M6 for covering the N well 203 and exposing the P well 103 is formed. Then, indium ions are injected (acceleration energy: 100 keV, dosage $1 \times 10^{13}$ cm$^{-2}$) into the P well 103 by using the resist pattern M6 and the gate electrode 106 as a mask. Thereby, a pocket area 110 and a pocket area 111 are formed.

It is to be noted that, in the ion injection process for forming the pocket areas 110, 111 in the P well 103, it is preferable to perform the ion injection in an inclined manner (e.g., inclined 30 degrees with respect to the normal line of the silicon substrate 101). It is also preferable to perform the ion injection from four directions with respect to the gate electrode 106.

Then, in the step shown in FIG. 12U, arsenic ions are injected (acceleration energy: 10 keV, dosage $2 \times 10^{15}$ cm$^{-2}$) into the P well 103 by using the resist pattern M6 and the gate electrode 206 as a mask. Thereby, a source area 108A and a drain area 108B are formed on both sides of the gate electrode 106 of the P well 103.

Then, in the step shown in FIG. 12V, the resist pattern M6 is peeled from the silicon substrate 101.

Then, in the step shown in FIG. 12W, a resist pattern for covering the P well 103 and exposing the N well 203 is formed. Then, boron ions are injected (acceleration energy: 10 keV, dosage $5 \times 10^{13}$ cm$^{-2}$) into the N well 203 by using the resist pattern M7, the gate electrode 206, and the sidewall insulating films 207A, 207B (buffer layers 218A, 218B) as a mask. Thereby, a drain area 208 and a source area 209 are formed on both sides of the gate electrode 206 of the N well 203.

Figure 12X:
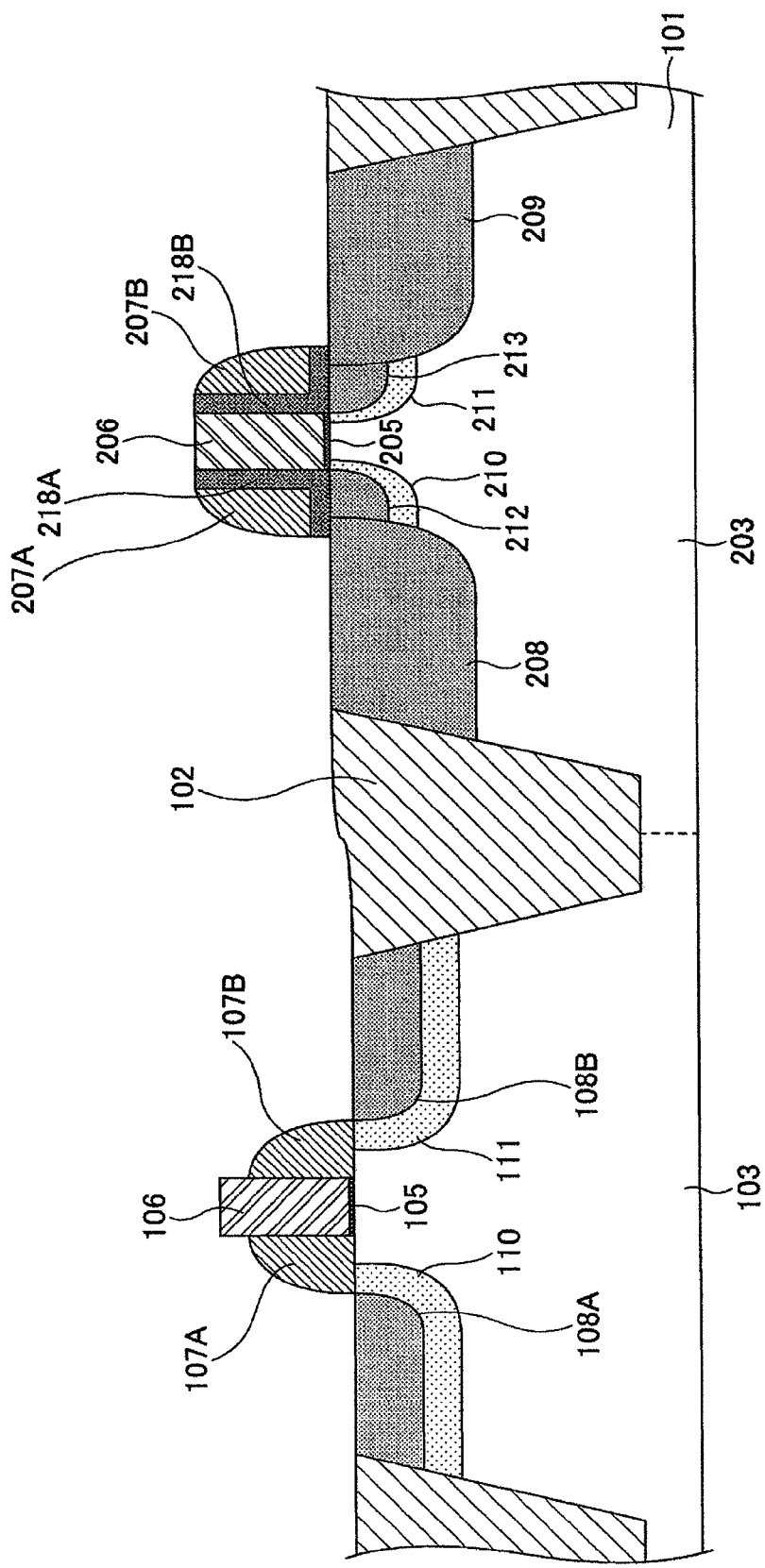

Then, in the step shown in FIG. 12X, the resist pattern M7 is peeled from the silicon substrate 101.

The below-described steps shown in FIGS. 12Y through 13D are conducted for forming a SiGe layer in the N well 103 side of the silicon substrate 101. Therefore, in a case of manufacturing the semiconductor device 100A shown in FIG. 6, the steps shown in FIGS. 12Y through 13D do not have to be conducted, but rather proceed to conducting the steps shown in FIG. 13E and thereafter.

Figure 12Y:
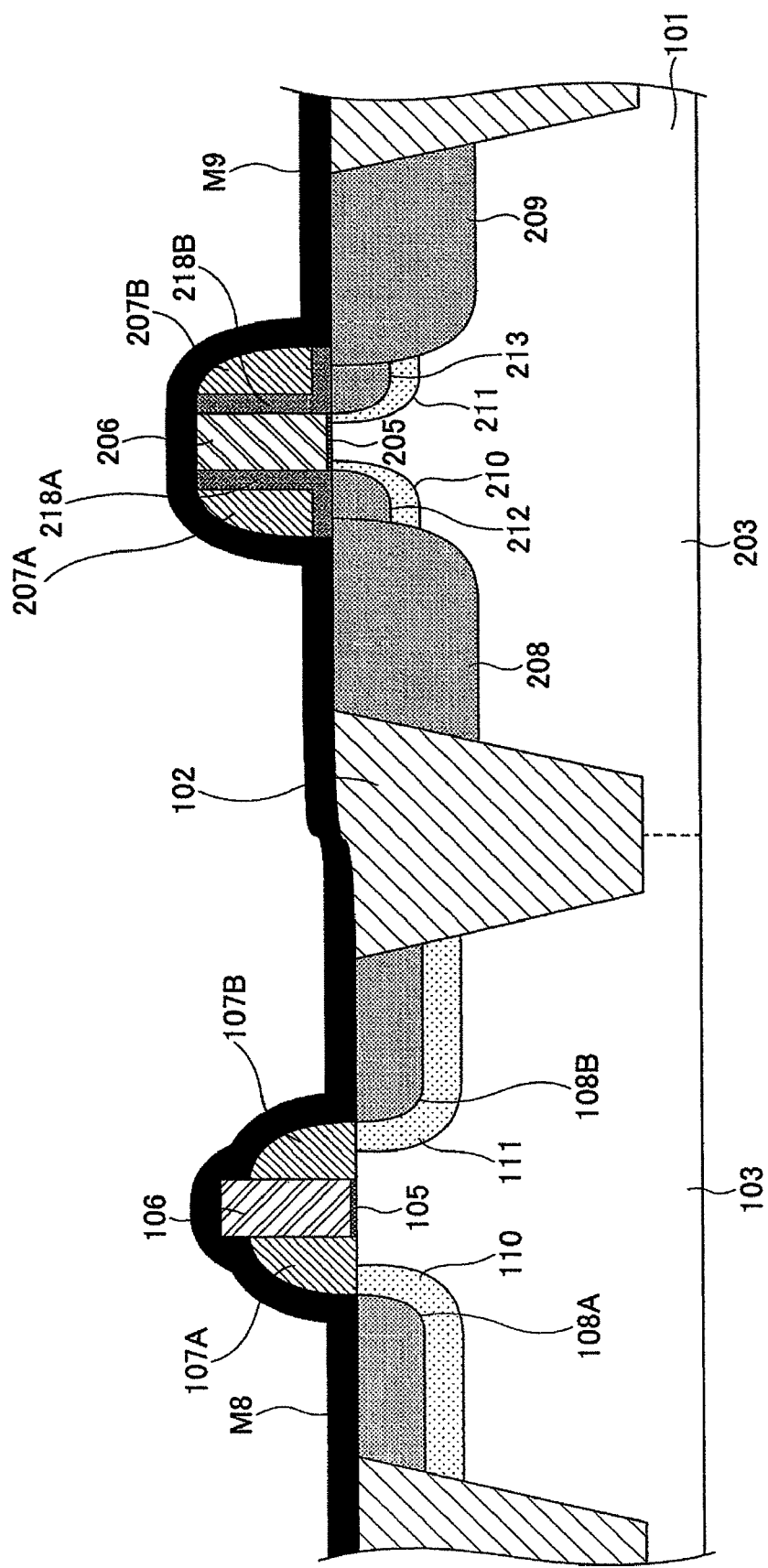

First, in the step shown in FIG. 12Y, an insulating layer M8 and an insulating layer M9 are formed on the P well 103 and the N well 203. The insulating layers M8, M9 include, for example, a silicon oxide film. The insulating layers M8, M9 are formed, for example, by using a CVD method. Since the insulating layers M8 and the insulating layer M9 are formed at the same time, the insulating layer M8 and the insulating layer M9 form a continuous united body. Furthermore, the insulating layers M8, M9 are preferred to have a thickness of, for example, 40 nm.

Figure 12Z:
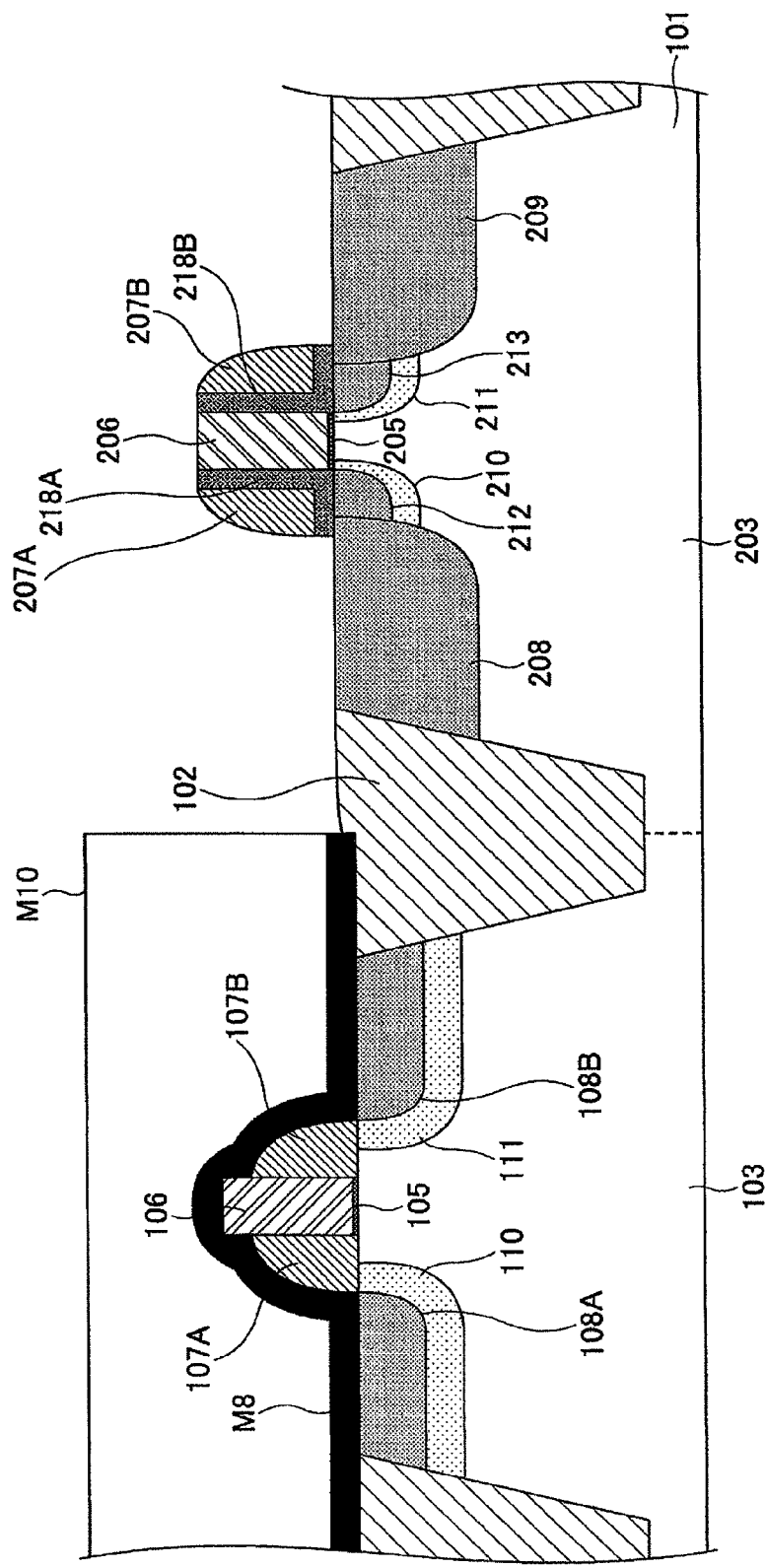

Then, in the step shown in FIG. 12Z, a resist pattern M10 for covering the P well 103 and exposing the N well 203 is formed. Then, the insulating layer M9 exposed on the N well 203 is removed, for example, by a plasma dry etching method.

Figure 13A:
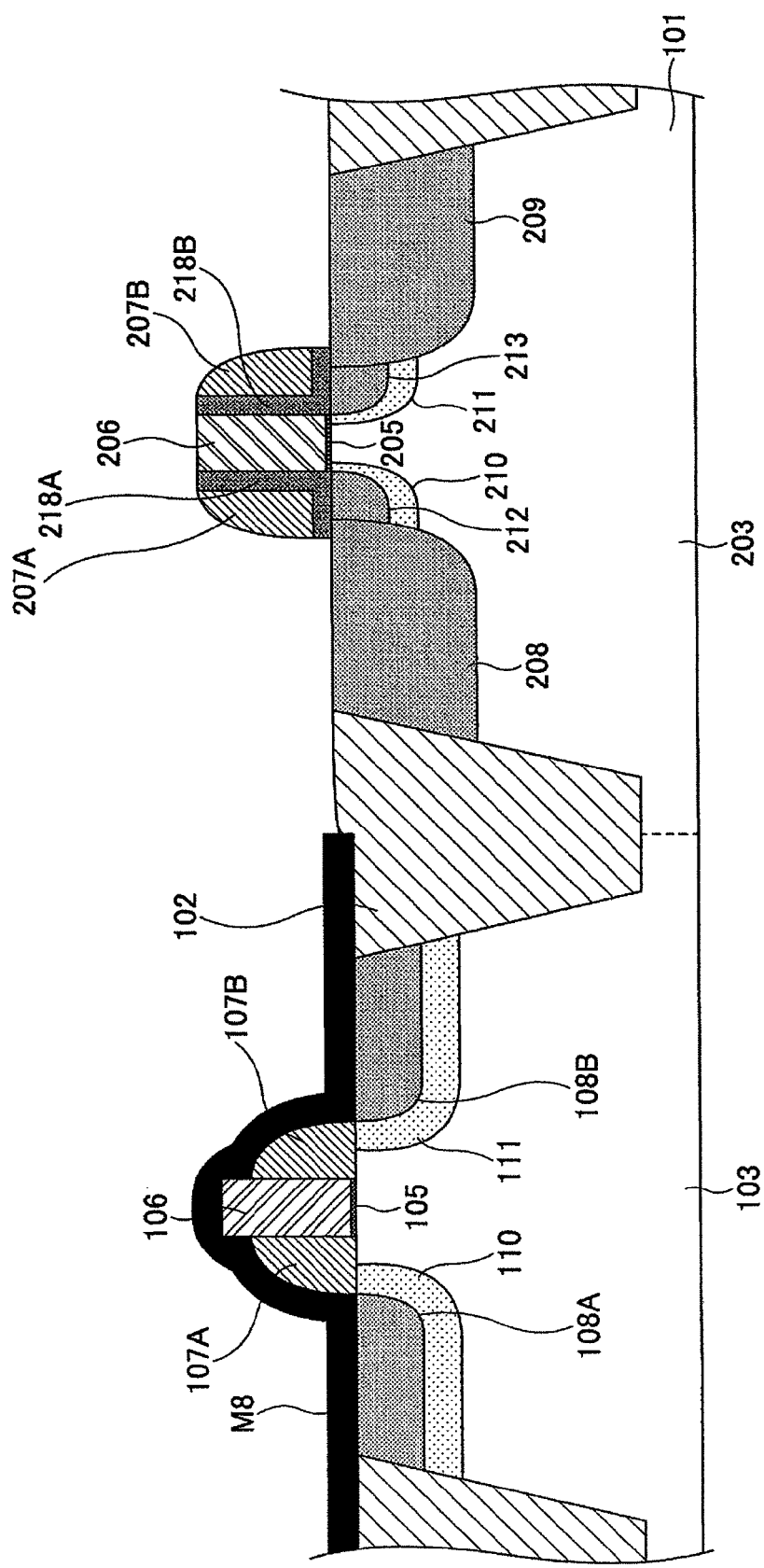

Then, in the step shown in FIG. 13A, the resist pattern M10 is removed from the silicon substrate 101.

Figure 13B:
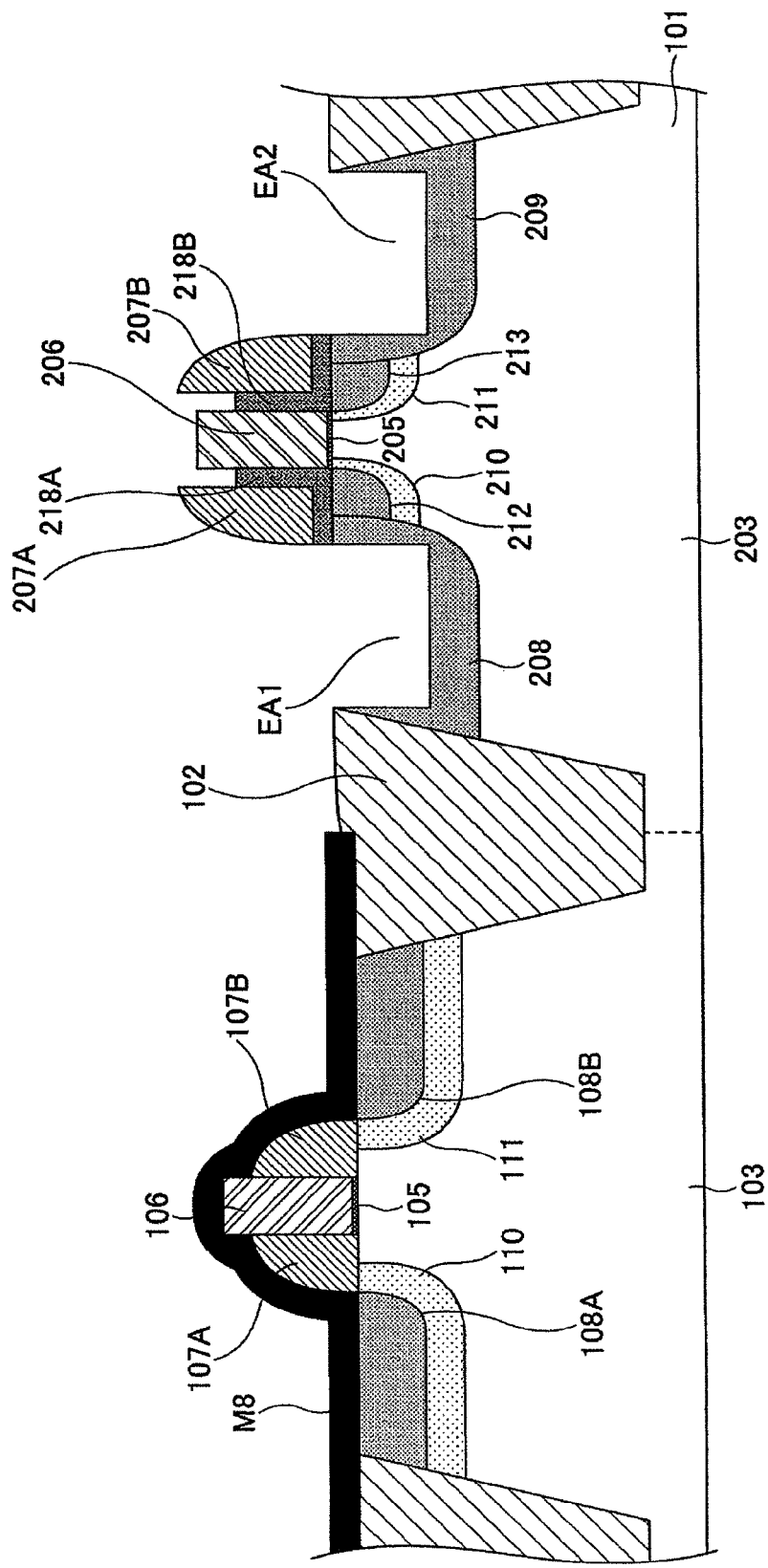

Then, in the step shown in FIG. 13B, the drain area 208 and the source area 209 exposed on the N well 203 are etched (e.g., RIE method), to thereby form a void EA1 in the drain area 208 and a void EA2 in the source area 209. It is preferred that the voids EA1 and EA2 be formed within the drain area 208 and source area 209, respectively.

Figure 13C:
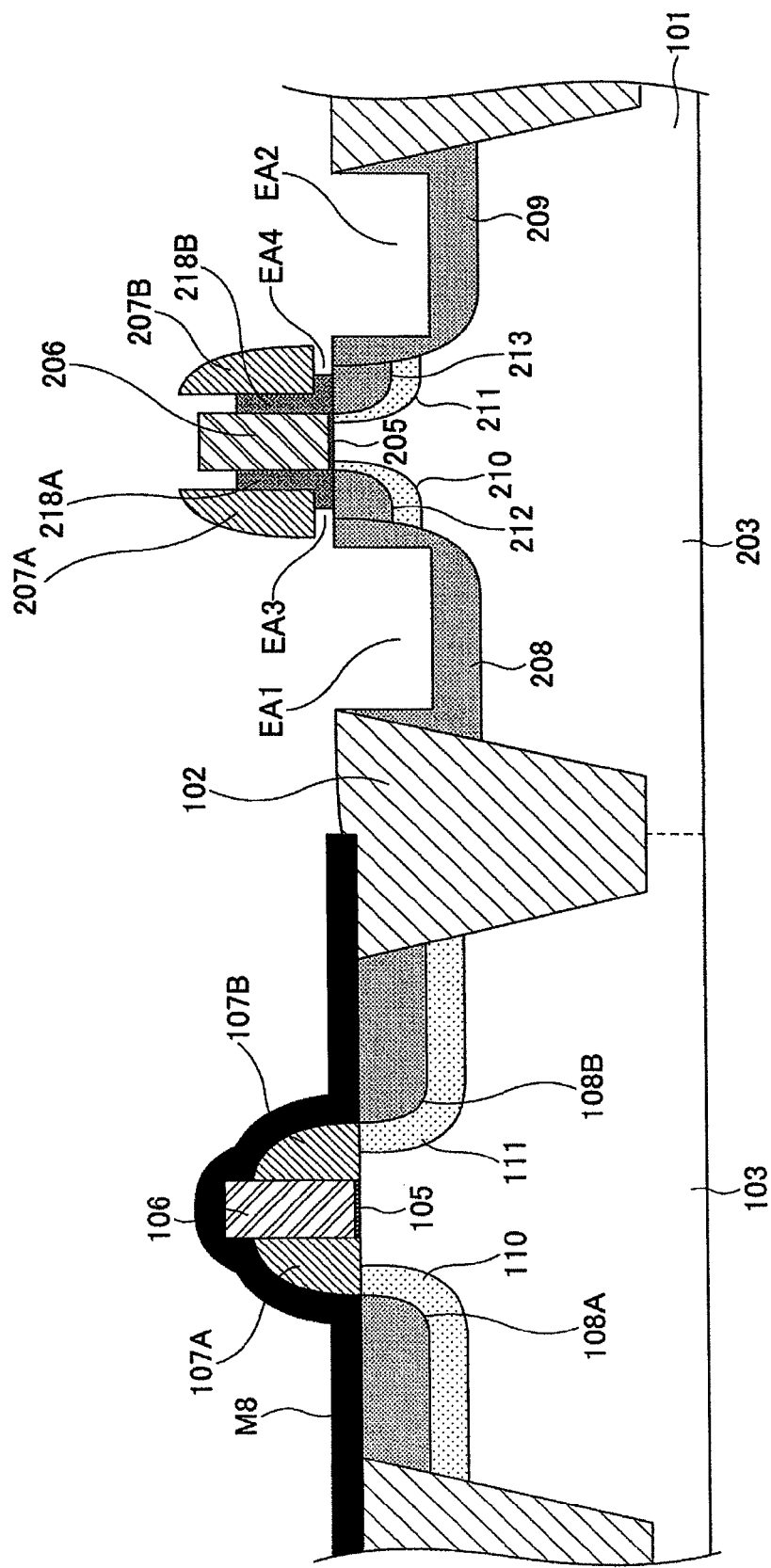

In the step shown in FIG. 13C, the buffer layer 218A situated vertically below the sidewall insulating film 207A and the buffer layer 218B situated vertically below the sidewall insulating film 207B are removed by a wet etching method using, for example, an HF type solvent. In this wet etching process, the etching amount (erosion amount) of the buffer layers 218A, 218B increases as the wet etching time becomes longer. Accordingly, the SiGe layers formed in the subsequent step become larger. As described above with FIGS. 8A and 8B, carrier mobility improves when the SiGe layers formed vertically below the sidewall insulating films 207A, 207B become larger.

Figure 13D:
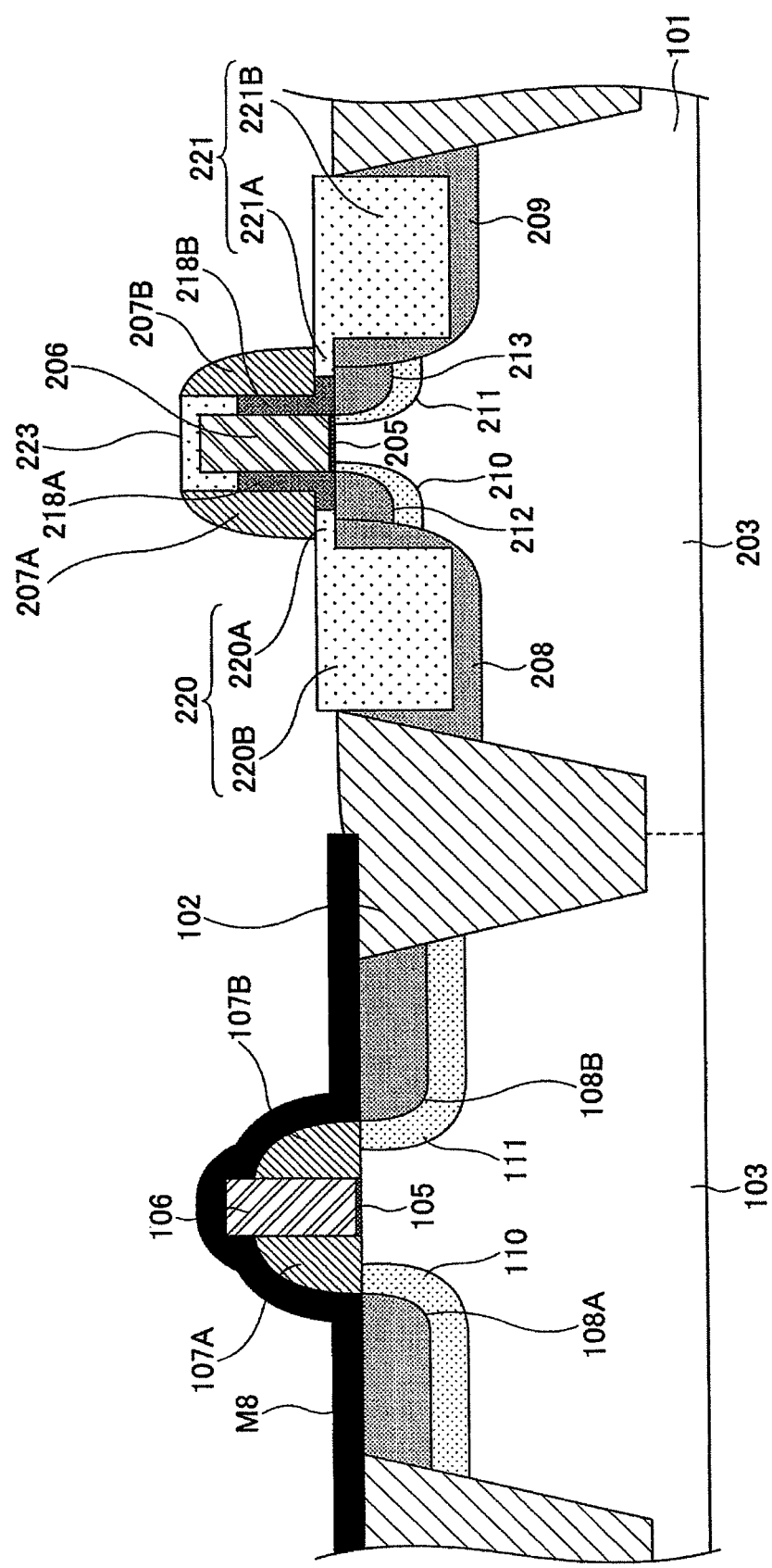

Then, in the step shown in FIG. 13D, boron (impurity having same conductivity type as the drain area 208 and the source area 209) dosed SiGe layers 220, 221 are formed by selective epitaxial growth.

The SiGe layer 220 includes an SiGe layer 220A buried in the void EA3 and an SiGe layer 220B continuing from the SiGe layer 220A and being buried in the void EA1. The SiGe layer 220B, which is buried in the void EA1, is formed in a manner that its surface is positioned higher than the surface of the N well 203 (interface between the gate insulating film 205 and the silicon substrate 101).

Likewise, the SiGe layer 221 includes an SiGe layer 221A buried in the void EA4 and an SiGe layer 221B continuing from the SiGe layer 221A and being buried in the void EA2. The SiGe layer 221B, which is buried in the void EA2, is formed in a manner that its surface is positioned higher than the surface of the N well 203 (interface between the gate insulating film 205 and the silicon substrate 101).

In other words, the SiGe layer 220 is formed in a manner extending from an area vertically below the sidewall insulating film 207A (SiGe layer 220A) to the inside of the drain area 208 (SiGe layer 220B). Likewise, the SiGe layer 221 is formed in a manner extending from an area vertically below the sidewall insulating film 207B (SiGe layer 221A) to the inside of the source area 209 (SiGe layer 221B).

Then, in the steps shown in FIGS. 13E through 13I, a sidewall insulating film is formed to serve as a mask upon forming source/drain areas in a deep area in the P well 103.

Figure 13E:
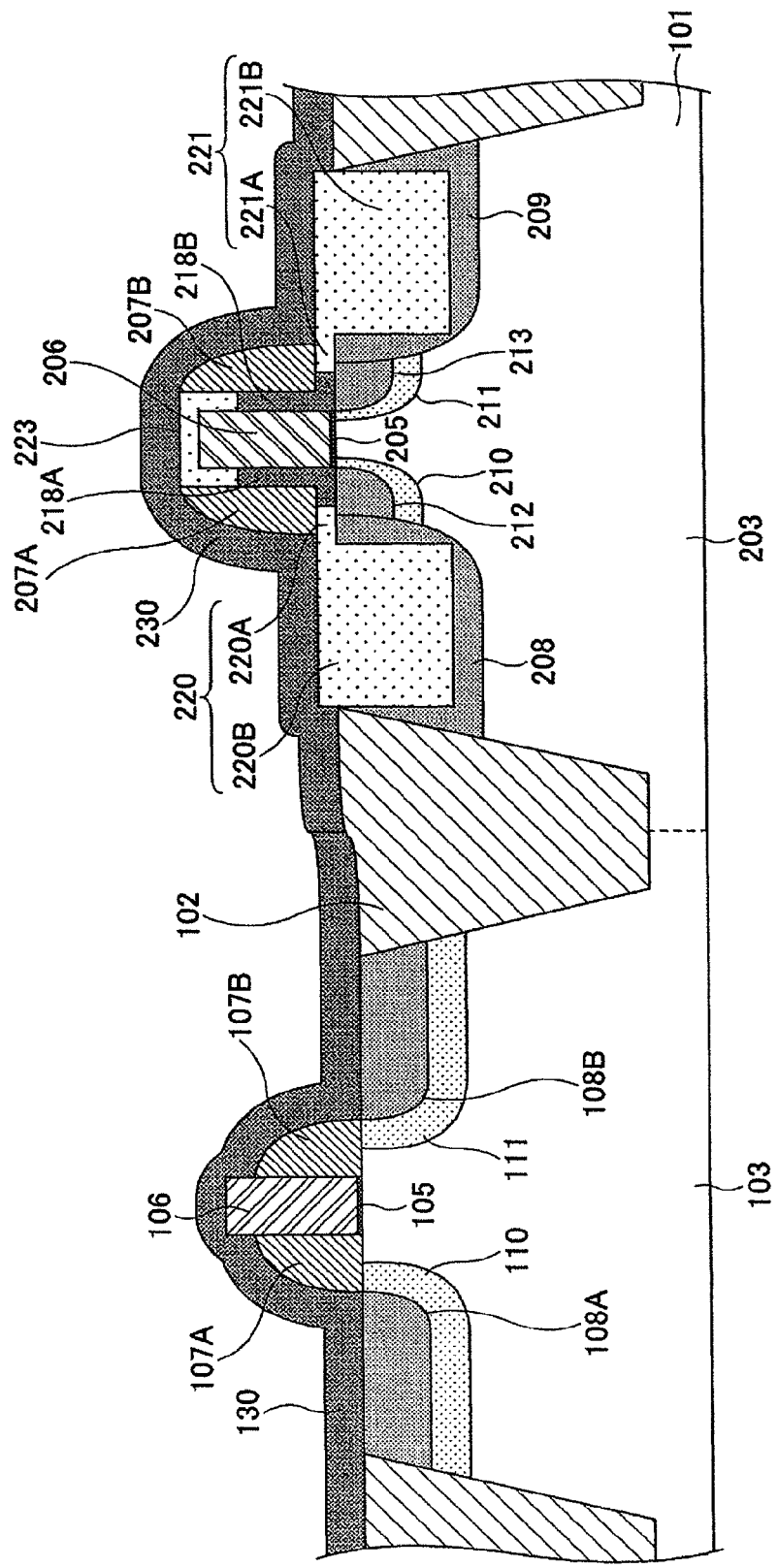

First, in the step shown in FIG. 13E, insulating layers 130, 230 including a silicon oxide film are formed on the P well 103 and the N well 203 by using, for example, a CVD method. Since the insulating layer 130 and the insulating layer 230 are formed at the same time, the insulating layer 130 and the insulating layer 230 form a continuous united body.

Figure 13F:
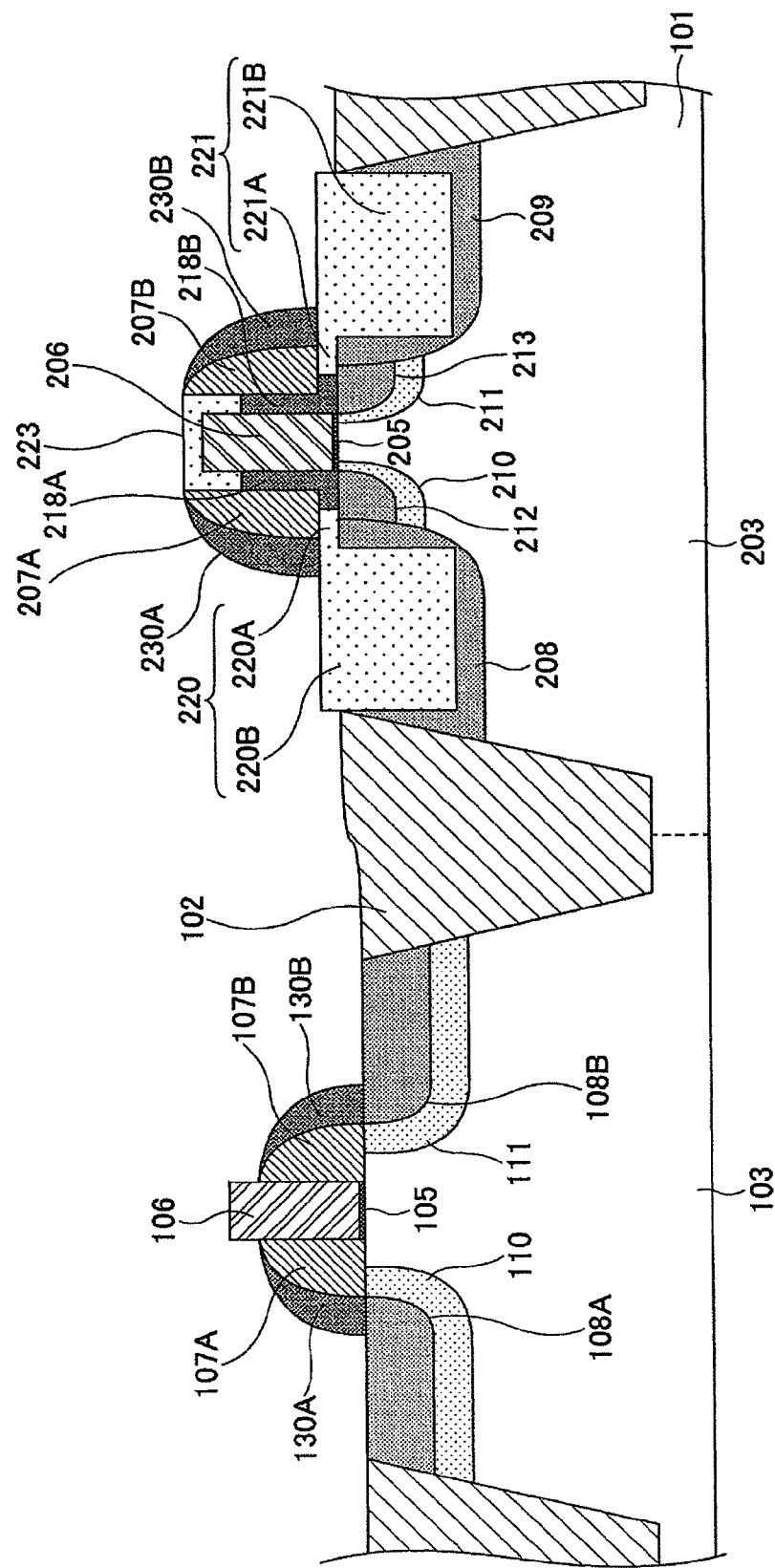

Then, in the step shown in FIG. 13F, the insulating layers 130, 230 are etched by using a plasma (dry) etching method (e.g., RIE method).

As a result, sidewall insulating films 130A, 130B are formed on the outside of the sidewall insulating films 107A, 107B, and sidewall insulating films 230A, 230B are formed on the outside of the sidewall insulating films 207A, 207B.

Then, in the step shown in FIG. 13G, a resist pattern M12 for covering the N well 203 and exposing the P well 103 is formed. Then, phosphorous ions are injected (acceleration energy: 10 keV, dosage $8 \times 10^{15}$ cm$^{-2}$) into the P well 103 by using the resist pattern M12, the gate electrode 106, and the sidewall insulating films 107A, 107B, 130A, 130B as a mask.

Thereby, a drain area 109 and a source area 108 are formed one on each side of the gate electrode 106 of the P well 103.

In other words, the source area 108 of the P well 103 is formed with a source area 108A and a source area 108B having different depths. Likewise, the drain area 109 of the P well 103 is formed with a drain area 109A and a drain area 109B having different depth. Alternatively, the source area and the drain area may be formed in a single area by a single doping process.

Figure 13H:
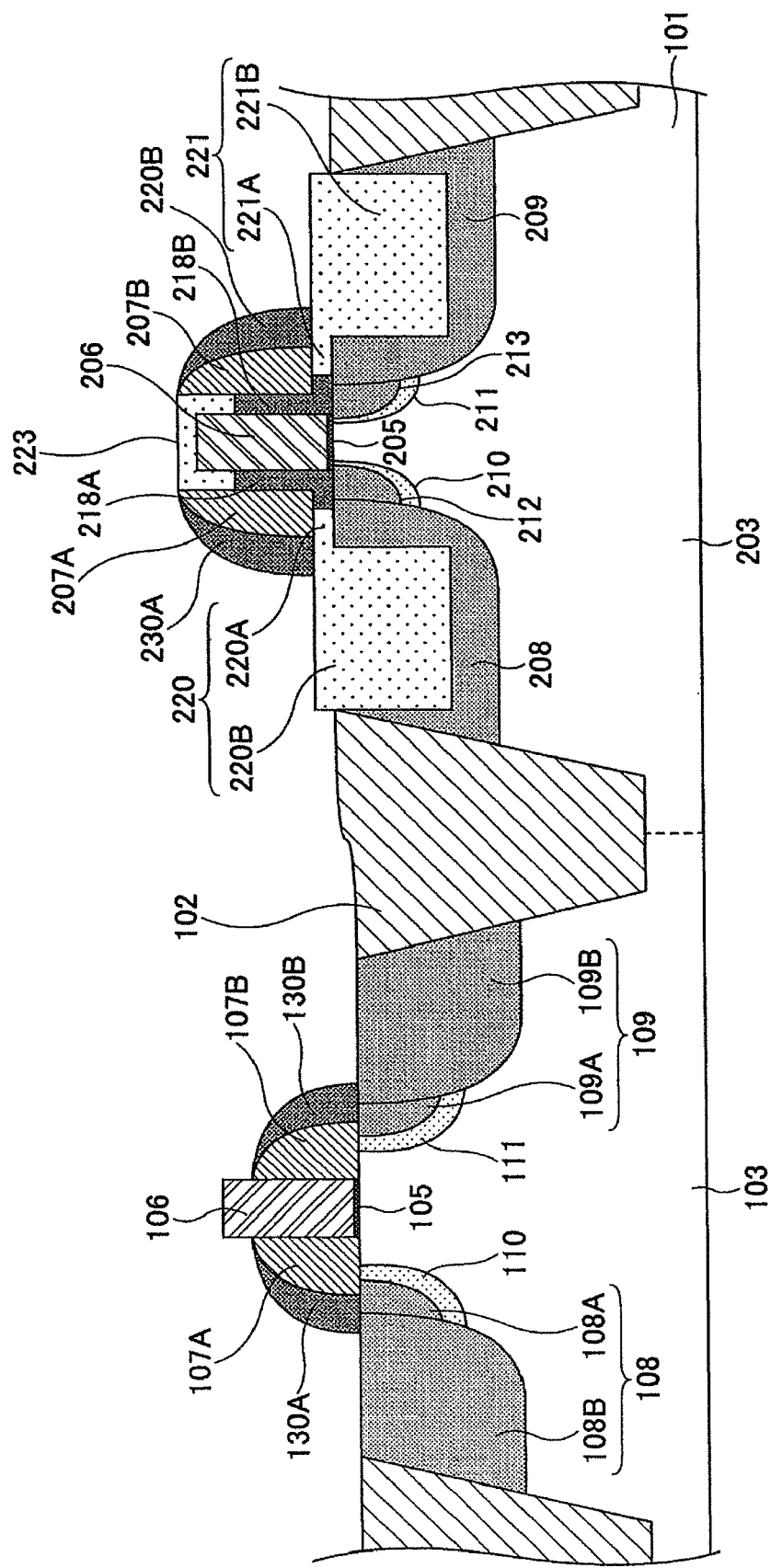

Then, in the step shown in FIG. 13H, the resist pattern M12 is removed. Then, the silicon substrate 101 is annealed (1000° C., 1 second) for activation. The annealing activation process causes thermal diffusion of the source areas 108A, 108B and the drain areas 109A, 109B. Likewise, the annealing activation process causes thermal diffusion of the drain area 208, the drain extension area 212, the source area 209, and the source extension area 213.

Then, in the step shown in FIG. 13I, a nickel (Ni) film is deposited on the P well 103 and the N well 203 by a sputtering method. Then, the silicon substrate 101 is annealed. Thereby, a silicide layer is formed in areas where silicon or the SiGe layers are exposed. More specifically, silicide layers 115, 116, 114 are correspondingly formed on the source area 108, the drain area 109, and the gate electrode 106 of the P well 103. Likewise, silicide layers 215, 216, 214 are correspondingly formed on the drain area 208, the source area 209, and the gate electrode 206 of the N well 203.

Furthermore, in the below-described steps shown in FIGS. 13J through 13O, insulating films having different stress polarities may be formed on the P well 103 and the N well 203, respectively. By forming films having different stress polarities, carrier mobility in the channel areas 104, 204 can be improved in accordance with distortion created by stress applied to the silicon in the channel areas 104, 204.

Figure 13J:
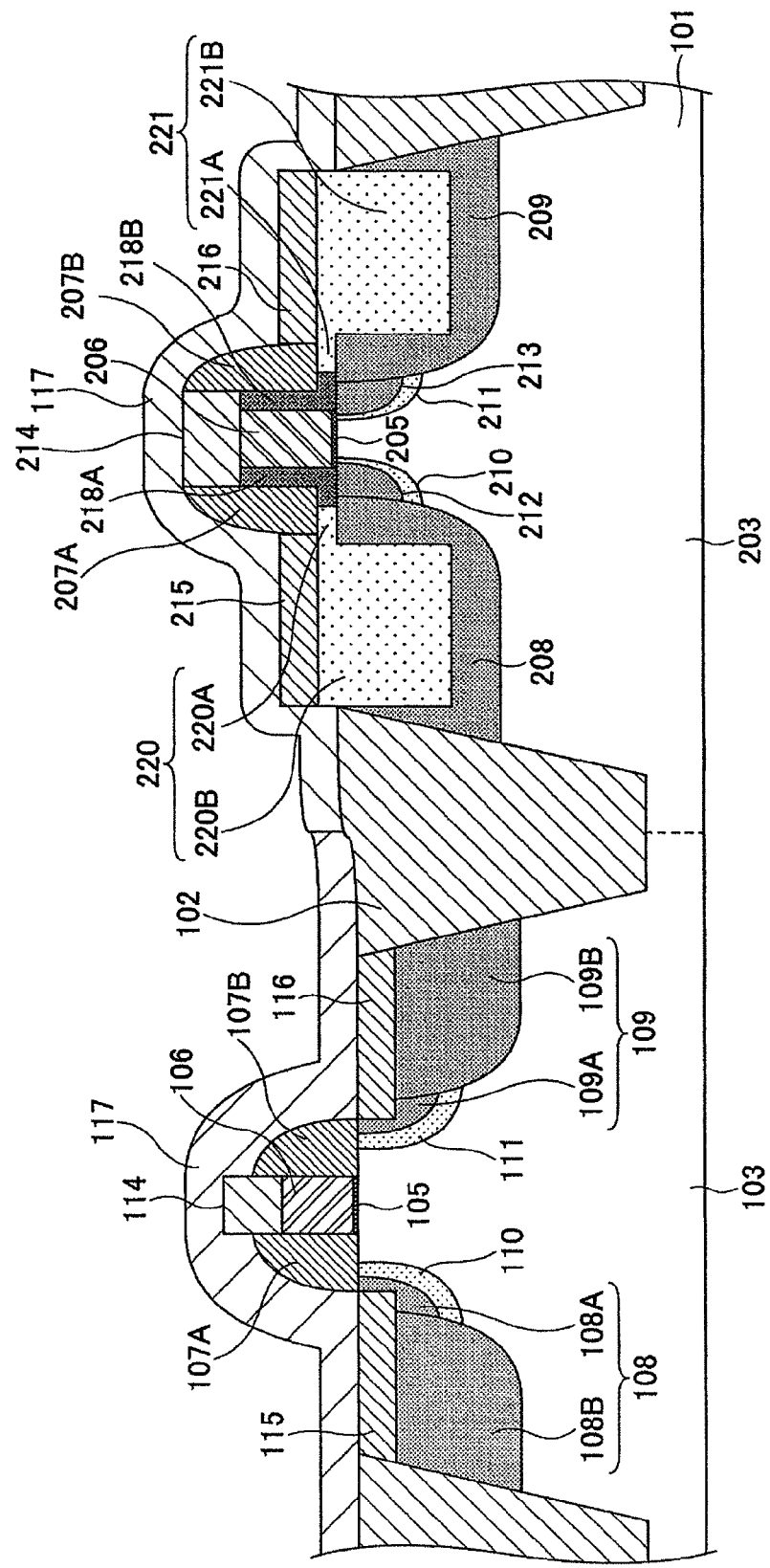

For example, in the step shown in FIG. 13J, an insulating layer 117 including a silicon nitride film having tensile stress is formed on the P well 103 and the N well 203 by using a CVD method. The insulating layer 117 may have a thickness of 60 nm.

Figure 13K:
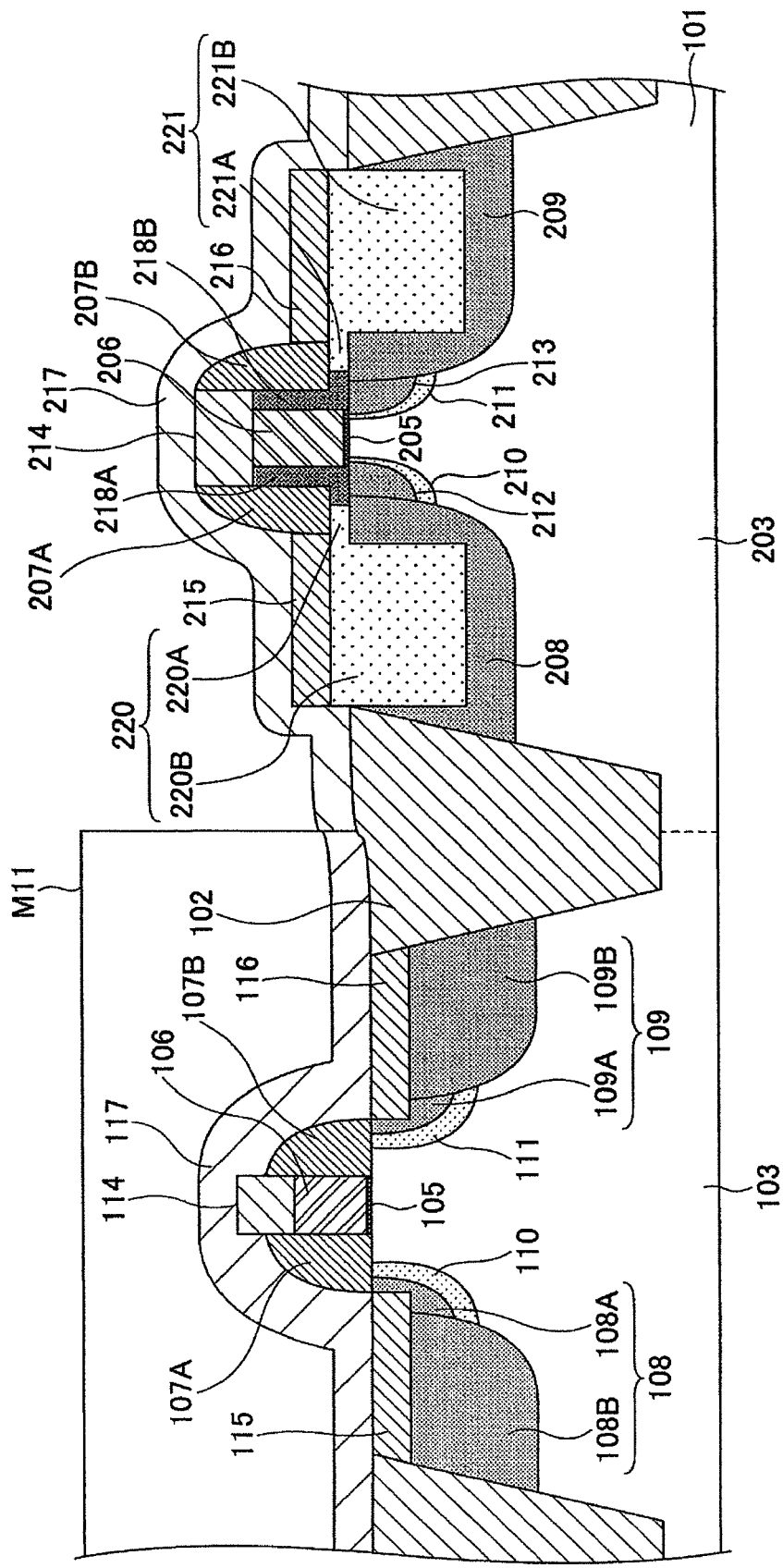

Then, in the step shown in FIG. 13K, a resist pattern M11 for covering the P well 103 and exposing the N well 203 is formed. Then, the insulating layer 117 on the N well 203 is etched (e.g., plasma dry etching) by using the resist pattern M11 as a mask. Then, after the etching process, the resist pattern M11 is peeled from the silicon substrate 101.

Figure 13L:
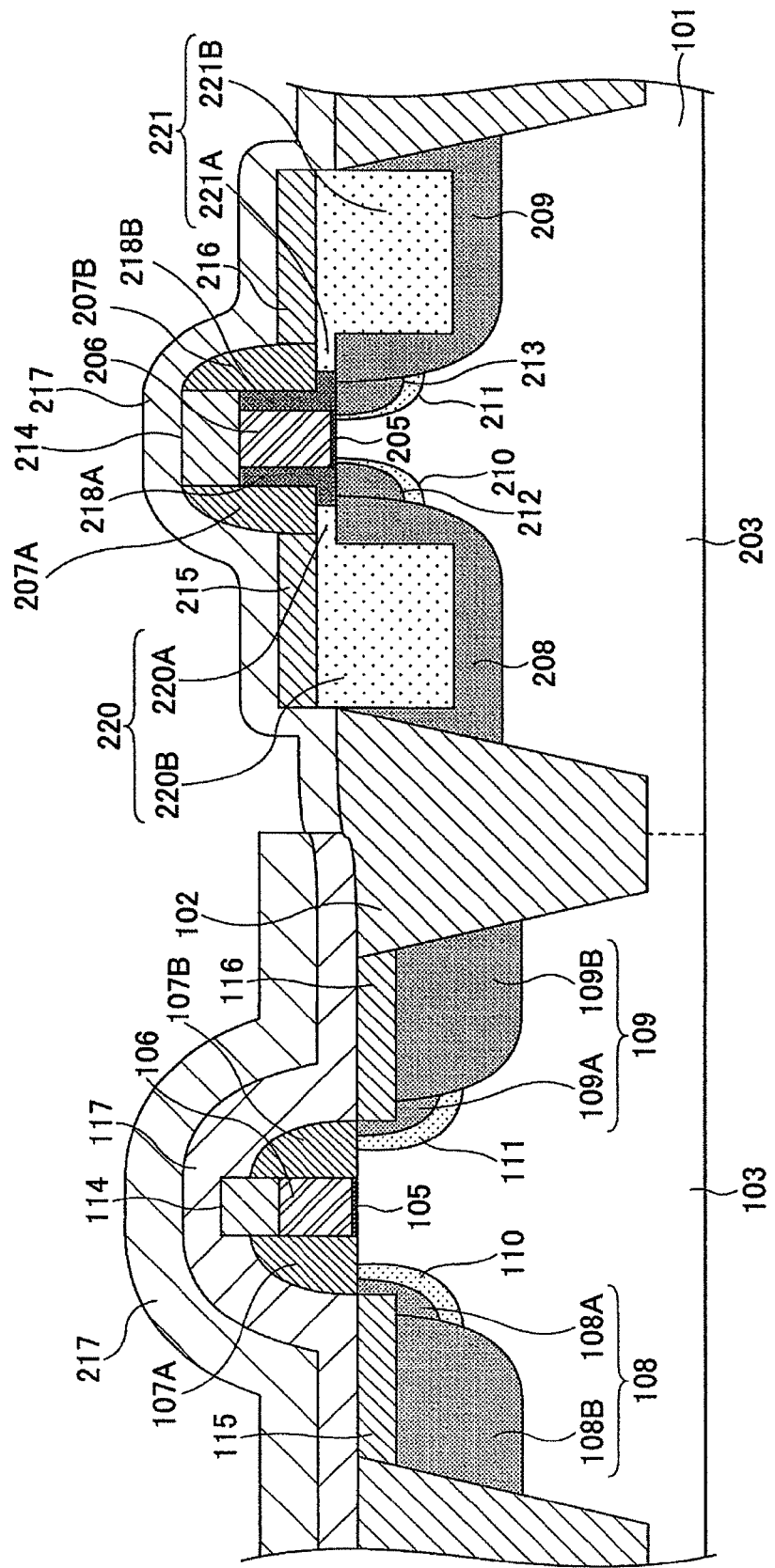
Figure 13O:
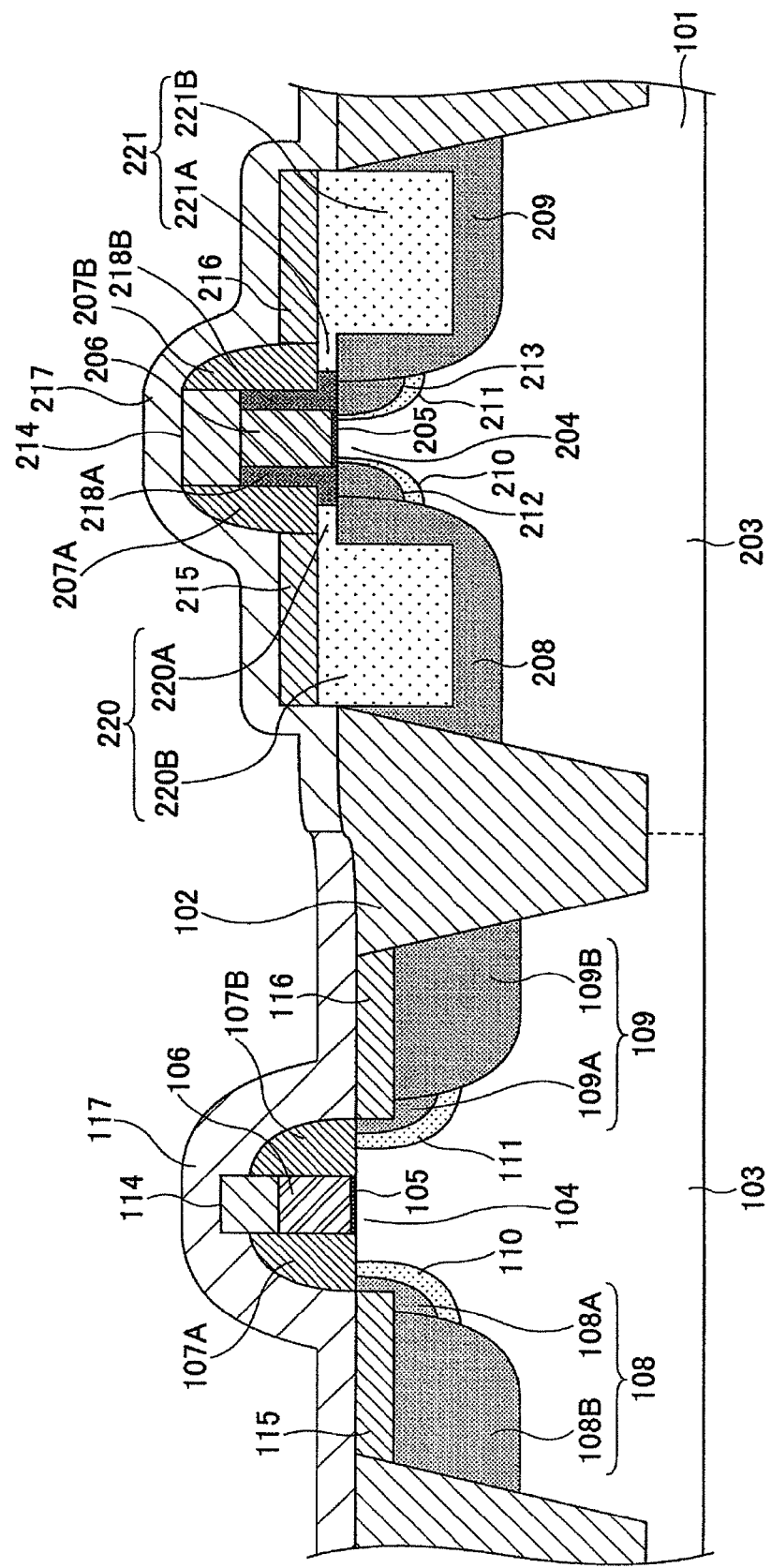

Then, in the step shown in FIG. 13L, an insulating layer 217 including a silicon nitride film having compression stress is formed on the P well 103 and the N well 203. The insulating layer 217 may have a thickness of 60 nm. In other words, a laminated structure including the insulating layer 117 and the insulating layer 217 is formed on the P well 103.

Then, in the step shown in FIG. 13M, a resist pattern M12 for covering the N well 203 and exposing the P well 103 is formed.

Then, in the step shown in FIG. 13N, the insulating layer 217 on the P well 103 is etched (e.g., plasma dry etching) by using the resist pattern M12 as a mask. Then, in the step shown in FIG. 13O, the resist pattern M12 is peeled from the silicon substrate 101 after the etching process.

By conducting the above-described steps, the semiconductor device 100B shown in FIG. 7 can be manufactured. It is to be noted that, after conducting the above-described steps, a wiring configuration may be applied to the semiconductor device 100B by using known methods such as contact etching, contact fabrication, multilayer wiring fabrication (e.g., damascene method).

In a case of manufacturing the semiconductor device shown in FIG. 6, the steps shown in FIG. 13E and after may be conducted after the step shown in FIG. 12X.

The semiconductor device manufacturing method according to the above-described embodiment of the present invention enables easy fabrication of a semiconductor device in which the distance between the sidewall insulating film (in which fixed charges are formed) and the silicon substrate (thickness of the buffer layer between sidewall insulating film and silicon substrate) of the PMOS side of the silicon substrate is different from the that of the NMOS side of the silicon substrate.

In other words, the distance between the sidewall insulating film (in which positive fixed charges are formed) and the silicon substrate can be reduced on the NMOS side (either by forming no buffer layer or reducing the thickness of the buffer layer) and inversion layers formed by fixed charges can be used as areas corresponding to source/drain extension areas. Accordingly, the above-described NMOS transistor according to an embodiment of the present invention can maintain a low channel impurity concentration and satisfactory carrier mobility while preventing a short channel effect.

Meanwhile, on the PMOS side, the distance between the sidewall insulating film (in which positive fixed charges are formed) and the silicon substrate can be formed greater than that of the NMOS side (by increasing the thickness of the buffer layer), to thereby reduce the influence of positive fixed charges on the silicon substrate.

In other words, with the above-described semiconductor device manufacturing method according to an embodiment of the present invention, a low channel impurity concentration can be maintained and satisfactory carrier mobility can be attained while preventing a short channel effect for a MOS transistor. By using such a MOS transistor, a CMOS transistor can be easily fabricated.

Further, the present invention is not limited to these embodiments, but variations and modifications may be made without departing from the scope of the present invention.

The present application is based on Japanese Priority Application No. 2006-336269 filed on Dec. 13, 2006, with the Japanese Patent Office, the entire contents of which are hereby incorporated by reference.

What is claimed is:

1. A semiconductor device comprising:
   an NMOS transistor including
      a first channel area formed in a silicon substrate,
      a first gate electrode formed on a first gate insulating film in correspondence with the first channel area, the first gate electrode having a pair of first sidewall insulating films, and
      a first source area and a first drain area formed in the silicon substrate having the first channel area situated therebetween, the first source area being formed on one side of the first gate electrode, the first drain area being formed in the silicon substrate on the other side of the first gate electrode; and
   a PMOS transistor including
      a second channel area formed in the silicon substrate,
      a second gate electrode formed on a second gate insulating film in correspondence with the second channel area, the second gate electrode having a pair of second sidewall insulating films,
      a second source area and a second drain area formed in the silicon substrate having the second channel area situated therebetween, the second source area being formed on one side of the second gate electrode, the second drain area being formed in the silicon substrate on the other side of the second gate electrode;
wherein the distance between the second sidewall insulating films and the silicon substrate is greater than the distance between the first sidewall insulating films and the silicon substrate;
wherein the pair of first sidewall insulating films and the pair of second sidewall insulating films include positive fixed charges;
wherein the pair of first sidewall insulating films including the positive fixed charges are positioned above the first source area and the first drain area, and the pair of second sidewall insulating films including the positive fixed charges are positioned above the second source area and the second drain area.

2. The semiconductor device as claimed in claim 1, further comprising:
a source extension area continuing from the second source area formed below one of the pair of second sidewall insulating films; and
a drain extension area continuing from the second drain area formed below the other of the pair of second sidewall insulating films.

3. The semiconductor device as claimed in claim 1, further comprising:
channel vicinity areas continuing from the first channel area formed below each one of the pair of first sidewall insulating films, wherein the channel vicinity area has the same conductivity type as the first channel area.

4. The semiconductor device as claimed in claim 3, wherein the channel vicinity area includes an inversion layer.

5. The semiconductor device as claimed in claim 1, further comprising: a buffer layer formed between the pair of second sidewall insulating films and the silicon substrate.

6. The semiconductor device as claimed in claim 5, wherein the buffer layer includes a silicon oxide film.

7. The semiconductor device as claimed in claim 5, wherein the buffer layer has a thickness ranging from 5 to 20 nm.

8. The semiconductor device as claimed in claim 5, further comprising:
an other buffer layer formed between the pair of first sidewall insulating films and the silicon substrate, wherein the other buffer layer includes a silicon oxide film, wherein the other buffer layer has a thickness no greater than 3 nm.

9. The semiconductor device as claimed in claim 5, wherein the buffer layer includes a SiGe layer.

10. The semiconductor device as claimed in claim 9, wherein the SiGe layer is formed below the pair of second sidewall insulating films and extending throughout the second source area and the second drain area.

11. The semiconductor device as claimed in claim 10, wherein the SiGe layer is doped with an impurity having the same conductivity type as the second source area and the second drain area.

12. The semiconductor device as claimed in claim 1, further comprising:
first pocket areas formed in the vicinity of the first source area and the vicinity of the first drain area; and
second pocket areas formed in the vicinity of the second source area and the vicinity of the second drain area;
wherein the distance between the first pocket areas is greater than the distance between the second pocket areas.

13. The semiconductor device as claimed in claim 1, wherein the first and second sidewall insulating films include silicon and nitrogen.

14. The semiconductor device as claimed in claim 1, wherein the first and second sidewall insulating films are each covered by insulating films having different stress polarities.

15. The semiconductor device as claimed in claim 1, wherein the surfaces of the first source area and the first drain area are made concave with respect to an interface between the first gate insulating film and the silicon substrate.

16. The semiconductor device as claimed in claim 1, wherein the second source area and the second drain area include charges having greater density than charges included in the first source area and the first drain area.

* * * * *